(12) United States Patent
Beeson et al.

(10) Patent No.: US 7,497,581 B2
(45) Date of Patent: Mar. 3, 2009

(54) LIGHT RECYCLING ILLUMINATION SYSTEMS WITH WAVELENGTH CONVERSION

(75) Inventors: Karl W. Beeson, Princeton, NJ (US); Scott M. Zimmerman, Baskin Ridge, NJ (US)

(73) Assignee: Goldeneye, Inc., San Diego, CA (US)

( * ) Notice: Subject to any disclaimer, the term of this patent is extended or adjusted under 35 U.S.C. 154(b) by 243 days.

(21) Appl. No.: 11/430,227

(22) Filed: May 8, 2006

(65) Prior Publication Data

US 2006/0203468 A1    Sep. 14, 2006

Related U.S. Application Data

(63) Continuation-in-part of application No. 10/814,044, filed on Mar. 30, 2004, now Pat. No. 7,040,774.

(51) Int. Cl.
*F21V 9/06* (2006.01)

(52) U.S. Cl. .................... 362/84; 362/257; 362/310

(58) Field of Classification Search .............. 362/3, 362/11, 14, 19, 34, 8, 230, 231, 236, 240, 362/242–245, 247, 257, 304, 296–301, 307, 362/308, 310, 328, 329, 342, 516, 544, 545, 362/555, 800
See application file for complete search history.

(56) References Cited

U.S. PATENT DOCUMENTS

| 5,036,436 | A | 7/1991 | Rattigan et al. |
| 5,410,454 | A | 4/1995 | Murase et al. |
| 6,144,536 | A | 11/2000 | Zimmerman et al. |
| 6,185,357 | B1 | 2/2001 | Zou et al. |
| 6,186,649 | B1 | 2/2001 | Zou et al. |
| 6,417,019 | B1 | 7/2002 | Mueller et al. |
| 6,466,135 | B1 * | 10/2002 | Srivastava et al. ........ 340/815.4 |
| 6,550,942 | B1 | 4/2003 | Zou et al. |
| 6,576,930 | B2 | 6/2003 | Reeh et al. |
| 7,040,774 | B2 * | 5/2006 | Beeson et al. ............... 362/84 |

* cited by examiner

*Primary Examiner*—Bao Q Truong
(74) *Attorney, Agent, or Firm*—William Propp, Esq.

(57) ABSTRACT

An illumination system has a light source and a wavelength conversion layer within a light-recycling envelope. The wavelength conversion layer is a solid phosphor layer. The light source is a light-emitting diode or a semiconductor laser. The light source will emit light of a first wavelength range that is transmitted through the wavelength conversion layer in order to convert a portion of the light of a first wavelength range into light of a second wavelength range. Light of both the first and second wavelength ranges will exit the light-recycling envelope through an aperture. The recycling of the light by the light-recycling envelope will enhance the output radiance and luminance of the light exiting the illumination system.

29 Claims, 33 Drawing Sheets

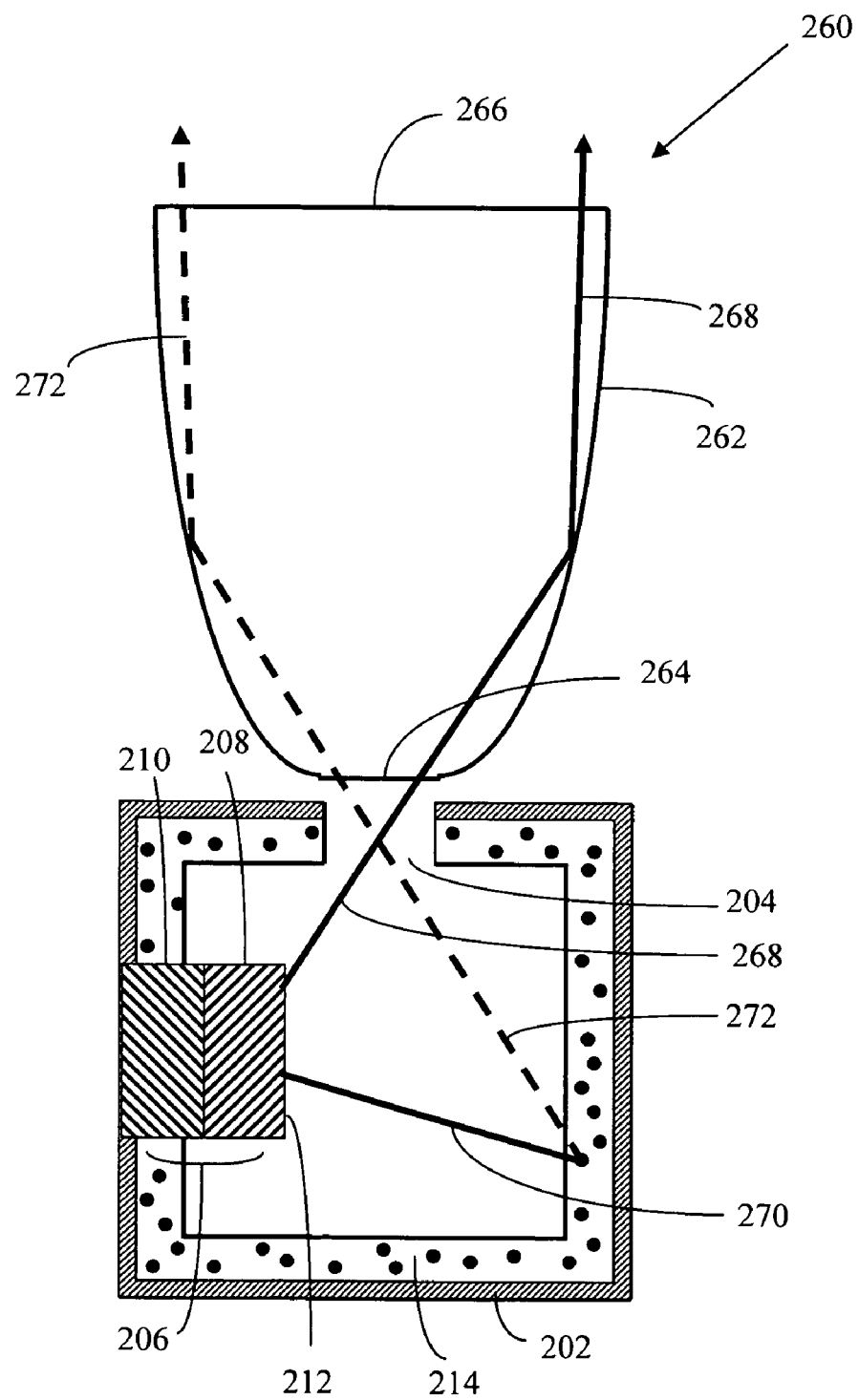

LIGHT RECYCLING ILLUMINATION SYSTEMS WITH WAVELENGTH CONVERSION

CROSS REFERENCE TO RELATED APPLICATIONS

This application is a continuation-in-part of U.S. patent application Ser. No. 10/814,044 now U.S. Pat. No. 7,040,774, entitled "ILLUMINATION SYSTEMS UTILIZING MULTIPLE WAVELENGTH LIGHT RECYCLING," filed Mar. 30, 2004 and which is herein incorporated by reference. This application is related to U.S. Pat. No. 6,869,206 entitled "ILLUMINATION SYSTEMS UTILIZING HIGHLY REFLECTIVE LIGHT EMITTING DIODES AND LIGHT RECYCLING TO ENHANCE BRIGHTNESS," and to U.S. Pat. No. 6,960,872 entitled "ILLUMINATION SYSTEMS UTILIZING LIGHT EMITTING DIODES AND LIGHT RECYCLING TO ENHANCE OUTPUT RADIANCE," both of which are herein incorporated by reference.

TECHNICAL FIELD

This invention relates to illumination systems incorporating light sources and wavelength conversion layers. The light sources are either light-emitting diodes (LEDs) or semiconductor lasers. Light-emitting diodes include inorganic light-emitting diodes and organic light-emitting diodes (OLEDs). Semiconductor lasers include edge-emitting diode lasers and vertical cavity surface emitting-lasers (VCSELs). The wavelength conversion layer is a phosphor layer, preferably a solid phosphor layer.

BACKGROUND OF THE INVENTION

Illumination systems are used as either stand-alone light sources or as internal light sources for more complex optical systems. Examples of optical systems that utilize or incorporate illumination systems include projection displays, flat-panel displays, avionics displays, automotive lighting, residential lighting, commercial lighting and industrial lighting applications.

Many applications require illumination systems with high brightness and a small effective emitting area. An example of a conventional light source with high brightness and a small effective emitting area is an arc lamp source, such as a xenon arc lamp or a mercury arc lamp. Arc lamp sources may have emitting areas as small as a few square millimeters. An example of a complex optical system that can utilize an illumination system with high brightness and a small effective source area is a projection television display. Current projection television displays typically project the combined images of three small red, green and blue cathode-ray-tube (CRT) devices onto a viewing screen using projection lenses. More recent designs sometimes use a small-area arc lamp source to project images from a liquid crystal display (LCD), a liquid-crystal-on-silicon (LCOS) device or a digital light processor (DLP) device onto a viewing screen. Light sources such as LEDs are currently not used for projection television displays because LED sources do not have sufficient output brightness.

The technical term brightness can be defined either in radiometric units or photometric units. In the radiometric system of units, the unit of light flux or radiant flux is expressed in watts and the unit for brightness is called radiance, which is defined as watts per square meter per steradian (where steradian is the unit of solid angle). The human eye, however, is more sensitive to some wavelengths of light (for example, green light) than it is to other wavelengths (for example, blue or red light). The photometric system is designed to take the human eye response into account and therefore brightness in the photometric system is brightness as observed by the human eye. In the photometric system, the unit of light flux as perceived by the human eye is called luminous flux and is expressed in units of lumens. The unit for brightness is called luminance, which is defined as lumens per square meter per steradian. The human eye is only sensitive to light in the wavelength range from approximately 400 nanometers to approximately 700 nanometers. Light having wavelengths less than about 400 nanometers or greater than about 700 nanometers has zero luminance, irrespective of the radiance values. In this application, illumination systems will be considered that incorporate a light source that emits light of a first wavelength range and a wavelength conversion layer that converts a portion of the light of the first wavelength range into light of a second wavelength range, different from the first wavelength range. When two wavelength ranges are present, sometimes it is appropriate to consider brightness in terms of radiance and sometimes it is appropriate to consider brightness in terms of luminance. In this application, either radiance or luminance or both will be used depending on the circumstances.

In a conventional optical system that transports light from an input source at one location to an output image at a second location, one cannot produce an optical output image whose radiance is higher than the radiance of the light source. A conventional optical system 10 of the prior art is illustrated in cross-section in FIG. 1A. In FIG. 1A, light rays 18 from an input light source 12 are focused by a convex lens 14 to an output image 16. The conventional optical system 10 in FIG. 1A can also be illustrated in a different manner as optical system 20 shown in cross-section in FIG. 1B. For simplicity, the input source 22, the lens 24 and the output image 26 are all assumed to be round. In FIG. 1B, the input source 22 has area, Area$_{in}$. The light rays from input source 22 fill a truncated cone having edges 21 and 23. The cone, which is shown in cross-section in FIG. 1B, extends over solid angle 27. The magnitude of solid angle 27 is $\Omega_{in}$. Lens 24 focuses the light rays to image 26 having area, Area$_{out}$. The light rays forming the image 26 fill a truncated cone having edges 25 and 29. The cone, which is shown in cross-section, extends over solid angle 28. The magnitude of solid angle 28 is $\Omega_{out}$.

If the optical system 20 has no losses, the light input flux at the input source 22, $$\Phi_{in} = (\text{Radiance}_{in})(\text{Area}_{in})(\Omega_{in}) \qquad \text{[Equation 1]}$$

equals the light output flux at the output image 26, $$\Phi_{out} = (\text{Radiance}_{out})(\text{Area}_{out})(\Omega_{out}) \qquad \text{[Equation 2]}$$

In these equations, "Radiance$_{in}$" is the radiance at the input source 22, "Radiance$_{out}$" is the radiance at the output image 26, "Area$_{in}$" is the area of the input source 22 and "Area$_{out}$" is the area of the output image 26. The quantities $\Omega_{in}$ and $\Omega_{out}$ are, respectively, the projected solid angles subtended by the input source and output image light cones. In such a lossless system, it can be shown that $$\text{Radiance}_{in} = \text{Radiance}_{out} \qquad \text{[Equation 3]}$$

and $$(\text{Area}_{in})(\Omega_{in}) = (\text{Area}_{out})(\Omega_{out}) \qquad \text{[Equation 4]}$$

If the index of refraction of the optical transmission medium is different at the input source and output image positions, the equality in Equation 4 is modified to become $$(n_{in}^2)(Area_{in})(\Omega_{in})=(n_{out}^2)(Area_{out})(\Omega_{out}),$$  [Equation 5]

where $n_{in}$ is the index of refraction at the input position and $n_{out}$ is the index of refraction at the output position. The quantity $(n^2)(Area)(\Omega)$ is variously called the "etendue" or "optical extent" or "throughput" of the optical system. In a conventional lossless optical system, the quantity $(n^2)(Area)(\Omega)$ is conserved.

In U.S. Pat. No. 6,144,536, herein incorporated by reference, Zimmerman et al demonstrated that for the special case of a source that has a reflecting emitting surface, an optical system can be designed that recycles a portion of the light emitted by the source back to the source and transmits the remainder of the light to an output position. Under certain conditions utilizing such light recycling, the effective brightness of the source as well as the output brightness of the optical system can be higher than the intrinsic brightness of the source in the absence of recycling, a result that is not predicted by the standard etendue equations. In U.S. Pat. No. 6,144,536, the brightness term "luminance" is used for brightness instead of "radiance" but the concept is equivalent for both optical terms as long as the optical wavelength is between 400 and 700 nanometers and as long as wavelength conversion is not taking place between the input source and the output image of the optical system.

An example of a light source with a reflecting emitting surface is a conventional fluorescent lamp. A cross-section of a conventional fluorescent lamp 30 is shown in FIG. 2A. The fluorescent lamp 30 has a glass envelope 32 enclosing a hollow interior 36. The hollow interior 36 is filled with a gas that can emit ultraviolet light when a high voltage is applied. The ultraviolet light excites a phosphor coating 34 on the inside surface of the glass envelope, causing the phosphor to emit visible light through the phosphor coating 34. The phosphor coating 34 is a partially reflecting surface in addition to being a light emitter. Therefore, it is possible to design an optical system that recycles a portion of the visible light generated by the phosphor coating 34 back to the coating 34 and thereby cause an increase in the effective brightness of the conventional fluorescent lamp. The disclosures on light recycling in U.S. Pat. No. 6,144,536 relate to linear light sources that have long emitting apertures with aperture areas greater than 100 square millimeters (mm²). Such configurations are not suitable for many applications such as illumination systems for large projection displays.

Recently, highly reflective green, blue and ultraviolet LEDs and diode lasers based on gallium nitride (GaN), indium gallium nitride (InGaN) and aluminum gallium nitride (AlGaN) semiconductor materials have been developed. Some of these LED devices have high light output, high radiance and have a light-reflecting surface that can reflect at least 50% of the light incident upon the device. The reflective surface of the LED can be a specular reflector or a diffuse reflector. Typically, the reflective surface of the LED is a specular reflector. Radiance outputs close to 7000 watts per square meter per steradian and total outputs of approximately 0.18 watt from a single packaged device are possible. Light outputs per unit area can exceed 0.045 watt/mm². As such, several new applications relating to illumination systems have become possible. Advantages such as spectral purity, reduced heat, and fast switching speed all provide motivation to use LEDs and semiconductor lasers to replace fluorescent, incandescent and arc lamp sources.

FIG. 2B illustrates a cross-sectional view of a recently developed type of LED 40 that has an emitting layer 46 located below both a transparent top electrode 43 and a second transparent layer 44. Emitting layer 46 emits light rays 45 when an electric current is passed through the device 40. Below the emitting layer 46 is a reflecting layer 47 that also serves as a portion of the bottom electrode. Electrical contacts 41 and 42 provide a pathway for electrical current to flow through the device 40. It is a recent new concept to have both electrical contacts 41 and 42 on the backside of the LED opposite the emitting surface. Typical prior LED designs placed one electrode on top of the device, which interfered with the light output from the top surface and resulted in devices with low reflectivity. The reflecting layer 47 allows the LED to be both a light emitter and a light reflector. Lumileds Lighting LLC, for example, produces highly reflective green, blue and ultraviolet LED devices of this type. It is expected that highly reflective red and infrared LEDs with high outputs and high radiance will also eventually be developed. However, even the new green, blue and ultraviolet gallium nitride, indium gallium nitride and aluminum gallium nitride LEDs do not have sufficient radiance for many applications.

LEDs that emit green, blue or ultraviolet light have been combined with luminescent materials to convert the green, blue or ultraviolet light into light of a different color or range of colors. For example, in U.S. Pat. No. 6,576,930 a partially transparent, luminescent powder composed of yttrium aluminum garnet (YAG) doped with cerium (denoted by the chemical formula $Y_3Al_5O_{12}:Ce^{3+}$ or as $YAG:Ce^{3+}$) is dispersed in an organic binder. This luminescent material covers the light output surfaces of a blue LED. A portion of the blue light (wavelength of 420-460 nm) emitted by the LED is converted to yellow light (at a wavelength of approximately 580 nm). The remainder of the blue light can pass through the partially transparent material. The combination of blue and yellow light, if mixed in the proper proportions, appears to the human eye to be white light. The material $YAG:Ce^{3+}$ in powdered form is one of many types of luminescent materials commonly known as phosphors.

Schematic diagrams of prior art light-emitting devices that incorporate LEDs in combination with phosphor materials are illustrated in cross section in FIGS. 3A and 3B and in U.S. Pat. No. 6,417,019. In FIG. 3A, light-emitting device 60 includes an LED source 64 that is coated with a phosphor layer 66. The phosphor layer 66 converts a portion of the LED light into light of another wavelength. The light-emitting device 60 emits light both from the LED source and from the phosphor layer. A reflecting cup 68 restricts the light output distribution from the LED source and the phosphor layer so that the emitted light does not radiate in all directions. However, the reflecting cup does not recycle any of the emitted light back to the LED source and does not increase the effective brightness of the source.

FIG. 3B illustrates the cross section of another light-emitting device 80 containing an LED source 84 and phosphor layer 86. The phosphor layer 86 substantially fills a reflecting cup 88 and converts a portion of the LED light into light of another wavelength. The reflecting cup 88 restricts the light output distribution from the LED source and the phosphor. However, the reflecting cup 88 does not recycle any of the emitted light back to the LED source 84 and does not increase the effective brightness of the source.

LEDs, including inorganic light-emitting diodes and organic light-emitting diodes, and the combination of an LED and a luminescent material all emit incoherent light. Semiconductor laser light sources, such as edge-emitting laser diodes and vertical cavity surface emitting lasers, generally emit coherent light. However, semiconductor laser light sources can be combined with luminescent materials such as phosphors to produce a light source that emits incoherent light. Coherent semiconductor laser light sources typically have higher brightness than incoherent light sources, but semiconductor laser light sources are not suitable for many applications such as displays due to the formation of undesirable speckle light patterns that result from the coherent nature of the light.

It would be highly desirable to develop incoherent illumination systems based on LEDs or semiconductor lasers that utilize both wavelength conversion and light recycling to increase the illumination system brightness. Possible applications include projection displays, flat-panel displays, avionics displays, automotive lighting, residential lighting, commercial lighting and industrial lighting.

SUMMARY OF THE INVENTION

The embodiments of this invention are comprised of a light source that emits light of a first wavelength range, a wavelength conversion layer, a light-recycling envelope and a light output aperture. The present invention combines the concept of recycling light back to the light source to enhance brightness with the added element of a wavelength conversion layer, which converts a portion of the light of a first wavelength range emitted by the light source into light of a second wavelength range, different than the light of a first wavelength range. The wavelength conversion layer is a phosphor layer, preferably a solid phosphor layer. To determine the brightness enhancement of an illumination system due to light recycling, the output brightness of an illumination system utilizing light recycling must be compared to the intrinsic brightness of a reference illumination system that does not utilize recycling. The reference brightness is either (a) the maximum intrinsic brightness of the light source in the absence of light recycling or (b) the maximum combined intrinsic brightness of the light source and wavelength conversion layer in the absence of light recycling. In this invention, recycled light refers to light that was emitted by the light source or the wavelength conversion layer and was subsequently reflected back to either the light source or the wavelength conversion layer.

In the first embodiment of this invention, the output brightness of the illumination system is measured as the combined exiting brightness of both light of a first wavelength range and light of a second wavelength range exiting the light output aperture in the presence of a light-recycling envelope. The reference brightness is the maximum intrinsic source brightness of light of a first wavelength range emitted by an LED light source when light recycling is not utilized. The reference area utilized to measure the reference brightness is the total light-emitting area $A_S$ of the light source.

In the second embodiment of this invention, the output brightness of the illumination system is measured as the combined exiting brightness of both light of a first wavelength range and light of a second wavelength range exiting the light output aperture in the presence of a light-recycling envelope. The reference brightness is the maximum combined intrinsic brightness of light of a first wavelength range and light of a second wavelength range emitted by an LED light source and a wavelength conversion layer operating in combination when light recycling is not utilized. The reference area utilized to measure the reference brightness is the maximum cross-sectional area $A_E$ of the light-recycling envelope.

In the third embodiment of this invention, the output brightness of the illumination system is measured as the exiting brightness of light of a second wavelength range exiting the light output aperture in the presence of a light-recycling envelope. The reference brightness is the maximum intrinsic brightness of light of a second wavelength range emitted by a semiconductor laser light source and a wavelength conversion layer operating in combination when light recycling is not utilized. The reference area utilized to measure the reference brightness is the maximum cross-sectional area $A_E$ of the light-recycling envelope.

The three embodiments of this invention are now summarized in greater detail.

The first embodiment of this invention is an illumination system comprising: (a) a light source, wherein the light source comprises at least one light-emitting diode that emits light of a first wavelength range, wherein the at least one light-emitting diode is further comprised of an emitting layer that emits the light of a first wavelength range and a reflecting layer that reflects light, wherein the reflectivity of the reflecting layer is reflectivity $R_S$, wherein the total light-emitting area of the light source is area $A_S$ and wherein the light of a first wavelength range emitted by the light source has a maximum intrinsic source radiance and a maximum intrinsic source luminance; (b) a wavelength conversion layer, wherein the wavelength conversion layer converts a portion of the light of a first wavelength range into light of a second wavelength range, different from the light of a first wavelength range; (c) a light-recycling envelope, wherein the light-recycling envelope is separate from the wavelength conversion layer, wherein the light-recycling envelope at least partially encloses the light source and the wavelength conversion layer, wherein the light-recycling envelope has reflectivity $R_E$ and wherein the light-recycling envelope reflects and recycles part of the light of a first wavelength range and part of the light of a second wavelength range back to the reflecting layer of the at least one light-emitting diode and to the wavelength conversion layer; and (d) at least one light output aperture, wherein the at least one light output aperture is located in a surface of the light-recycling envelope, wherein the total light output aperture area is area $A_O$, wherein the area $A_O$ is less than the area $A_S$, wherein the light source and the wavelength conversion layer and the light-recycling envelope direct at least a fraction of the light of a first wavelength range and at least a fraction of the light of a second wavelength range out of the light-recycling envelope through the at least one light output aperture and wherein the fraction of the light of a first wavelength range and the fraction of the light of a second wavelength range exit the at least one light output aperture as incoherent light having a combined exiting radiance and a combined exiting luminance. Under some conditions utilizing light recycling, the combined exiting radiance exiting the at least one light-output aperture of the illumination system is greater than the maximum intrinsic source radiance and/or the combined exiting luminance exiting the at least one light-output aperture of the illumination system is greater than the maximum intrinsic source luminance.

The second embodiment of this invention is an illumination system comprising: (a) a light source, wherein the light source comprises at least one light-emitting diode that emits light of a first wavelength range, wherein the light-emitting diode is further comprised of an emitting layer that emits the light of a first wavelength range and a reflecting layer that reflects light and wherein the reflectivity of the reflecting layer is reflectivity $R_S$; (b) a wavelength conversion layer, wherein the wavelength conversion layer converts a portion of the light of a first wavelength range into light of a second wavelength range, different from the light of a first wavelength range and wherein the light source and the wavelength conversion layer operating in combination have a maximum combined intrinsic radiance and a maximum combined intrinsic luminance; (c) a light-recycling envelope, wherein the light-recycling envelope is separate from the wavelength conversion layer, wherein the light-recycling envelope at least partially encloses the light source and the wavelength conversion layer, wherein the maximum cross-sectional area of the light-recycling envelope is area $A_E$, wherein the light-recycling envelope has reflectivity $R_E$ and wherein the light-recycling envelope reflects and recycles part of the light of a first wavelength range and part of the light of a second wavelength range back to the reflecting layer of the light source and to the wavelength conversion layer; and (d) at least one light output aperture, wherein the at least one light output aperture is located in a surface of the light-recycling envelope, wherein the total light output aperture area is area $A_O$, wherein the area $A_O$ is less than the area $A_E$ and wherein the light source and the wavelength conversion layer and the light-recycling envelope direct at least a fraction of the light of a first wavelength range and at least a fraction of the light of a second wavelength range out of the light-recycling envelope through the at least one light output aperture and wherein the fraction of the light of a first wavelength range and the fraction of the light of a second wavelength range exit the at least one light output aperture as incoherent light that has a combined exiting radiance and a combined exiting luminance. Under some conditions utilizing light recycling, the combined exiting radiance exiting the at least one light-output aperture of the illumination system is greater than the maximum combined intrinsic radiance and/or the combined exiting luminance exiting the at least one light-output aperture of the illumination system is greater than the maximum combined intrinsic luminance.

The third embodiment of this invention is an illumination system comprising: (a) a light source, wherein the light source comprises at least one semiconductor laser that emits light of a first wavelength range; (b) a wavelength conversion layer, wherein the wavelength conversion layer converts a portion of the light of a first wavelength range into light of a second wavelength range, different from the light of a first wavelength range and wherein the light source and the wavelength conversion layer operating in combination have a maximum combined intrinsic radiance of light of a second wavelength range and a maximum combined intrinsic luminance of light of a second wavelength range; (c) a light-recycling envelope, wherein the light-recycling envelope is separate from the wavelength conversion layer, wherein the light-recycling envelope at least partially encloses the light source and the wavelength conversion layer, wherein the maximum cross-sectional area of the light-recycling envelope is area $A_E$, wherein the light-recycling envelope has reflectivity $R_E$ and wherein the light-recycling envelope reflects and recycles part of the light of a first wavelength range and part of the light of a second wavelength range back to the wavelength conversion layer; and (d) at least one light output aperture, wherein the at least one light output aperture is located in a surface of the light-recycling envelope, wherein the total light output aperture area is area $A_O$, wherein the area $A_O$ is less than the area $A_E$ and wherein the wavelength conversion layer and the light-recycling envelope direct at least a fraction of the light of a second wavelength range out of the light-recycling envelope through the at least one light output aperture and wherein the fraction of the light of a second wavelength range exits the at least one light output aperture as incoherent light having an exiting radiance of light of a second wavelength range and an exiting luminance of light of a second wavelength range. Under some conditions utilizing light recycling, the exiting radiance of light of a second wavelength range exiting the at least one light-output aperture of the illumination system is greater than the maximum combined intrinsic radiance of light of a second wavelength range and/or the exiting luminance of light of a second wavelength range exiting the at least one light-output aperture of the illumination system is greater than the maximum combined intrinsic luminance of light of a second wavelength range.

BRIEF DESCRIPTION OF THE DRAWINGS

A more complete understanding of the present invention, as well as other objects and advantages thereof not enumerated herein, will become apparent upon consideration of the following detailed description and accompanying drawings, wherein:

FIG. 7 is a cross-sectional side view of another embodiment of this invention that further comprises a light-collimating element.

FIG. 23 is an embodiment of this invention that includes a solid phosphor layer as a wavelength conversion layer.

DETAILED DESCRIPTION OF THE PREFERRED EMBODIMENTS

Figure 1A:
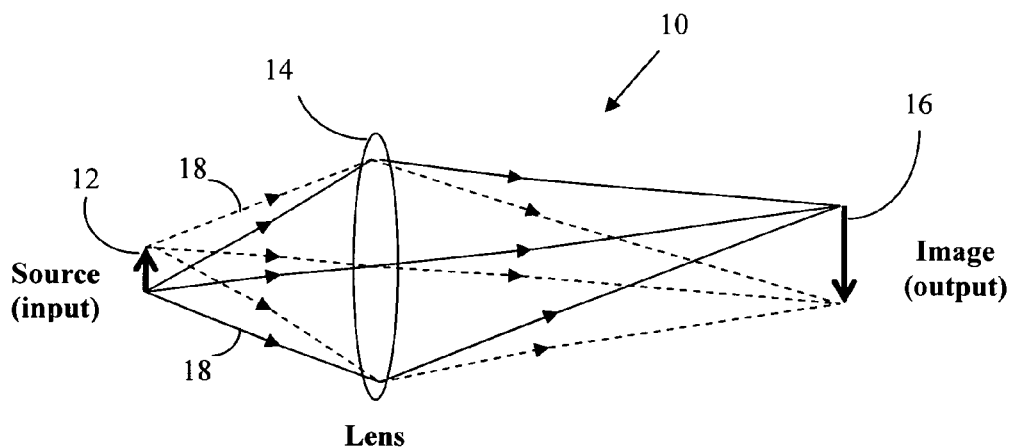
FIGS. 1A and 1B are cross-sectional side views of conventional optical systems of the prior art.
Figure 1B:
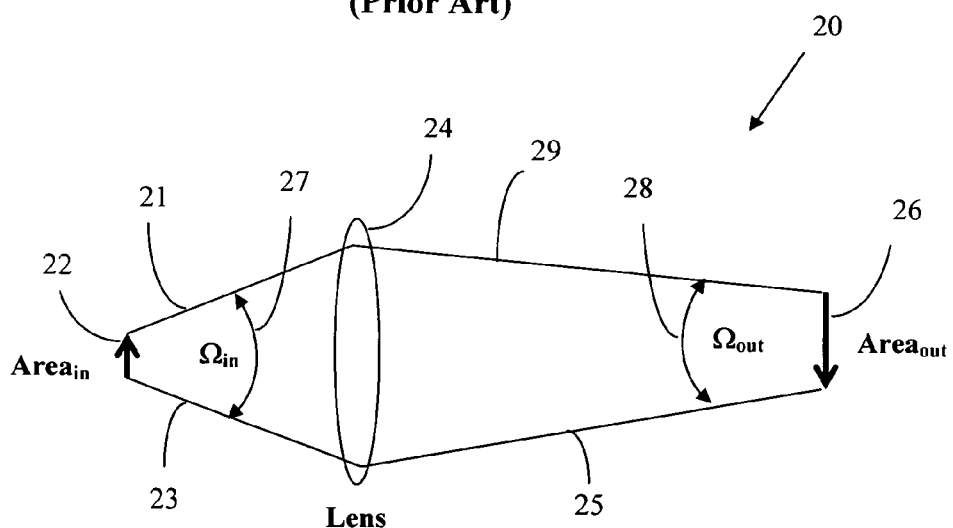
Figure 2A:
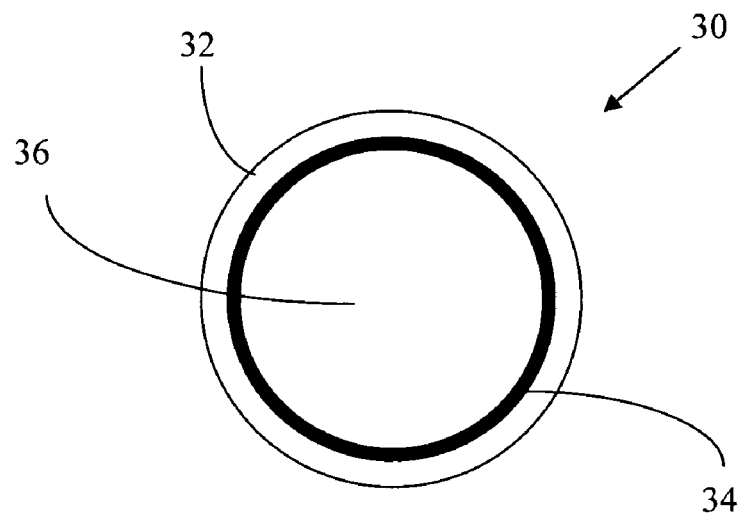
FIGS. 2A and 2B are cross-sectional views of prior art light sources that have both reflecting and emitting surfaces.
Figure 2B:
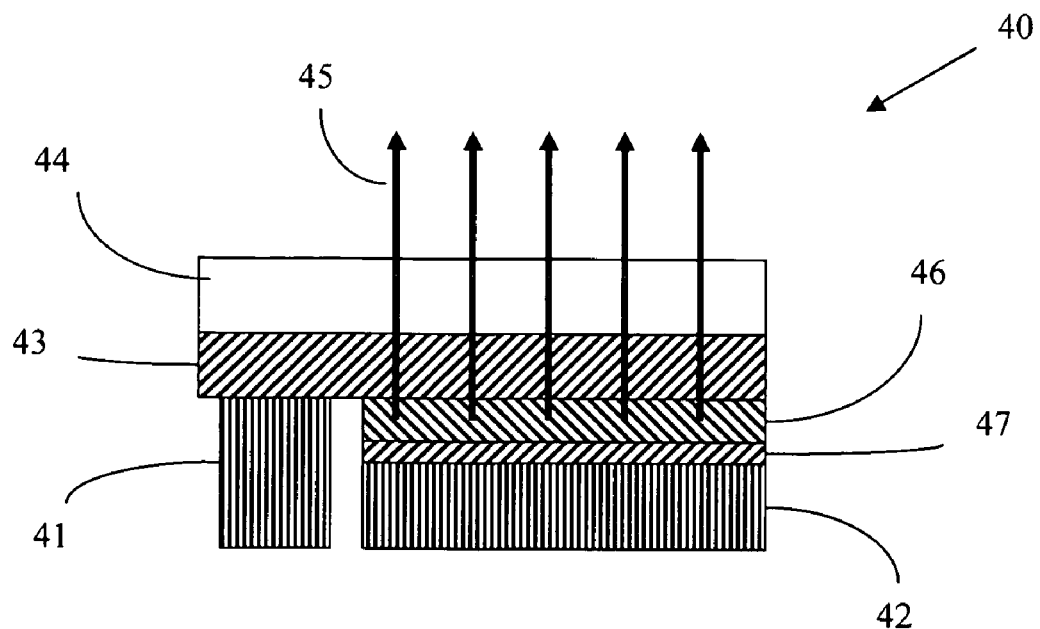

The preferred embodiments of the present invention will be better understood by those skilled in the art by reference to the above FIGURES. The preferred embodiments of this invention illustrated in the FIGURES are not intended to be exhaustive or to limit the invention to the precise form disclosed. The FIGURES are chosen to describe or to best explain the principles of the invention and its applicable and practical use to thereby enable others skilled in the art to best utilize the invention.

The embodiments of this invention are comprised of a light source, a wavelength conversion layer, a light-recycling envelope and at least one light output aperture located in the surface of the light-recycling envelope.

The preferred light source of this invention comprises at least one light-emitting diode (LED) or at least one semiconductor laser. Preferred LEDs are inorganic light-emitting diodes and organic light-emitting diodes (OLEDs) that both emit light and reflect light. More preferred LEDs are inorganic light-emitting diodes due to their higher light output brightness. Preferred semiconductor lasers are edge-emitting diode lasers and vertical cavity surface-emitting lasers.

Various illumination systems that utilize LEDs are illustrated in FIGS. 4-19 and FIG. 23. An LED depicted in FIGS. 4-19 and FIG. 23 may be any LED that both emits light and reflects light. Examples of LEDs that both emit and reflect light include inorganic light-emitting diodes and OLEDs. Inorganic light-emitting diodes can be fabricated from materials containing gallium nitride, aluminum gallium nitride, indium gallium nitride, aluminum indium gallium nitride, aluminum nitride, aluminum indium gallium phosphide, gallium arsenide, indium gallium arsenide or indium gallium arsenide phosphide, for example, but are not limited to such materials. OLEDs may be constructed from a variety of light-emitting organic small molecules or polymers. Appropriate small molecules include, for example, tris(8-hydroxyquinoline) aluminum(III), which can be abbreviated as $Alq_3$, and certain types of chelates, oxadiazoles, imidazoles, benzidines and triarylamines, but are not limited to such materials. Appropriate polymers include, for example, poly(ethylene dioxythiophene) and poly(styrene sulfonate).

For purposes of simplifying the FIGURES, each LED in FIGS. 4-19 and FIG. 23 is illustrated in an identical manner and each LED is shown as being comprised of two elements, an emitting layer that emits light and a reflecting layer that reflects light. Note that typical LEDs are normally constructed with more than two elements, but for the purposes of simplifying FIGS. 4-19 and FIG. 23, the additional elements are not shown. Some of the embodiments of this invention may contain two or more LEDs. Although each LED in FIGS. 4-19 and FIG. 23 is illustrated in an identical manner, it is within the scope of this invention that multiple LEDs in an embodiment may not all be identical. For example, if an embodiment of this invention has a plurality of LEDs, it is within the scope of this invention that some of the LEDs may be inorganic light-emitting diodes and some of the LEDs may be OLEDs. As a further example of an illumination system having multiple LEDs, if an embodiment of this invention has a plurality of LEDs, it is also within the scope of this invention that some of the LEDs may emit different colors of light. Example LED colors include, but are not limited to, wavelengths in the infrared, visible and ultraviolet regions of the optical spectrum. For example, one or more of the LEDs in a light-recycling envelope may be red LEDs, one or more of the LEDs may be green LEDs and one or more of the LEDs may be blue LEDs. If an embodiment, for example, contains red, green and blue LEDS, then the red, green and blue LEDs may be powered concurrently to produce a single composite output color such as white light. Alternatively, the red, green and blue LEDs in this example may each be powered at different times to produce different colors in different time periods.

Preferred LEDs have at least one reflecting layer that reflects light incident upon the LED. The reflecting layer of the LED may be either a specular reflector or a diffuse reflector. Typically, the reflecting layer is a specular reflector. Preferably the reflectivity $R_S$ of the reflecting layer of the LED is at least 50%. More preferably, the reflectivity $R_S$ is at least 70%. Most preferably, the reflectivity $R_S$ is at least 90%.

Each LED in FIGS. 4-9, 11-14, 17-19 and 23 is illustrated with an emitting layer facing the interior of the light-recycling envelope and a reflecting layer positioned behind the emitting layer and adjacent to the inside surface of the light-recycling envelope. In this configuration, light can be emitted from all surfaces of the emitting layer that are not in contact with the reflecting layer. It is also within the scope of this invention that a second reflecting layer can be placed on the surface of the emitting layer facing the interior of the light-recycling envelope. In the latter example, light can be emitted from the side surfaces of the emitting layer that do not contact either reflecting layer. A second reflecting layer is especially important for some types of LEDs that have an electrical connection on the top surface of the emitting layer since the second reflecting layer can improve the overall reflectivity of the LED.

The total light-emitting area of the light source is area $A_S$. If there is more than one LED within a single light-recycling envelope, the total light-emitting area $A_S$ of the light source is the total light-emitting area of all the LEDs in the light-recycling envelope.

The light source, whether comprising one LED or a plurality of LEDs, has a maximum intrinsic source radiance that depends on the light source design and the driving electrical power applied to the light source. The maximum intrinsic source radiance is determined in the following manner. First, the radiance is measured for each LED in the light source (or for equivalent reference LEDs for each LED in the light source) when the light-recycling envelope is not present and when no other LED is directing light to the LED under measurement. The measurements are done with each LED powered at the same level as in the illumination system and are done as a function of emitting angle. From these radiance measurements, a maximum radiance value can be determined for all the LEDs. This maximum value is defined as the maximum intrinsic source radiance.

Figure 20A:
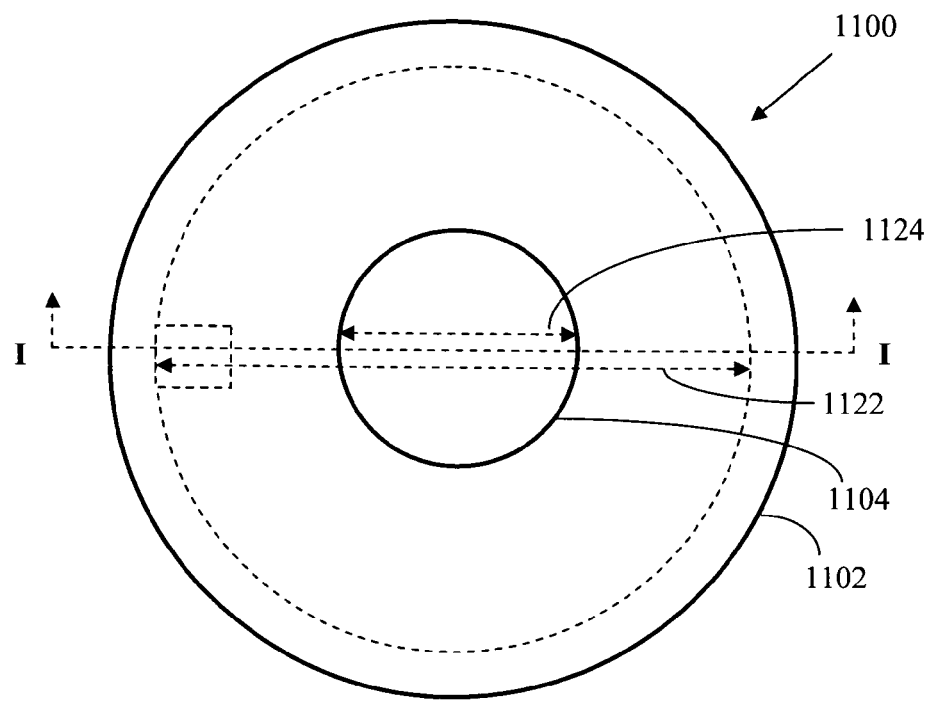
FIG. 20A is a top external view of another embodiment of this invention that has one semiconductor laser and a wavelength conversion layer.
Figure 20B:
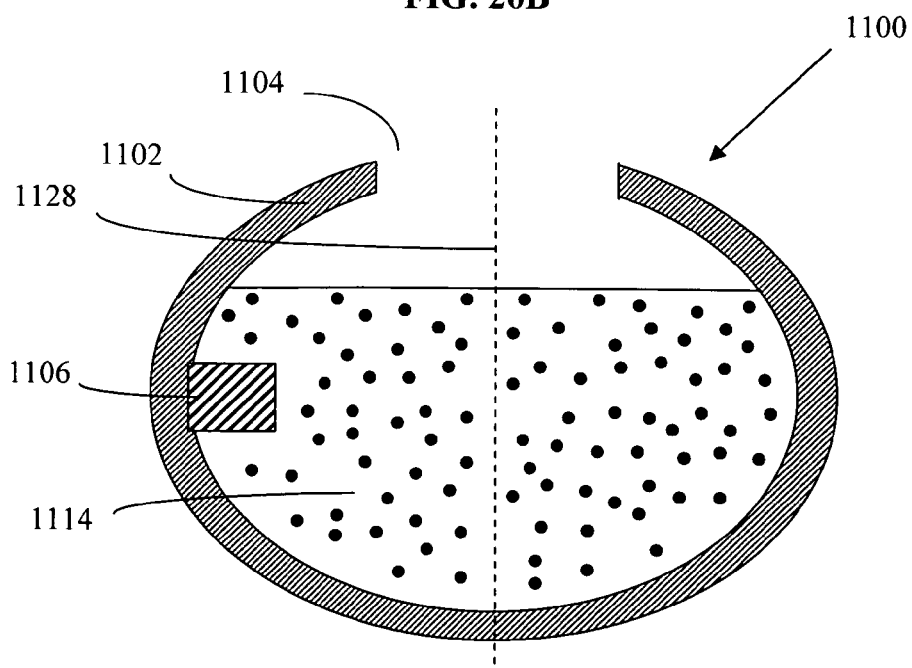
FIG. 20B is a cross-sectional side view in the I-I plane of the illumination system shown in FIG. 20A.
Figure 20C:
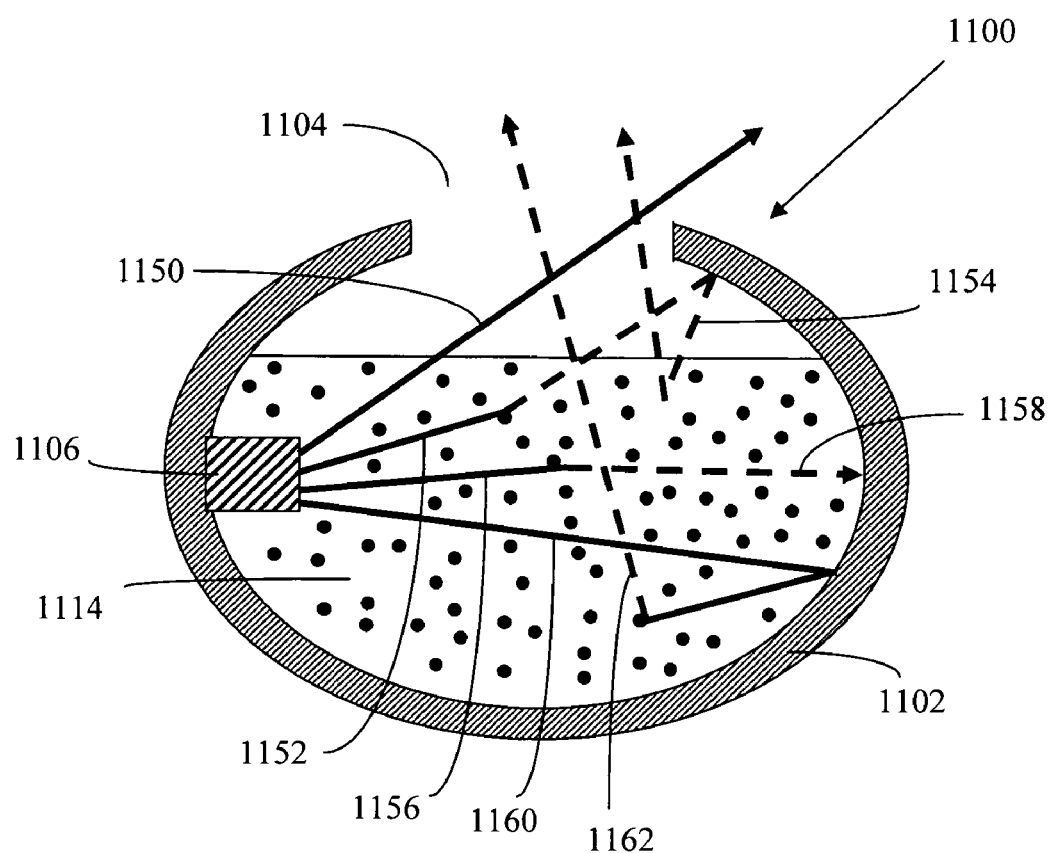
FIG. 20C is a cross-sectional side view in the I-I plane of the illumination system shown in FIGS. 20A and 20B and illustrates representative light rays.
Figure 21:
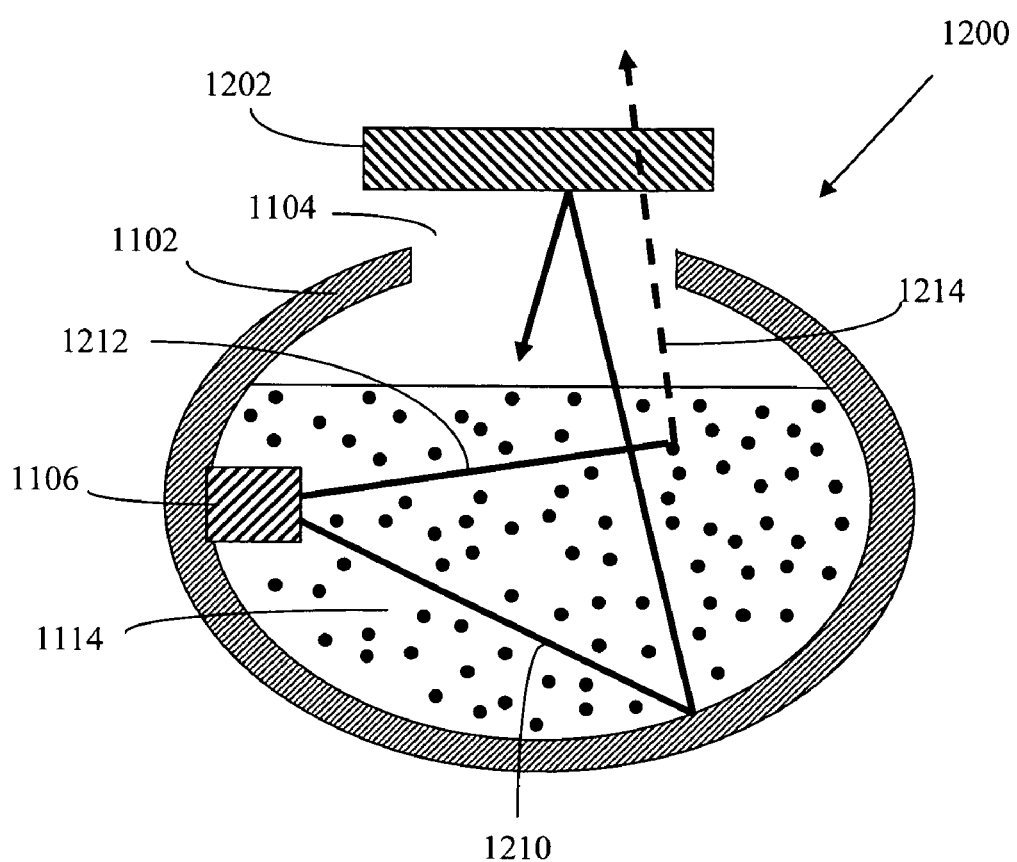
FIG. 21 is a cross-sectional side view of another embodiment of this invention that further comprises a dichroic mirror.
Figure 22:
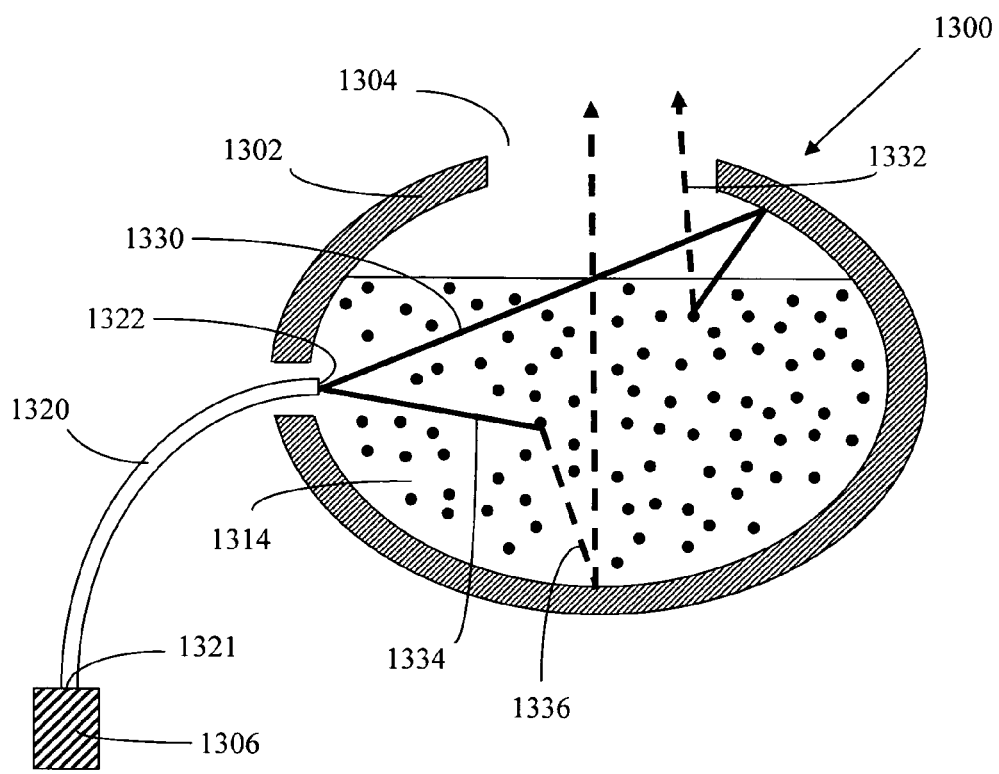
FIG. 22 is a cross-sectional side view of another embodiment of this invention that further comprises a light guide.

The light source for the illuminations systems in FIGS. 20-22 is at least one semiconductor laser. Semiconductor lasers include edge-emitting diode lasers, which have a horizontal cavity (the principal axis of the cavity is parallel to the plane of the semiconductor wafer or chip) and vertical end mirrors (perpendicular to the plane of the semiconductor wafer or chip). Semiconductor lasers also include vertical cavity surface emitting lasers (VCSELs), which have a vertical cavity (the principal axis of the cavity is perpendicular to the plane of the semiconductor wafer or chip) and horizontal mirrors (parallel to the plane of the semiconductor wafer or chip). The light output area of a semiconductor laser is usually small. Recycling light back to a semiconductor laser located in a light-recycling envelope of an illumination system will generally have a relatively small effect on the output brightness of the illumination system. For light-recycling envelopes that contain semiconductor lasers and no LEDs, the predominant light recycling mechanism is light recycling back to the wavelength conversion layer.

The light of a first wavelength range emitted by the light source, where the light source at least one LED or at least one semiconductor laser, is preferably greater that 200 nanometers in wavelength and less than 3000 nanometers in wavelength. More preferably, the light of a first wavelength range is greater than 200 nanometers in wavelength and less than 500 nanometers in wavelength.

The wavelength conversion layer of this invention converts a portion of the light of a first wavelength range into light of a second wavelength range, different from the light of a first wavelength range. The light of a second wavelength range has longer wavelengths than the light of a first wavelength range.

The wavelength conversion layer is comprised of a phosphor material, a quantum dot material, a luminescent dopant material or a plurality of such materials. The phosphor material may be a powdered phosphor material or may be a solid phosphor layer. A solid phosphor layer may be a doped single-crystal solid, a doped polycrystalline solid or a doped amorphous solid. If the phosphor is a powdered phosphor material, a quantum dot material or a luminescent dopant material, the wavelength conversion layer may further comprise a transparent host material into which the powdered phosphor material, the quantum dot material or the luminescent dopant material is dispersed.

Phosphor materials are typically optical inorganic crystalline, polycrystalline or amorphous materials doped with ions of lanthanide (rare earth) elements or, alternatively, ions such as manganese, magnesium, chromium, titanium, vanadium, cobalt or neodymium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), any garnet material such as yttrium aluminum garnet (YAG or $Y_3Al_5O_{12}$) or terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials ((lanthanide)(Mg,Zn)$B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nanometers or thereabouts. An exemplary red emitting phosphor is $Y_2O_3:Eu^{3+}$. An exemplary yellow emitting phosphor is $YAG:Ce^{3+}$. Exemplary green emitting phosphors include $CeMgAl_{11}O_{19}:Tb^{3+}$, ((lanthanide)$PO_4:Ce^{3+},Tb^{3+}$) and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400 to 500 nanometer wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400 to 500 nanometer wavelength region include $YAG:Ce^{3+}$, $YAG:Ho^{3+}$, $YAG:Pr^{3+}$, $SrGa_2S_4:Eu^{2+}$, $SrGa_2S_4:Ce^{3+}$, $SrS:Eu^{2+}$ and nitridosilicates doped with $Eu^{2+}$.

Quantum dot materials are small particles of inorganic semiconductors having particle sizes less than about 40 nanometers. Exemplary quantum dot materials include, but are not limited to, small particles of CdS, CdSe, ZnSe, InAs, GaAs and GaN. Quantum dot materials can absorb light at one wavelength and then re-emit the light at different wavelengths that depend on the particle size, the particle surface properties, and the inorganic semiconductor material. Sandia National Laboratories has demonstrated white light generation using 2-nanometer CdS quantum dots excited with near-ultraviolet LED light. Efficiencies of approximately 60% were achieved at low quantum dot concentrations dispersed in a large volume of transparent host material. Because of their small size, quantum dot materials dispersed in transparent host materials exhibit low optical backscattering.

Luminescent dopant materials include, but are not limited to, organic laser dyes such as coumarin, fluorescein, rhodamine and perylene-based dyes. Other types of luminescent dopant materials are lanthanide dopants, which can be incorporated into polymer materials. The lanthanide elements are lanthanum, cerium, praseodymium, neodymium, promethium, samarium, europium, gadolinium, terbium, dysprosium, holmium, erbium, thulium, ytterbium and lutetium. An exemplary lanthanide element is erbium.

The transparent host materials include polymer materials and inorganic materials. The polymer materials include, but are not limited to, acrylates, polystyrene, polycarbonate, fluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A single type of phosphor material, quantum dot material or luminescent dopant material may be incorporated in the wavelength conversion layer or a mixture of phosphor materials, quantum dot materials and/or luminescent dopant materials may be incorporated into the wavelength conversion layer. Utilizing a mixture of more than one such material is advantageous if a broad spectral emission range is desired for the light of a second wavelength range.

The wavelength conversion layer may be transparent, translucent or partially reflecting. The optical properties of the wavelength conversion layer depend strongly on the materials utilized for the layer. Wavelength conversion layers containing particles that are much smaller than the wavelengths of visible light and that are dispersed in a transparent host material may be highly transparent or translucent with only a small amount of light scattering. Wavelength conversion layers that contain particles that are approximately equal to or larger than the wavelengths of visible light will usually scatter light strongly. Such materials will be partially reflecting. If the wavelength conversion layer is partially reflecting, it is preferred that the layer be made thin enough so that it transmits at least part of the light incident upon the layer.

The wavelength conversion layer may be applied as a coating on the inside surfaces of the light-recycling envelope, may be applied as a coating on the light output surfaces of an LED, or may partially fill, substantially fill or completely fill the interior volume of the light-recycling envelope.

By placing the wavelength conversion layer in contact with the emitting layer of an LED, the difference in refractive index between the emitting layer and the environment external to the emitting layer will be reduced relative to having air at the interface of the emitting layer. Reducing the refractive index difference can reduce total internal reflection of light of a first wavelength range generated inside the emitting layer and increase the efficiency of light emission from the emitting layer. This effect can result in an overall increase in the efficiency of the illumination system. The highest efficiency of light emission from the emitting layer will occur if the effective refractive index of the wavelength conversion layer is equal to or greater than the refractive index of the emitting layer.

If necessary, the effective refractive index of the wavelength conversion layer can be increased by incorporating ultrafine powders of high index materials into the host material of the wavelength conversion layer. Preferably, the ultrafine powders are made from materials having a bulk index of refraction greater than 1.60. Ultrafine powders are powders with particle sizes less than about 300 nanometers. Exemplary ultrafine powders can be made from materials such as, for example, tin oxide, titanium oxide, zinc oxide, cerium oxide and antimony pentoxide.

The light-recycling envelope of this invention is a light-reflecting element that at least partially encloses the light source and the wavelength conversion layer. The light-recycling envelope is an element separate from the wavelength conversion layer. The light-recycling envelope may be any three-dimensional surface that encloses an interior volume. For example, the surface of the light-recycling envelope may be in the shape of a cube, a rectangular three-dimensional surface, a sphere, a spheroid, an ellipsoid, an arbitrary three-dimensional facetted surface or an arbitrary three-dimensional curved surface. Preferably the three-dimensional shape of the light-recycling envelope is a facetted surface with flat sides in order to facilitate the attachment of LEDs to the inside surfaces of the envelope. Preferable three-dimensional shapes have a cross-section that is a square, a rectangle or a polygon.

The light-recycling envelope reflects and recycles part of the light of a first wavelength range and part of the light of a second wavelength range back to the light source and to the wavelength conversion layer. Preferably the reflectivity $R_E$ of the inside surfaces of the light-recycling envelope is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the efficiency and exiting brightness of the illumination system.

The light-recycling envelope may be fabricated from a bulk material that is intrinsically reflective. A bulk material that is intrinsically reflective may be a diffuse reflector or a specular reflector. Preferably a bulk material that is intrinsically reflective is a diffuse reflector. Diffuse reflectors reflect light rays in random directions and prevent reflected light from being trapped in cyclically repeating pathways. Specular reflectors reflect light rays where the angle of incidence is equal to the angle of reflection.

Alternatively, if the light-recycling envelope is not fabricated from an intrinsically reflective material, the interior surfaces of the light-recycling envelope must be covered with a reflective coating. The reflective coating may be a specular reflector, a diffuse reflector or a diffuse reflector that is backed with a specular reflecting layer. Diffuse reflectors typically need to be relatively thick (a few millimeters) in order to achieve high reflectivity. The thickness of a diffuse reflector needed to achieve high reflectivity can be reduced if a specular reflector is used as a backing to the diffuse reflector.

Diffuse reflectors can be made that have very high reflectivity (for example, greater than 95% or greater than 98%). However, diffuse reflectors with high reflectivity are generally quite thick. For example, diffuse reflectors with reflectivity greater than 98% are typically several millimeters thick. Examples of diffuse reflectors include, but are not limited to, fluoropolymer materials such as Spectralon™ from Labsphere, Inc. and polytetrafluoroethylene film from manufacturers such as Fluorglas (sold under the trade name Furon™), W.L. Gore and Associates, Inc. (sold under the trade name DR™), or E.I. du Pont de Nemours & Company (sold under the trade name of Teflon™), films of barium sulfate, porous polymer films containing tiny air channels such as polyethersulfone and polypropylene filter materials made by Pall Gelman Sciences, and polymer composites utilizing reflective filler materials such as, for example, titanium dioxide. An example of the latter polymer composite material is titanium dioxide filled ABS (acrylonitrile-butadiene-styrene terpolymer) produced by RTP. In the case that a polymer composite material is employed as a reflective material, such as titanium dioxide filled ABS, the light-recycling envelope can be formed from the polymer composite material and a separate light-reflecting layer is not needed on the interior surfaces of the light-recycling envelope.

If the inside surfaces of a light-recycling envelope are coated with a wavelength conversion layer containing, for example, a powdered phosphor material, the wavelength conversion layer itself may also be a partially-reflecting, diffuse reflector. If the light-recycling envelope is coated with a wavelength conversion layer, then the wavelength conversion layer will be selected not to interfere with the reflectivity of the light-recycling envelope. In addition, the light-recycling envelope will be selected not to interfere with the wavelength conversion of the wavelength conversion layer.

Most specular reflective materials have reflectivity ranging from about 80% to about 98.5%. Examples of specular reflective materials include, but are not limited to, Silverlux™, a product of 3M Corporation, and other carrier films of plastic that have been coated with a thin metallic layer such as silver, aluminum or gold. The thickness of the metallic coating may range from about 0.05 micrometers to about 0.1 millimeter, depending on the materials used and the method of manufacturing the metal coating. Other examples of specular reflective films that have high reflectivity include photonic bandgap reflective materials and Vikuiti™ ESR (Enhanced Specular Reflector) made by 3M Corporation. The ESR film has a reflectivity of greater than 98% across the visible light spectrum.

The interior volume of the light-recycling envelope that is not occupied by the wavelength conversion layer and the light source may be occupied by a vacuum, may be filled with a light transmitting gas or may be filled or partially filled with a transparent or semi-transparent solid separate from the wavelength conversion material. Any gas or solid that fills or partially fills the light-recycling envelope should transmit both the light of a first wavelength range and the light of a second wavelength range. Examples of light-transmitting gases are air, nitrogen and inert gases such as argon. Examples of transparent solids include glasses such as silicon dioxide or plastics such as polymethylmethacrylate, polystyrene, polycarbonate or a silicone-containing material.

The light-recycling envelope has at least one light output aperture. The light source and the wavelength conversion layer and the light-recycling envelope direct at least a fraction of the light of a first wavelength range and at least a fraction of the light of a second wavelength range out of the light-recycling envelope through the at least one light output aperture as incoherent light. The total light output aperture area is area $A_O$. If there is more than one output aperture in the light-recycling envelope, $A_O$ refers to the combined area of all the output apertures. An output aperture may have any shape including, but not limited to, a square, a rectangle, a polygon, a circle, an ellipse, an arbitrary facetted shape or an arbitrary curved shape.

Figure 3A:
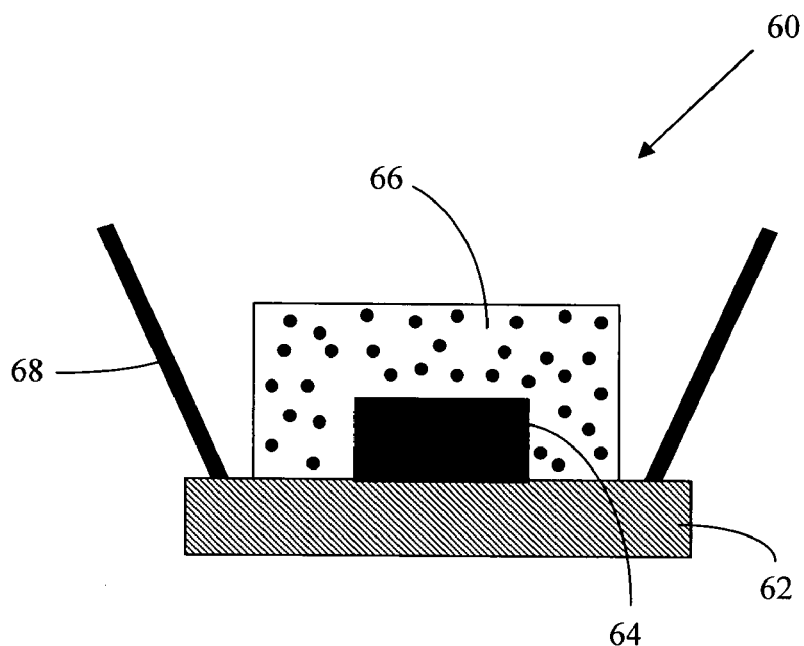
FIGS. 3A and 3B are cross-sectional views of prior art light-emitting diode illumination systems.
Figure 3B:
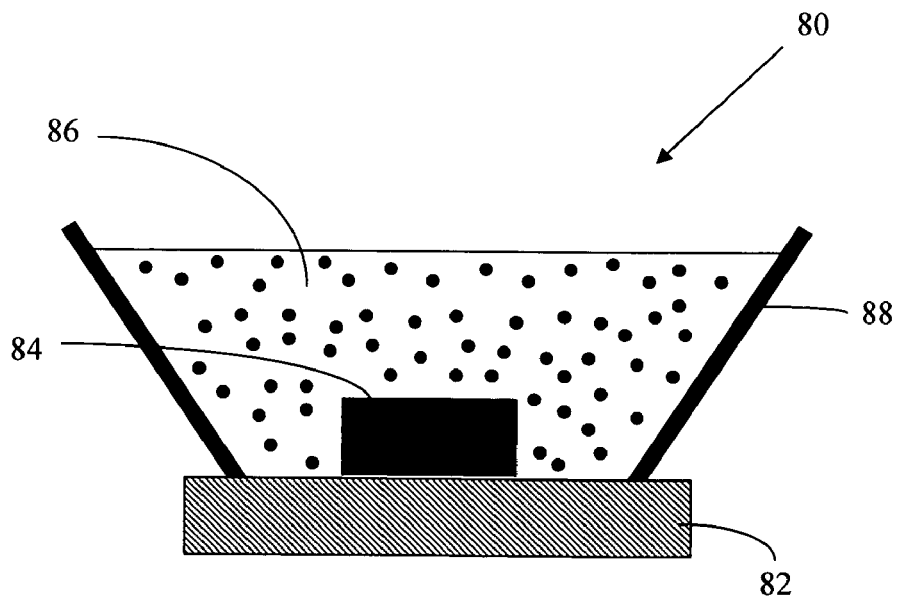
Figure 4A:
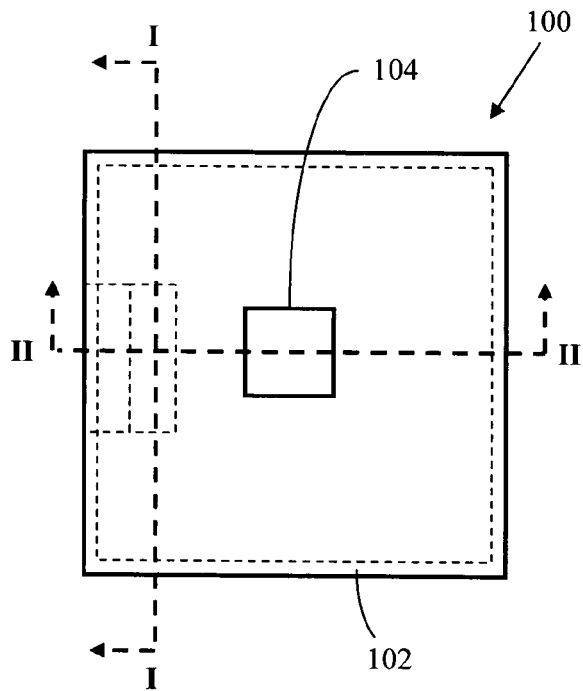
FIG. 4A is a top external view of an illumination system that has one light-emitting diode.
Figure 4B:
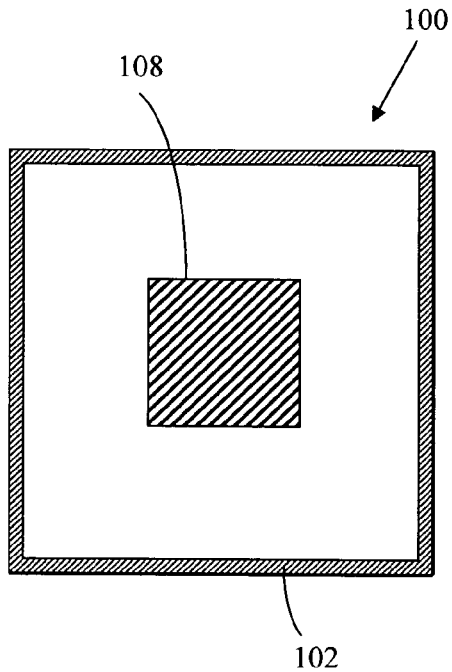
FIG. 4B is a cross-sectional side view in the I-I plane of the illumination system shown in FIG. 4A.
Figure 4C:
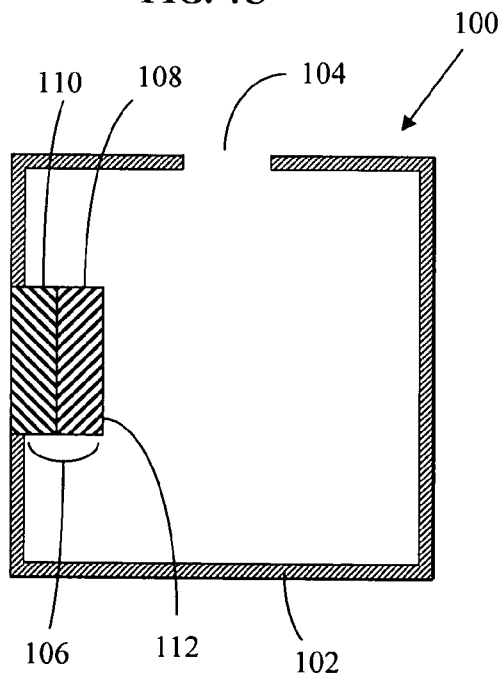
FIG. 4C is a cross-sectional side view in the II-II plane of the illumination system shown in FIG. 4A.
Figure 4D:
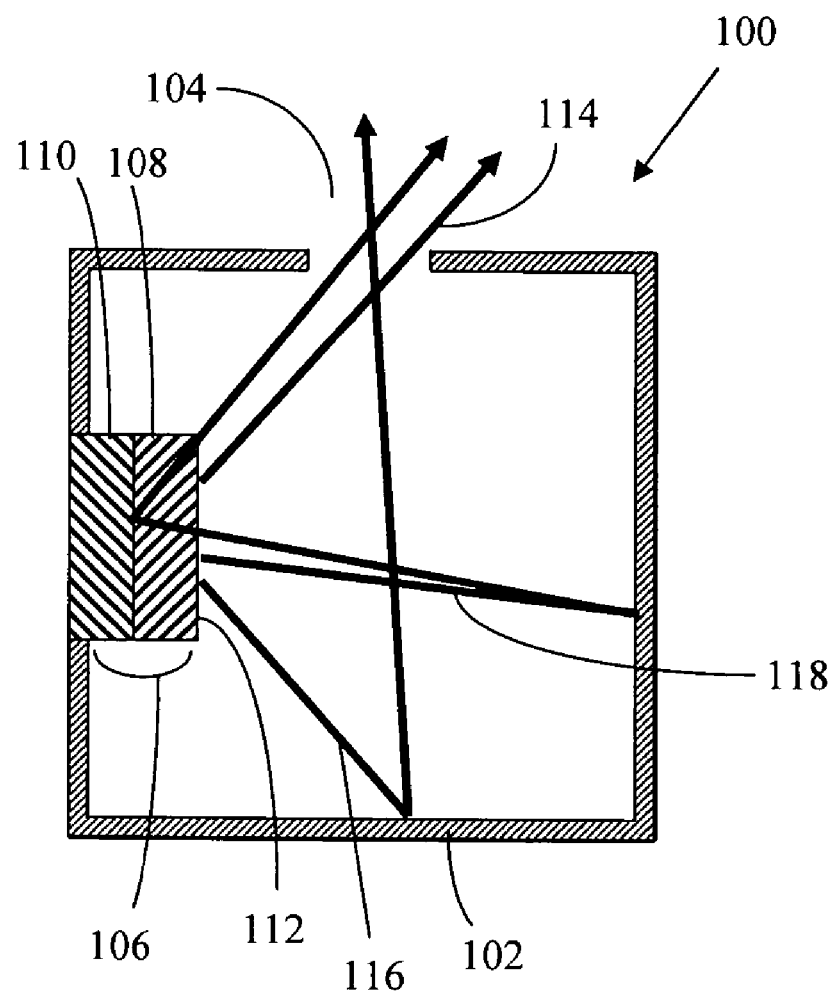
FIG. 4D is a cross-sectional side view in the II-II plane of the illumination system shown in FIG. 4A and illustrates representative light rays.

An illustrative example of an illumination system that utilizes light recycling is illumination system 100 shown FIGS. 4A, 4B, 4C and 4D. FIG. 4A is a top exterior view of illumination system 100 showing the outer edge of a light-recycling envelope 102 and a light output aperture 104. FIG. 4B is a cross-sectional view along the I-I plane indicated in FIG. 4A. FIG. 4C is a cross-sectional view along the II-II plane indicated in FIG. 4A. The II-II plane passes through the light output aperture 104 and LED 106. FIG. 4D shows the paths of some representative light rays emitted from LED 106. Illumination system 100 of FIG. 3 does not contain any wavelength conversion layer.

The cubical three-dimensional shape of the surface of the light-recycling envelope 102, the square cross-sectional shape of the light-recycling envelope 102 and the square shape of the light output aperture 104 are illustrative examples used for ease of understanding of the descriptions. It should also be noted that the drawing is merely a representation of the structure; the actual and relative dimensions may be different.

As noted previously, the light-recycling envelope 102 may be any three-dimensional surface that encloses an interior volume. For example, the surface of the light-recycling envelope may be in the shape of a cube, a rectangular three-dimensional surface, a sphere, a spheroid, an ellipsoid, an arbitrary three-dimensional facetted surface or an arbitrary three-dimensional curved surface. The only requirement for the three-dimensional shape of the light-recycling envelope is that a fraction of any light emitted from an LED within the light-recycling envelope must also exit from the light output aperture of the light-recycling envelope within a finite number of reflections within the light-recycling envelope, i.e. there are no reflective dead spots within the light-recycling envelope where the light emitted from the LED will endlessly reflect without exiting the light-recycling envelope through the light output aperture. The cross-section of the light-recycling envelope 102, such as the one shown in FIG. 4C, may have any shape, both regular and irregular, depending on the shape of the three-dimensional surface. Other examples of possible cross-sectional shapes include a rectangle, a taper, a polygon, a circle, an ellipse, an arbitrary facetted shape or an arbitrary curved shape.

In illumination system 100, the inside surfaces of the light-recycling envelope 102, except for the area covered by the LED 106 and the area occupied by the light output aperture 104, are light reflecting surfaces. In order to achieve high light reflectivity, the light-recycling envelope 102 may be fabricated from a bulk material that is intrinsically reflective or the inside surfaces of the light-recycling envelope 102 may be covered with a reflective coating. The bulk material or the reflective coating may be a specular reflector, a diffuse reflector or a diffuse reflector that is backed with a specular reflecting layer. Examples of reflective materials were described previously. Preferably the reflectivity $R_E$ of the inside surfaces of the light-recycling envelope 102 that are not occupied by the LED 106 and the light output aperture 104 is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the efficiency and output brightness of the illumination system.

The square cross-sectional shape of illumination system 100 shown in FIG. 4C has a first side containing the light output aperture 104, a second side, a third side and a fourth side. The first side is opposite and parallel to the third side. The second side is opposite and parallel to the fourth side. The first side and third side are perpendicular to the second side and fourth side. The four sides of the illumination system shown in cross-section in FIG. 4C plus the two remaining sides of the six-sided cube (not shown in the cross-sectional view) form the interior of the light-recycling envelope.

The light source for illumination system 100 is LED 106, which is positioned interior to the fourth side of the illumination system. LED 106 emits light of a first wavelength range. LED 106 may be any inorganic light-emitting diode or an OLED. Preferably, LED 106 is an inorganic light-emitting diode.

LED 106 has a reflecting layer 110 and an emitting layer 108. The reflecting layer is adjacent to and interior to the fourth side while the emitting layer extends into the interior of the light-recycling envelope. The reflecting layer 110 may be a specular reflector or a diffuse reflector. In a typical inorganic light-emitting diode, the reflecting layer, if present, is usually a specular reflector. The light reflectivity of reflecting layer 110 of LED 106 is $R_S$. If the reflectivity varies across the area of the reflecting layer, the reflectivity $R_S$ is defined as the average reflectivity of the reflecting layer. The reflectivity $R_S$ of reflecting layer 110 is preferably at least 50%. More preferably, the reflectivity $R_S$ of reflecting layer 110 is at least 70%. Most preferably, the reflectivity $R_S$ of reflecting layer 110 is at least 90%. Ideally, the reflectivity $R_S$ should be as close to 100% as possible in order to maximize the efficiency and output brightness of the illumination system.

The total light-emitting area of the light source is area $A_S$. In FIGS. 4A-4D, the light source consists of just one LED, so the total light-emitting area $A_S$ of the light source is the light-emitting area of LED 106.

The light output from the LED 106, which is light of a first wavelength range, has a maximum intrinsic source radiance and a maximum intrinsic source luminance that depend on the LED design and the driving electrical power applied to the LED. The maximum intrinsic source radiance and maximum intrinsic source luminance of LED 106 can be determined by measuring an identically constructed LED that is not enclosed in a light-recycling envelope.

The light output aperture 104 is in the first side of the illumination system. A fraction of the light coming from the light source and the light-recycling envelope exits the light output aperture. As noted, the aperture may have any shape including, but not limited to, a square, a rectangle, a polygon, a circle, an ellipse, an arbitrary facetted shape or an arbitrary curved shape. The total light output aperture area is area $A_O$, which in this case is just the area of the single light output aperture 104. If the illumination system has more than one light output aperture, the area $A_O$ is the total area of all the light output apertures.

Light may be emitted from emitting layer 108 of LED 106 through one or more of the surfaces of emitting layer 108 that do not contact reflecting layer 110. For example, light may be emitted through surface 112. Three illustrative examples of light rays emitted through surface 112 are shown in FIG. 4D.

In FIG. 4D, a first light ray 114 emitted from the surface 112 of emitting layer 108 of the LED 106 on the fourth side passes through the interior of the light-recycling envelope to exit through the light output aperture 104 on the first side without reflecting off the reflecting sides of the light-recycling envelope.

A second light ray 116 emitted from the surface 112 of the emitting layer 108 of the LED 106 passes through the interior of the light-recycling envelope and is reflected by the light-recycling envelope 102 on the third side. The reflected ray 116 then passes through the interior of the light-recycling envelope to exit through the light output aperture 104 on the first side. This is merely an illustrative example since the second ray 116 can reflect a finite number of times from the reflective surfaces of any and all of the sides before exiting the light-recycling envelope through the light output aperture.

A third light ray 118 emitted from the surface 112 of the emitting layer 108 of the LED 106 during a first time period passes through the interior of the light-recycling envelope 102 and is reflected by the light-recycling envelope on the second side. The reflected third light ray passes through the interior of the light-recycling envelope and is recycled back to the light source. The reflected third light ray 118 is transmitted through surface 112 and the emitting layer 108 of the LED 106 to reflect off the reflecting layer 110 of the LED 106. The third light ray 118 then is transmitted through the emitting layer 108 of LED 106 and through the surface 112 during a second time period, passes through the interior of the light-recycling envelope and finally exits the light output aperture 104.

Light rays 114 and 116 are not recycled back to the light source. Light ray 118 is recycled back to the light source. Only part of the light emitted by the light source is recycled back to the light source.

When the third light ray 118 reflects off reflecting layer 110 of LED 106 and is transmitted through emitting layer 108 and surface 112 to enter the light-recycling envelope during the second time period, the reflected light ray 118 adds to the light rays concurrently being emitted by emitting layer 108 of LED 106 during the second time period. The reflected light ray increases the effective source radiance and the effective source luminance of LED 106 so that the effective source radiance and the effective source luminance are then higher than the respective maximum intrinsic source radiance and the maximum intrinsic source luminance of LED 106 measured in the absence of light recycling.

The brightness (either measured in radiance units or luminance units) of the light exiting the light output aperture cannot be greater than the effective brightness of the light source. However, by recycling a part of the light emitted by the light source back to the light source, the effective radiance (or luminance) of the light source can be increased so that the radiance (or luminance) of the light exiting the light output aperture can then be greater than the maximum intrinsic source radiance (or luminance) of the light source measured in the absence of light recycling. Note that when the brightness of the light exiting the light output aperture of illumination system 100 is compared to the maximum intrinsic brightness of a reference illumination system, the LED 106 of the illumination system 100 and the LED of the reference illumination system are of the same design and are operated at the same electrical power.

The third light ray 118 will be unaffected transmitting through the emitting layer 108 of LED 106 whether the emitting layer 108 is emitting light or not. The third light ray 118 could, alternatively, reflect off the light-recycling envelope on the first or third side before reflecting off the reflecting layer 110 of the LED on the fourth side.

This is merely an illustrative example since the third light ray 118 can reflect a finite number of times from the reflective surfaces of any and all the sides before or after reflecting off the reflecting layer 110 of the LED, once or any finite number of times, before the third light ray exits the light-recycling envelope through the light output aperture 104.

The maximum reflectivity of the inside surfaces of illumination system 100 and the resulting maximum radiance and luminance exiting from the light output aperture 104 is achieved by preferably having the entire interior surfaces of illumination system 100 be reflective except for the total area $A_O$ of all the apertures in the light-recycling envelope. Illumination system 100 has one light output aperture 104 having area $A_O$. The total inside area of the light-recycling envelope is $A_T$, which includes the area $A_O$ and the total light-emitting area of the light source. The LED light source has a reflecting layer 110 having reflectivity $R_S$. The total light-emitting area of the light source is area $A_S$. In the example of FIGS. 4A-4D, area $A_S$ is the total light-emitting area of LED 106, but for other examples having more than one LED, $A_S$ is the total light-emitting area of all the LEDs within the light-recycling envelope. The remaining inside area of the light-recycling envelope that is not covered by the total light-emitting area $A_S$ of the LED and the area $A_O$ of the output aperture or apertures is denoted as remaining area $A_R$. Preferably the entire remaining area $A_R$ of the light-recycling envelope should have a reflective surface of reflectivity $R_E$ to maximize the radiance and luminance exiting from the light output aperture or apertures. As noted previously, the reflectivity $R_E$ is preferably at least 50%. More preferably, the reflectivity $R_E$ is at least 70%. Most preferably, the reflectivity $R_E$ is at least 90%.

Since the area $A_S$ and the area $A_R$ are not perfect reflectors and do absorb some of the light during each reflection, the maximum illumination system output efficiency and the maximum output radiance and luminance are achieved by minimizing the number of light reflections. For a given fixed total light-emitting area $A_S$ and a given fixed total area $A_O$ of the light output aperture or apertures, the maximum radiance and luminance emitted from the light output aperture or apertures is achieved by minimizing the remaining area $A_R$ in order to minimize the number of reflections. Usually it is not possible for the remaining area $A_R$ to be zero, however, since it is usually not possible to arrange the one or more LEDs in the illumination system to cover the entire area of the light-recycling envelope that is not occupied by the light output aperture.

The illumination system 100 can achieve an output radiance or output luminance that is greater than the respective maximum intrinsic source radiance or maximum intrinsic source luminance of the light source only if the total light output aperture area $A_O$ of the light output aperture 104 is less than the total light-emitting area $A_S$ of the light source. This area requirement for brightness enhancement can be understood from the following theoretical examples. First assume that the inside surfaces of a theoretical illumination system have no absorption losses, i.e. areas $A_S$ and $A_R$, all have 100% reflectivity. In this case $R_S$ and $R_E$ are each equal to 100% and no light will be lost or absorbed inside the illumination system. Also assume that the light source emits light in a Lambertian distribution. Note that a Lambertian emitter is an emitter that has a constant radiance or luminance for all emitting angles from −90 degrees to +90 degrees.

If the light output aperture area $A_O$ is equal to the total light-emitting area $A_S$, then all the light emitted by the source will exit the theoretical illumination system in the same area and will have, in many cases, the same Lambertian distribution. The brightness of the light exiting the light output aperture will be equal to the intrinsic source brightness.

If the light output aperture area $A_O$ of the theoretical illumination system is larger than the total light-emitting area $A_S$, the light exiting the light output aperture can have the same Lambertian distribution but will have a brightness that is less than the intrinsic source brightness due to the output light being spread over a larger area. The output brightness exiting the light output aperture will be lower by a factor of $A_S/A_O$.

If the light output aperture area $A_O$ of the theoretical illumination system is smaller than the total light-emitting area $A_S$ and no light is lost or absorbed inside the illumination system, the light exiting the light output area can have the same Lambertian distribution but will have a brightness greater than the intrinsic source brightness due to the reduced area of the light output aperture. The output brightness exiting the light output aperture will be greater by a factor of $A_S/A_O$. To achieve an output brightness exiting the light output aperture that is greater than the maximum intrinsic source brightness, it is therefore a requirement that the light output aperture area $A_O$ be less than the total light-emitting area $A_S$.

However, the area requirement that $A_O$ must be less than $A_S$ is not the only requirement needed in order to achieve brightness enhancement in an illumination system. In a typical illumination system, the reflectivity $R_S$ and the reflectivity $R_E$ will be less than 100%, which will lower the brightness enhancement. Light that does not exit the light output aperture 104 on the first attempt may be absorbed by the light source or the light-recycling envelope as it is reflected one or more times inside the light-recycling envelope. These losses will reduce the output brightness. Therefore, in order to achieve brightness enhancement in a typical illumination system, $R_S$ and $R_E$ must be relatively high even if they are not 100%. The preferred values for $R_S$ and $R_E$ were listed previously.

Furthermore, in a typical illumination system, the light source may not emit light in a wide Lambertian (−90 degrees to +90 degrees) angular distribution but in a narrower angular distribution. When a light source initially emits light in a narrow angular distribution and when the emitted light then undergoes multiple reflections inside the illumination system, the light exiting the light output aperture will have a wider angular distribution than the initial angular distribution. The output distribution will be approximately a Lambertian distribution. Expanding the original narrow angular distribution to a wider output distribution inside the illumination system also reduces the brightness of the light exiting the light output aperture. Therefore, in order to achieve brightness enhancement in a typical illumination system, the angular distribution of the light emitted by the light source should be as close to a Lambertian distribution as possible.

The maximum theoretical radiance enhancement or maximum theoretical luminance enhancement is given by the ratio of the areas $A_S/A_O$ as shown above. For example, if $A_S$ equals 20 mm$^2$ and $A_O$ equals 1 mm$^2$, then the maximum theoretical radiance enhancement or maximum theoretical luminance enhancement is $A_S/A_O$ or 20. The maximum value is achieved only if the LED is a Lambertian emitter and only if $R_S$ and $R_E$ each equal 100%. If the LED is not a perfect Lambertian emitter or if $R_S$ and $R_E$ are each less than 100%, as is normally the case, brightness enhancement can still be achieved but the enhancement will be less than the maximum theoretical value. In such cases, the area $A_O$ may need to be significantly less than $A_S$ in order to achieve an output brightness that is greater than the maximum intrinsic source brightness. Preferably, the area $A_O$ of the light output aperture 104 is less than or equal to 50% of the total light-emitting area $A_S$ of the light source. More preferably, the area $A_O$ of the light output aperture 104 is less than or equal to 30% of the total light-emitting area $A_S$ of the light source. Most preferably, the area $A_O$ of the light output aperture 104 is less than or equal to 10% of the total light-emitting area $A_S$ of the light source. In addition, for some applications it is desirable that the area $A_O$ of the light output aperture 104 be small and comparable in size to the area of an arc lamp source. For those applications, preferably the area $A_O$ of the light output aperture 104 is less than 25 mm$^2$ in area. More preferably, the area $A_O$ of the light output aperture 104 is less than 10 mm$^2$.

The above example is an illustrative illumination system that does not include a wavelength conversion layer. However, the requirements for the light-recycling envelope needed to enhance the brightness of the light source in illumination system 100 are similar if not identical to the requirements for the light-recycling envelope needed for illumination systems that do incorporate a wavelength conversion layer.

The embodiments of this invention all utilize a wavelength conversion layer located inside the light-recycling envelope. The wavelength conversion layer converts a portion of the light of a first wavelength range emitted by the light source into light of a second wavelength range, different from the light of a first wavelength range. There are effectively two light emitters in the embodiments of this invention. There is a primary light source, one or more LEDs or semiconductor lasers, which emits light of a first wavelength range. There is also a secondary light source, the wavelength conversion layer, which emits light of a second wavelength range. However, the brightness of the light of a second wavelength range emitted by the wavelength conversion layer depends on the light of a first wavelength range emitted by the primary light source and therefore the wavelength conversion layer is not an independent light emitter.

Determining if an illumination system utilizing a wavelength conversion layer and light recycling has enhanced output brightness when compared to an illumination system that does not recycle light is not as simple as in the example of illumination system 100, which has no wavelength conversion layer. As stated previously, recycled light refers to light that is emitted by the light source or the wavelength conversion layer and is subsequently reflected back to either the light source or the wavelength conversion layer.

First, one must decide whether to measure brightness in radiance units or luminance units. This can become complex when the illumination system incorporates light of multiple wavelengths, as in the embodiments of this invention where light of a first wavelength range and light of a second wavelength range are both emitted by the illumination system. Luminance is a brightness measurement that is related to the human eye response. Radiance is a brightness measurement that does not depend on the response of the human eye. For example, a 450-nanometer light source and a 580-nm light source that have equal brightness when measured in radiance units have unequal brightness when measured in luminance units. In this example, the 580-nanometer light source has higher luminance than the 450-nanometer light source due to the greater sensitivity of the human eye to 580-nanometer light than to 450-nanometer light.

Second, one must choose a reference illumination system such that the reference illumination system is similar to the light-recycling illumination system under test with the exception that the reference illumination system does not recycle light. More than one reference illumination system can be chosen for the comparison.

The embodiments of this invention differ depending on the method chosen for comparing an illumination system that recycles light to a similar reference illumination system that does not recycle light.

In the first embodiment of this invention, the reference illumination system is the light source, which is at least one LED, and does not include any light reflected or emitted by the light-recycling envelope or the wavelength conversion layer. The brightness of the light source is designated as the maximum intrinsic source radiance or the maximum intrinsic source luminance. The word "maximum" is included because the radiance or luminance of the light source may vary with angle if the light source is not a perfect Lambertian emitter. If the radiance or luminance of the light source varies with angle, the maximum value of the radiance or luminance is chosen as the reference value.

The output radiance of light exiting the improved illumination system of the first embodiment is denoted as the combined exiting radiance, and includes both light of a first wavelength range and light of a second wavelength range. The output luminance of light exiting the improved illumination system is denoted as the combined exiting luminance, and includes both light of a first wavelength range and light of a second wavelength range. Although the output brightness of the light-recycling illumination system can be compared to the reference illumination system either in radiance units or luminance units, preferably the brightness is compared in radiance units to eliminate the effects of the human eye response.

To determine if brightness enhancement can take place for the first embodiment, one must also compare the total light output aperture area $A_O$ of the light-recycling illumination system under test to a reference area of the reference illumination system. The reference area for the first embodiment is the total light-emitting area of the light source, denoted as area $A_S$. Examples of the first embodiment of this invention are illustrated in FIGS. 5-10 and FIG. 23.

In the second embodiment of this invention, the reference illumination system is both the light source, which is an LED, and the wavelength conversion layer operating in combination. The reference illumination system does not include the light-recycling envelope or any light reflected by the light-recycling envelope. The brightness of the reference illumination system is designated as the maximum combined intrinsic radiance or the maximum combined intrinsic luminance of the light source and the wavelength conversion layer operating in combination. The word "maximum" is included because the radiance or luminance of the light source and wavelength conversion layer operating in combination may vary with angle if the light emission is not a perfectly Lambertian. If the radiance or luminance varies with angle, the maximum value of the radiance or luminance is chosen as the reference value.

The output radiance of light exiting the improved illumination system of the second embodiment is denoted as the combined exiting radiance, and includes both light of a first wavelength range and light of a second wavelength range. The output luminance of light exiting the improved illumination system is denoted as the combined exiting luminance, and includes both light of a first wavelength range and light of a second wavelength range. Since the reference illumination system includes both light of a first wavelength range and light of a second wavelength range, the output brightness of the light-recycling illumination system can be compared to the reference illumination system either in radiance units or luminance units.

To determine if brightness enhancement can take place for the second embodiment, one must also compare the total light output aperture area $A_O$ of the light-recycling illumination system under test to a reference area of the reference illumination system. Ideally the reference area should be the total emitting area for the combination of the light source and the wavelength conversion layer. However, the emitting area for the combination of the light source and the wavelength conversion area may be hard to determine in some cases since the wavelength conversion layer can have a multitude of shapes and can have complicated surface features. For example, the wavelength conversion layer can be a coating on the light-recycling envelope, can be a coating on the light source, can be a coating on both the light-recycling envelope and the light source or the wavelength conversion layer can partially fill or completely fill the light-recycling envelope. In order to eliminate the difficulty in determining the emitting area for the combination of the light source and the wavelength conversion area, the reference area in the second embodiment is chosen instead to be the maximum cross-sectional area of the light-recycling envelope, denoted as area $A_E$. The maximum cross-sectional area $A_E$ of the light-recycling envelope is an easier quantity to determine and is usually approximately equivalent to the combined emitting area of the light source and the wavelength conversion area. Examples of the second embodiment are illustrated in FIGS. 11-19.

In the third embodiment of this invention, the reference illumination system is both the light source, which is a semiconductor laser, and the wavelength conversion layer operating in combination. The reference illumination system does not include the light-recycling envelope or any light reflected by the light-recycling envelope. The reference brightness includes only light of a second wavelength range and does not include light of a first wavelength range. The brightness of the reference illumination system is designated as the maximum combined intrinsic radiance of light of a second wavelength range or the maximum combined intrinsic luminance of light of a second wavelength range that is emitted when the light source and the wavelength conversion layer operate in combination. The word "maximum" is included because the radiance or luminance of the light source and the wavelength conversion layer operating in combination may vary with angle if the combination is not a perfect Lambertian emitter. If the radiance or luminance varies with angle, the maximum value of the radiance or luminance is chosen as the reference value. The light of a first wavelength range emitted by the semiconductor laser was not included in the reference. Semiconductor lasers generally emit light of a first wavelength range in a narrow angular distribution and have high brightness. It is usually not necessary to increase the brightness of the semiconductor laser using a light-recycling envelope. In addition, the output area of semiconductor laser is small and, in many instances, will be less than the area $A_O$ of the light output aperture of the illumination system. The importance of the light-recycling envelope in the third embodiment of this invention is to increase the brightness of the light of a second wavelength range emitted by the wavelength conversion layer.

In the third embodiment of this invention, the brightness of the light of a second wavelength range exiting an improved light-recycling illumination system and the brightness of the light of a second wavelength range exiting a reference illumination system that does not utilize light recycling can be compared either in radiance units or luminance units. The output radiance of light exiting the improved illumination system of the third embodiment is denoted as the exiting radiance of light of a second wavelength range, and does not include light of a first wavelength range. The output luminance of light exiting the improved illumination system is denoted as the exiting luminance of light of a second wavelength range, and does not include light of a first wavelength range.

In order to determine if brightness enhancement can occur for the third embodiment, one must compare the total light output aperture area $A_O$ of the light-recycling illumination system under test to a reference area of the reference illumination system. As for the second embodiment, the reference area for the third embodiment is chosen to be the maximum cross-sectional area of the light-recycling envelope, denoted as area $A_E$. Examples of the third embodiment are illustrated in FIGS. 20-22.

Example embodiments of this invention that are related to the first embodiment will now be described in detail using the illustrations in FIGS. 5-10 and FIG. 23.

One embodiment of the present invention is illumination system 200 shown in FIGS. 5A-5G. Illumination system 200 is similar to illumination system 100 in FIGS. 4A-4D except that illumination system 200 contains a wavelength conversion layer 214. Illumination system 200 is comprised of a light source, which is LED 206, a wavelength conversion layer 214, a light-recycling envelope 202 and a light output aperture 204.

Figure 5A:
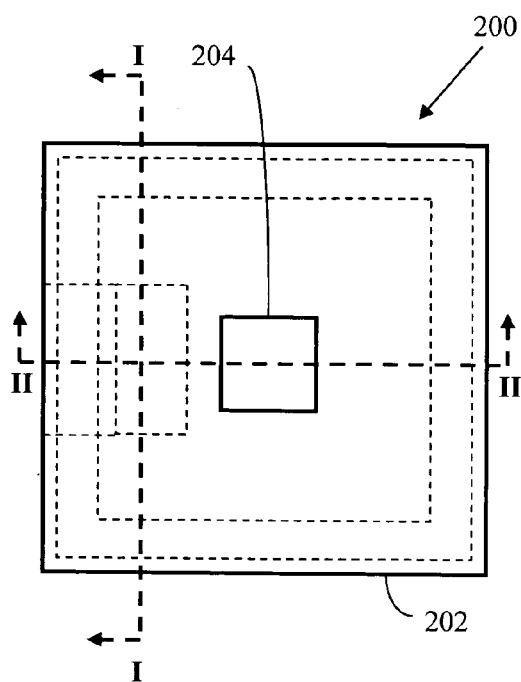
FIG. 5A is a top external view of one embodiment of this invention that has one light-emitting diode and a wavelength conversion layer.
Figure 5B:
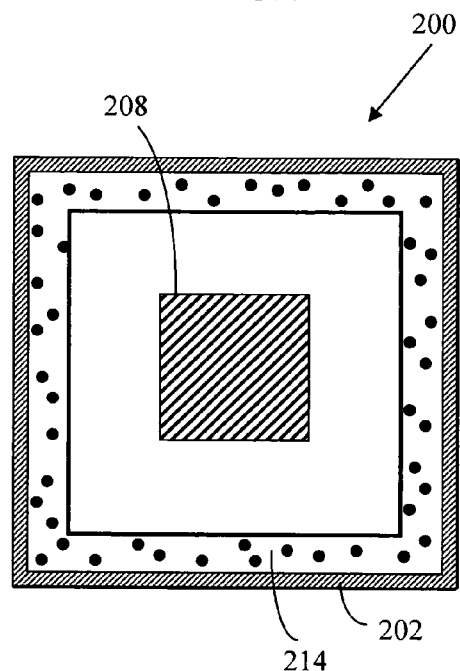
FIG. 5B is a cross-sectional side view in the I-I plane of the illumination system shown in FIG. 5A.
Figure 5C:
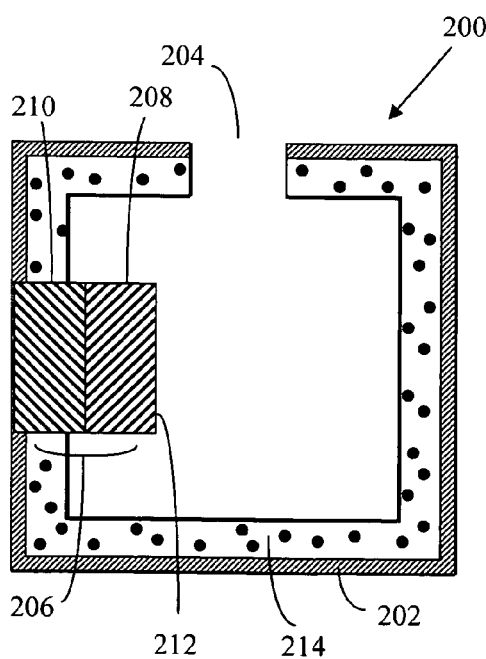
FIG. 5C is a cross-sectional side view in the II-II plane of the illumination system shown in FIG. 5A.

A top external view of illumination system 200 is illustrated in FIG. 5A, showing the outer edge of the light-recycling envelope 202 and the light output aperture 204 as solid lines. FIG. 5B is a cross-sectional view along the I-I plane indicated in FIG. 5A. FIG. 5C is a cross-sectional view along the II-II plane indicated in FIG. 5A. The II-II plane passes through the light output aperture 204 and LED 206. FIGS. 5D-5G show the paths of some representative light rays emitted from LED 206.

For illumination system 200, the cubical three-dimensional shape of the surface of the light-recycling envelope 202, the square cross-sectional shape of the light-recycling envelope 202 and the square shape of the light output aperture 204 are illustrative examples used for ease of understanding of the invention. It should also be noted that the drawing is merely a representation of the structure; the actual and relative dimensions may be different.

As noted previously, the light-recycling envelope 202 may be any three-dimensional surface that encloses an interior volume. Similarly, the cross-section of the light-recycling envelope 202 shown in FIG. 5C may have any shape, either regular or irregular, depending on the shape of the three-dimensional surface of the light-recycling envelope 202.

The square cross-sectional shape of illumination system 200 shown in FIG. 5C has a first side containing the light output aperture 204, a second side, a third side and a fourth side. The first side is opposite and parallel to the third side. The second side is opposite and parallel to the fourth side. The first side and third side are perpendicular to the second side and fourth side. The four sides of the illumination system shown in cross-section in FIG. 5C plus the two remaining sides of the six-sided cube (not shown in the cross-sectional view) form the interior of the light-recycling envelope.

The inside surfaces of the light-recycling envelope 202, except for the area occupied by the LED 206 and the area occupied by the light output aperture 204, are light reflecting surfaces. The light-recycling envelope reflects both light of a first wavelength range and light of a second wavelength range. In order to achieve high light reflectivity, the light-recycling envelope 202 may be fabricated from a bulk material that is intrinsically reflective or the inside surfaces of the light-recycling envelope 202 may be covered with a reflective coating. The bulk material or the reflective coating may be a specular reflector, a diffuse reflector or a diffuse reflector that is backed with a specular reflecting layer. Examples of reflective materials and coatings were described previously. Preferably the reflectivity $R_E$ of the inside surfaces of the light-recycling envelope 202 that are not occupied by the LED 206 and the light output aperture 204 is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the output efficiency of the illumination system.

As illustrated in FIGS. 5A-5G, the wavelength conversion layer 214 is formed as a coating on the inner surfaces of the sides of the light-recycling envelope 202. The wavelength conversion layer in FIGS. 5A-5G is shown for illustrative purposes to cover the entire surface of the light-recycling envelope except for the LED 206 and the light output aperture 204. However, it is not necessary that the wavelength conversion layer cover the entire surface of the light-recycling envelope. It is also within the scope of this invention that the wavelength conversion layer may cover only a part of the light-recycling envelope.

The wavelength conversion layer 214 converts a portion of the light of a first wavelength range emitted by the light source into light of a second wavelength range, different from the light of a first wavelength range. The light of the second wavelength range has longer wavelengths and lower energies than the light of the first wavelength range, resulting in an energy loss for wavelength conversion.

The total energy efficiency $\eta_T$ of wavelength conversion of light of a first wavelength range into light of a second wavelength range is given by the equation $$\eta_T = \eta_{QE} \eta_S,$$  [Equation 6]

where $\eta_{QE}$ is the quantum efficiency for converting a photon of light of a first wavelength range into a photon of light of a second wavelength range and where $\eta_S$ is the relative energy loss due to the Stokes shift. The Stokes shift is a shift to longer wavelengths and lower energies that occurs when light of a first wavelength range is converted into light of a second wavelength range. Preferably for efficient wavelength conversion, $\eta_{QE}$ should be greater than 0.80, and more preferably, $\eta_{QE}$ should be greater than 0.90. The quantity $\eta_S$ depends on the magnitude of the wavelength shift. For example, if the light of a first wavelength range has a wavelength of 450 nanometers and the light of a second wavelength range has a wavelength of 580 nanometers, then $\eta_S$ is 0.78 since a 580-nanometer photon has 78% of the energy of a 450-nanometer photon. A small wavelength shift results in a small energy loss due to the Stokes shift, whereas a large wavelength shift results in a large energy loss.

The wavelength conversion layer 214 is comprised of a powdered phosphor material, a quantum dot material, a luminescent dopant material or a plurality of such materials. In addition, the wavelength conversion layer may further comprise a transparent host material into which the phosphor material, the quantum dot material or the luminescent dopant material is dispersed. Examples of powdered phosphor materials, quantum dot materials, luminescent dopant materials and transparent host materials were listed previously. For illustrative purposes, the wavelength conversion layer 214 in FIGS. 5A-5G is shown to be comprised of particles dispersed in a transparent coating layer.

Depending on the materials that comprise the wavelength conversion layer, the wavelength conversion layer may also partially reflect the light of a first wavelength range and the light of a second wavelength range incident upon the wavelength conversion layer. In such cases, light may reflect from the sides of the illumination system by reflecting from either the light-recycling envelope 202 or the wavelength conversion layer 214. The wavelength conversion layer is chosen not to interfere with the light-reflecting properties of the light-recycling envelope and the light-recycling envelope is chosen not to interfere with the wavelength conversion properties of the wavelength conversion layer.

The light source for illumination system 200 is LED 206, which is located on the fourth side of the light-recycling envelope. LED 206 may be an inorganic light-emitting diode or an OLED. Preferably, LED 206 is an inorganic light-emitting diode. Examples of inorganic light-emitting diodes have been listed previously.

LED 206 has an emitting layer 208 and a reflecting layer 210. The total light-emitting area of the light source is area $A_S$, which in this example is the light-emitting area of emitting layer 208. The emitting layer 208 emits light of a first wavelength range. Light may be emitted from emitting layer 208 through one or more surfaces of emitting layer 208 that are not in contact with reflecting layer 210. For example, light may be emitted through surface 212.

The light of a first wavelength range emitted by the emitting layer 208 is preferably greater than 200 nanometers in wavelength and less than 3000 nanometers in wavelength. More preferably, the light of a first wavelength range is greater than 200 nanometers in wavelength and less than 450 nanometers in wavelength.

The light of a first wavelength range emitted by LED 206 has a maximum intrinsic source radiance and a maximum intrinsic source luminance that depend on the LED design and the driving electrical power applied to the LED. The maximum intrinsic source radiance and the maximum intrinsic source luminance are measured for the light source alone with no light-recycling envelope and no wavelength conversion layer present.

The reflecting layer 210 is adjacent to and interior to the fourth side while the emitting layer extends into the interior of the light-recycling envelope. The reflecting layer 210 reflects both light of a first wavelength range and light of a second wavelength range. The reflecting layer 210 may be a specular reflector or a diffuse reflector. In a typical inorganic light-emitting diode, the reflecting layer is usually a specular reflector. The light reflectivity of reflecting layer 210 of LED 206 is $R_S$. If the reflectivity varies across the area of the reflecting layer, the reflectivity $R_S$ is defined as the average reflectivity of the reflecting layer. The reflectivity $R_S$ of reflecting layer 210 is preferably at least 50%. More preferably, the reflectivity $R_S$ is at least 70%. Most preferably, the reflectivity $R_S$ is at least 90%. Ideally, the reflectivity $R_S$ should be as close to 100% as possible in order to maximize the efficiency and the light output brightness of the illumination system.

In order to explain the operation of illumination system 200, example light rays emitted from LED 206 are illustrated in FIGS. 5D, 5E, 5F and 5G.

Figure 5D:
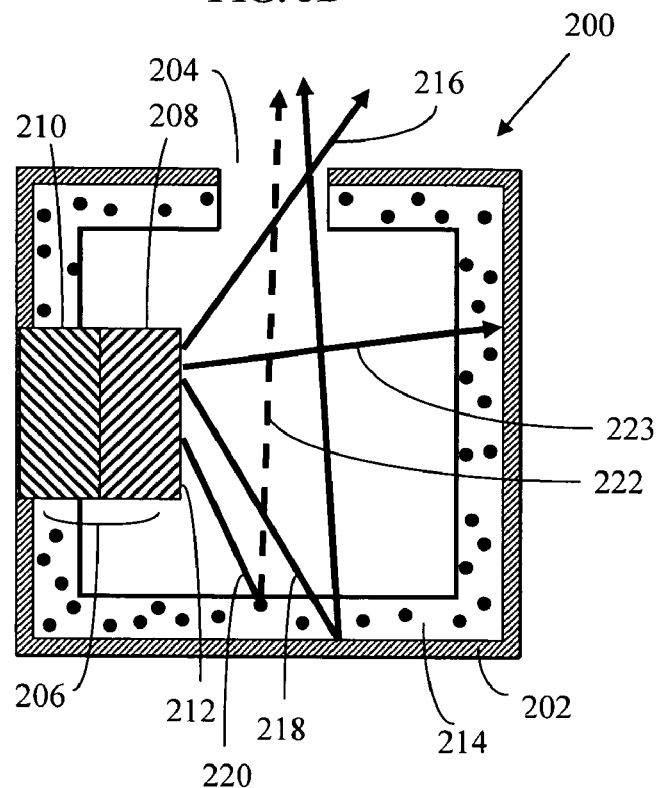
FIGS. 5D, 5E, 5F and 5G are cross-sectional side views in the II-II plane of the illumination system shown in FIGS. 5A and 5C and illustrate representative light rays.

In FIG. 5D, a first light ray 216 of a first wavelength range is emitted from surface 212 of emitting layer 208 on the fourth side of the light-recycling envelope 202 and passes through the interior of the light-recycling envelope to exit the light output aperture 204 on the first side of the light-recycling envelope without reflecting off the light-recycling envelope or interacting with the wavelength conversion layer 214.

A second light ray 218 of a first wavelength range is emitted from surface 212 of emitting layer 208 and passes through the interior of the light-recycling envelope 202 to the surface of the wavelength conversion layer 214 on the third side of the light-recycling envelope. Light ray 218 passes through the wavelength conversion layer 214, reflects off the light-recycling envelope 202 and passes through the wavelength conversion layer 214 a second time. In both passes through the wavelength conversion layer 214, the light ray 218 is not converted to light of a second wavelength range. Finally, light ray 218 passes through the interior of the light-recycling envelope to exit through the light output aperture 204 on the first side of the light-recycling envelope as light of a first wavelength range.

A third light ray 220 of a first wavelength range is emitted from surface 212 of emitting layer 208 and passes through the interior of the light-recycling envelope to the surface of the wavelength conversion layer 214 on the third side of the light-recycling envelope. Light ray 220 is converted by the wavelength conversion layer 214 to light ray 222 of a second wavelength range, different than the light of a first wavelength range. The emission of light ray 222 can occur in any direction from the wavelength conversion layer. In this example, light ray 222 passes through the interior of the light-recycling envelope to exit through the light output aperture 204. As an alternative option that is not illustrated, if light ray 222 is emitted towards the light-recycling envelope 202 on the third side of the light-recycling envelope, light ray 222 will be reflected by the light-recycling envelope 202, pass through the wavelength conversion layer 214 and through the interior of the light-recycling envelope to exit through the light output aperture 204. Light of a second wavelength range emitted by the wavelength conversion layer will not be converted again during one or more additional passes through the wavelength conversion layer.

Each time a light ray of a first wavelength range passes through the wavelength conversion layer, the wavelength conversion layer converts a portion of the light of a first wavelength range into light of a second wavelength range, different from the light of a first wavelength range. Each time a light ray of a second wavelength range passes through the wavelength conversion layer, the light of a second wavelength range will be unaffected. The light of a second wavelength range will not alter its wavelength nor will additional wavelengths be formed.

The probability that a light ray of the first wavelength range will be converted to a light ray of a second wavelength range upon passage through the wavelength conversion layer depends on the type of material in the wavelength conversion layer, depends on the density of the powdered phosphor material, the quantum dot material or the luminescent dopant material within the layer and depends on the thickness of the wavelength conversion layer. The probability of wavelength conversion can be increased either by increasing the density of the powdered phosphor material, the quantum dot material or the luminescent dopant material within the wavelength conversion layer or by increasing the thickness of the layer. However, for some materials such as the quantum dot materials, increasing the density of the material lowers the conversion efficiency of the material due to particle-particle interactions. In such cases, a low quantum dot material density may be desired. Then, in order to achieve a high overall conversion efficiency for the illumination system, either a thicker wavelength conversion layer must be used or increased light recycling is needed so that light of a first wavelength range can pass through the wavelength conversion layer many times.

In FIG. 5D, light ray 218 of a first wavelength range is not converted to light of a second wavelength range. Light ray 220 of a first wavelength range is converted to light ray 222 of a second wavelength range. Overall, the wavelength conversion layer converts a portion of the light of a first wavelength range into light of a second wavelength range, different than the light of a first wavelength range.

In FIG. 5D, a fourth light ray 223 of a first wavelength range is emitted from surface 212 of emitting layer 208 on the fourth side of the light-recycling envelope. Light ray 223 passes through the interior of the light-recycling envelope to the wavelength conversion layer 214 on the second side. Light ray passes through the wavelength conversion layer and is absorbed by the light-recycling envelope. In general, the light-recycling envelope and the reflecting layer 210 are not perfect reflectors and each has a reflectivity less than 100%. Some of the light of a first wavelength range, such as light ray 223, and some of the light of a second wavelength range will be absorbed. Due to the absorption losses, only a fraction of the light of a first wavelength range that is inside the light-recycling envelope will exit the light-recycling envelope through the light output aperture 204. Likewise, only a fraction of the light of a second wavelength range that is inside the light-recycling envelope will exit the light-recycling envelope through the light output aperture 204.

Figure 5E:
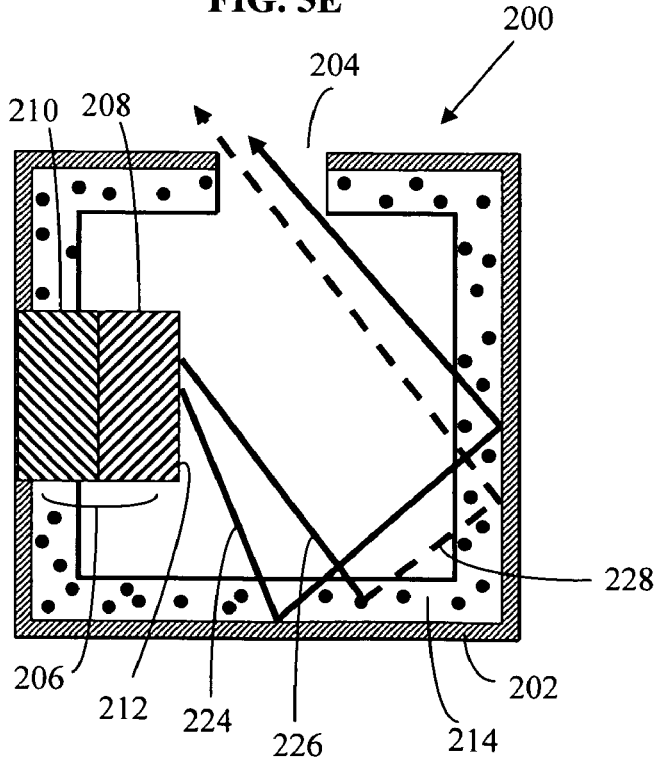

In FIG. 5E, a fifth light ray 224 of a first wavelength range is emitted from surface 212 of emitting layer 208 on the fourth side of the light-recycling envelope and passes through the interior of the light-recycling envelope to wavelength conversion layer 214 on the third side of the light-recycling envelope. Light ray 224 passes through wavelength conversion layer 214 without converting, reflects off light-recycling envelope 202, passes through wavelength conversion layer 214 a second time without converting and passes through the interior of the light-recycling envelope to wavelength conversion layer 214 on the second side of the light-recycling envelope. Light ray 224 then passes through wavelength conversion 214 a third time without converting, reflects off light-recycling envelope 202, passes through wavelength conversion layer 214 a fourth time without converting, passes through the interior of the light-recycling envelope and exits the light-recycling envelope through the light output aperture 204 on the fourth side of the light-recycling envelope.

A sixth light ray 226 of a first wavelength range is emitted from surface 212 of emitting layer 208 on the fourth side of the light-recycling envelope and passes through the interior of the light-recycling envelope to wavelength conversion layer 214 on the third side of the light-recycling envelope. Light ray 226 of a first wavelength range is converted to light ray 228 of a second wavelength range by the wavelength conversion layer. In general, light ray 228 may be emitted in any direction by the wavelength conversion layer. In this illustration, light ray 228 is emitted toward the interior of the light-recycling envelope, passes through the interior of the light-recycling envelope to wavelength conversion layer 214 on the second side of the light-recycling envelope. Light ray 228 passes through wavelength conversion layer 214, reflects off light-recycling envelope 202 on the second side of the light-recycling envelope and again passes through wavelength conversion layer 214. Since light ray 228 has already been converted, addition passes through wavelength conversion layer 214 will not result in further conversion. Light ray 228 then passes through the interior of the light-recycling envelope and exits through light output aperture 204 on the first side of the light-recycling envelope.

Light rays 224, 226 and 228 in FIG. 5E illustrate rays that reflect multiple times inside the light-recycling envelope. In general, light rays may reflect many times inside the light-reflecting envelope before either exiting the illumination system through light output aperture 204 or being absorbed by the light-recycling envelope, the LED or the wavelength conversion material. A multitude of light pathways is possible. Light of a first wavelength range may be converted to light of a second wavelength range on the first pass through the wavelength conversion layer, may be converted only after many passes through the wavelength conversion layer, or may exit the illumination system without being converted. Light that has already been converted to light of a second wavelength range will not be converted again. The light-recycling envelope directs a part of the light of a first wavelength through the wavelength conversion layer multiple times and increases the likelihood that the light of a first wavelength range will be converted to light of a second wavelength range.

The light exiting the light output aperture 204 in FIGS. 5D and 5E is a mixture of light of a first wavelength range and light of a second wavelength range. If both wavelength ranges are in the visible wavelength region of the optical spectrum, the mixture of light exiting the light output aperture will have a composite color. By changing the size of the light-recycling envelope, changing the thickness of the wavelength conversion layer, changing the characteristics of the light source or changing the size of the light output aperture, the ratio of the flux of light of a first wavelength range to the flux of light of a second wavelength range can be varied. By varying this ratio, the color of the light exiting the light output aperture can be varied.

If the composite color exiting the light output aperture 204 is white light, the quality of the white light can be changed by varying the ratio of light of a first wavelength range to light of a second wavelength range exiting from the light output aperture. The quality of the white light can be described by a color-rendering index. A color-rendering index of 100 indicates that the white light shining on a colored surface will reproduce the surface colors as seen by the human eye in an identical manner to light from the sun shining on the surface. A color-rendering index less than 100 indicates that the white light shining on a colored surface will give an apparent surface color that appears different to the human eye than the color seen by the human eye using sunlight. By changing the size of the light-recycling envelope, changing the thickness of the wavelength conversion layer, changing the characteristics of the light source or changing the size of the light output aperture, the ratio of the flux of light of a first wavelength range to the flux of light of a second wavelength range can be varied. By varying this ratio, the color-rendering index of the light exiting the light output aperture can be varied. The light-recycling envelope of this invention can recycle light of a first wavelength range back through the wavelength conversion layer one or more times to improve the overall efficiency of converting light of a first wavelength range into light of a second wavelength range. In addition, by utilizing such light recycling and by varying the physical dimensions and characteristics of the light-recycling envelope, the color-rendering index of the light exiting the light output aperture can be improved to achieve the maximum value allowed for the combination of the two wavelength ranges.

Figure 5F:
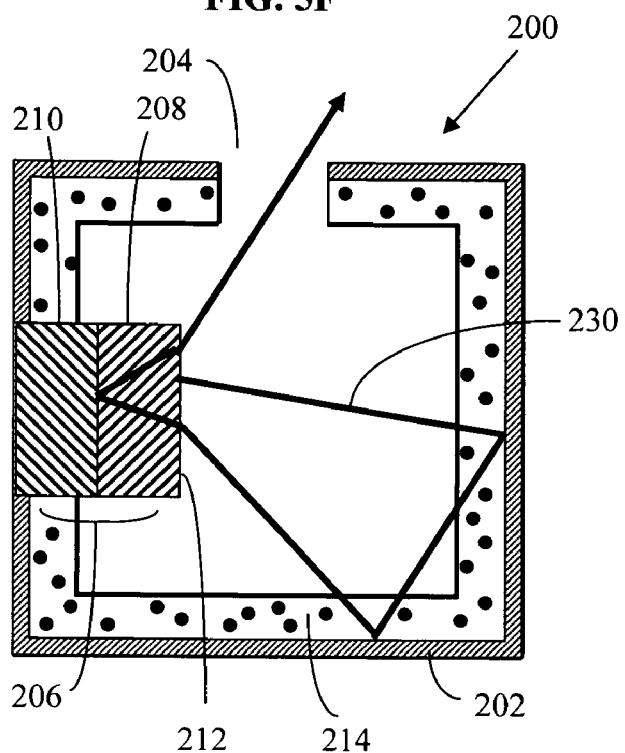
Figure 5G:
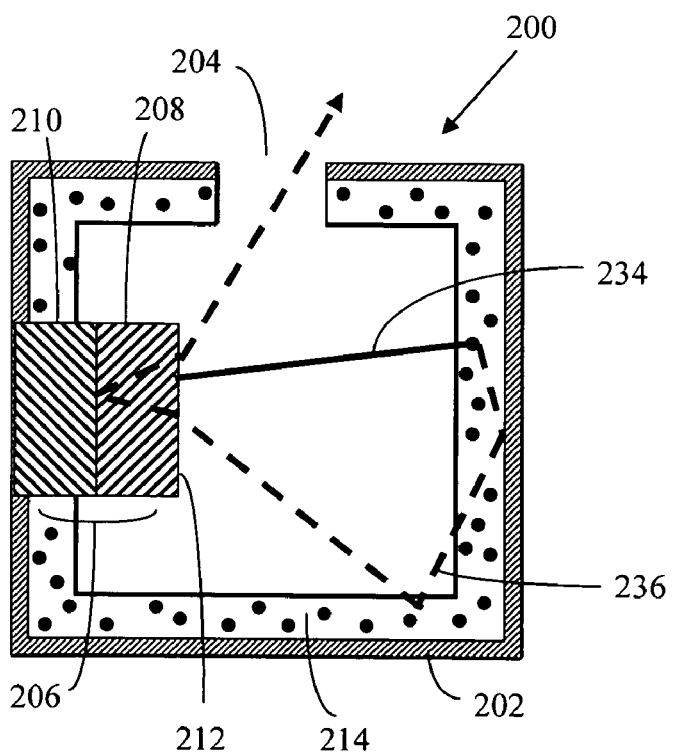

Light rays in FIGS. 5F and 5G illustrate light recycling that can increase the effective brightness of the light source and enhance the brightness of the light exiting the light output aperture 204.

A seventh light ray 230 of a first wavelength range is emitted from surface 212 of emitting layer 208 on the fourth side of illumination system 200 in a first time period. Light ray 230 passes through the interior of the light-recycling envelope 202 to wavelength conversion layer 214 on the second side. Light ray 230 passes through wavelength conversion layer 214 a first time, is reflected by the light-recycling envelope, passes through the wavelength conversion layer 214 a second time and then passes through the interior of the light-recycling envelope to the wavelength conversion layer 214 on the third side. Light ray 230 passes through the wavelength conversion layer 214 a third time, is reflected by the light-recycling envelope on the third side, passes through the wavelength conversion layer a fourth time and then passes through the interior of the light-recycling envelope to the surface 212. Light ray 230 is transmitted through surface 212 and through the emitting layer 208 a first time, is reflected by the reflecting layer 210 and is transmitted through the emitting layer 208 and the surface 212 a second time and during a second time period. When light ray 230 passes through emitting layer 208, light ray 230 does not effect the light emission of emitting layer 208. Light ray 230 then passes through the interior of the light-recycling envelope and exits the illumination system through the light output aperture 204 as light of a first wavelength range.

When the seventh light ray 230 reflects off reflecting layer 210 of LED 206 and is transmitted through emitting layer 208 and surface 212 to enter the light-recycling envelope during a second time period, the reflected light ray 230 adds to the light rays concurrently being emitted by emitting layer 208 of LED 206 during the second time period. The reflected light ray increases the effective source radiance and the effective source luminance of LED 206 so that the effective source radiance and effective source luminance are then higher than the respective maximum intrinsic source radiance and the maximum intrinsic source luminance of LED 206 measured in the absence of light recycling.

In FIG. 5G, an eighth light ray 234 of a first wavelength range is emitted from surface 212 of emitting layer 208 of LED 206 in a first time period. Light ray 234 passes through the interior of the light-recycling envelope 202 to the wavelength conversion layer 214 on the second side. Wavelength conversion layer 214 converts light ray 234 of a first wavelength range into light ray 236 of a second wavelength range, different than the light of a first wavelength range. Light ray 236 may be emitted in any direction from wavelength conversion layer 214. In this example, light ray 236 is emitted toward the light-recycling envelope on the second side, passes through the wavelength conversion layer a first time, is reflected by the light-recycling envelope on the second side, passes through the wavelength conversion layer a second time, passes through the interior of the light-recycling envelope to the wavelength conversion layer on the third side. The wavelength conversion layer 214 may be a partial reflector to light of a first wavelength range and to light of a second wavelength range. Light ray 236 may either be reflected by wavelength conversion layer 214 or pass through the wavelength conversion layer. In this example, light ray 236 is reflected by the wavelength conversion layer on the third side and passes through the interior of the light-recycling envelope to the surface 212. Light ray 236 is transmitted through surface 212 and emitting layer 208 a first time, is reflected by reflecting layer 210, is transmitted through emitting layer 208 and surface 212 a second time and during a second time period. When light ray 236 passes through emitting layer 208, light ray 236 does not effect the light emission of emitting layer 208. Light ray 236 then passes through the interior of the light-recycling envelope and exits the illumination system through the light output aperture 204 as light of a second wavelength range.

When the light ray 236 reflects off reflecting layer 210 of LED 206 and is transmitted through emitting layer 208 and surface 212 to enter the light-recycling envelope during a second time period, the reflected light ray 236 adds to the light rays concurrently being emitted by emitting layer 208 of LED 206 during the second time period. The reflected light ray increases the effective source radiance and the effective source luminance of LED 206 so that the effective source radiance and effective source luminance are then higher than the respective maximum intrinsic source radiance and the maximum intrinsic source luminance of LED 206 measured in the absence of light recycling.

Light rays 216, 218, 220, 222, 224, 226 and 228 are not recycled back to the light source. Light rays 230 and 236 are recycled back to the light source. Only part of the light of first wavelength range and part of the light of a second wavelength range are recycled back to the light source.

Illumination system 200 has one light output aperture 204. The total light output aperture area is area $A_O$. It is also within the scope of this invention that illumination system 200 can have more than one light output aperture. If there is more than one light output aperture, the total light output aperture area is also defined as area $A_O$.

The output radiance of light exiting the light output aperture 204 is denoted as the combined exiting radiance, and includes both light of a first wavelength range and light of a second wavelength range. The output luminance of light exiting the light output aperture 204 is denoted as the combined exiting luminance, and includes both light of a first wavelength range and light of a second wavelength range.

To determine if illumination system 200 has enhanced output brightness, one must compare the combined output radiance or the combined output luminance of illumination system 200 to the brightness of a reference illumination system. As stated above for the first embodiment of this invention, the reference brightness is the maximum intrinsic source radiance or maximum intrinsic source luminance of the light source, LED 206, measured alone with no wavelength conversion layer and no light-recycling envelope. The reference brightness can be determined by measuring a reference LED that is substantially identical to LED 206 operating at an electrical power that is substantially identical to the electrical power used to power LED 206.

For the comparative brightness measurements, one can measure either radiance or luminance. In order to remove the effects of the response of the human eye to different wavelengths of light, preferably the brightness measurement is done in radiance units.

As in illumination system 100, the brightness (measured in radiance units) of the light exiting the light output aperture 204 in illumination system 200 cannot be greater than the effective brightness of the light source. In illumination system 100, a part of the light of a first wavelength can be recycled back to the light source to increase the effective brightness of the light source. In illumination system 200, by comparison, both a part of the light of a first wavelength range emitted by LED 206 and a part of the light of a second wavelength range emitted by the wavelength conversion layer 214 can be recycled back to LED 206 to increase the effective radiance of LED 206. By increasing the effective radiance of LED 206 through light recycling, the combined exiting radiance of the light exiting the light output aperture 204 can also be increased to values greater than the maximum intrinsic source radiance of LED 206 in the absence of light recycling.

As in illumination system 100, the maximum reflectivity of the inside surfaces of illumination system 200 and the resulting combined exiting radiance emitted from the light output aperture 204 is achieved by preferably having substantially all of the interior surfaces of illumination system 200 be reflective except for the total area $A_O$ of all the apertures in the light-recycling envelope. Illumination system 200, illustrated in FIGS. 5A-5G, has just one light output aperture 204 having area $A_O$. The total inside area of the light-recycling envelope is $A_T$, which includes the area $A_O$ and the total light-emitting area of the light source. The LED light source has a reflecting layer having reflectivity $R_S$. The total light-emitting area of the light source is area $A_S$. In the example of FIGS. 5A-5G, area $A_S$ is the light-emitting area of LED 206, but for other examples having more than one LED, $A_S$ is the total light-emitting area of all the LEDs within the light-recycling envelope. The remaining inside area of the light-recycling envelope that is not covered by the total light-emitting area $A_S$ of the LEDs and the area $A_O$ of the output aperture or apertures is denoted as remaining area $A_R$. It is preferable that substantially all of remaining area $A_R$ should have a reflective surface of reflectivity $R_E$ to maximize the radiance exiting from the light output aperture or apertures. As noted previously, the reflectivity $R_E$ is preferably at least 50%. More preferably, the reflectivity $R_E$ is at least 70%. Most preferably, the reflectivity $R_E$ is at least 90%. Also noted previously, the wavelength conversion layer 214 that coats at least a part of the area $A_R$ of the light-recycling envelope may also reflect light. Light of a first wavelength range and light of a second wavelength range may be reflected by either the wavelength conversion layer or the light-recycling envelope. However, the reflectivity of the wavelength conversion layer is generally less than the reflectivity $R_E$ of the light-recycling envelope. As long as the wavelength conversion layer has little or no absorption, the total reflectivity of the light-recycling envelope coated with the wavelength conversion layer will be substantially the same as the reflectivity $R_E$ of the light-recycling envelope without a coating of the wavelength conversion material.

The illumination system 200 can achieve a combined exiting radiance that is greater than the maximum intrinsic source radiance only if the total light output aperture area $A_O$ of the light output aperture 204 is less than the total light-emitting area $A_S$ of the light source. This can be demonstrated in the same manner as for illumination system 100 by hypothesizing an ideal illumination system where $R_S$ and $R_E$ each equal 100% and no light is lost or absorbed inside the illumination system. One must also assume that the ideal light source emits light in a Lambertian distribution.

If the light output area $A_O$ is smaller than the total light-emitting area $A_S$ and no light is lost or absorbed inside the ideal illumination system, the light exiting the light output area will, in many cases, have the same Lambertian distribution but will have a brightness greater than the intrinsic source brightness due to the reduced area of the light output aperture. The output brightness exiting the light output aperture will be greater by a factor of $A_S/A_O$. In order to achieve an output brightness exiting the light output aperture 204 that is greater than the maximum intrinsic source brightness, it is therefore a requirement that the output area $A_O$ be less than the total light-emitting area $A_S$.

However, again as in illumination system 100, the area requirement that $A_O$ must be less than $A_S$ is not the only requirement needed in order to achieve brightness enhancement in illumination system 200. In a typical illumination system, the reflectivity $R_S$ and the reflectivity $R_E$ will be less than 100%, which will lower the brightness enhancement. Light that does not exit the light output aperture 204 on the first attempt may be absorbed by the light source or the light-recycling envelope or the wavelength conversion layer as it is reflected one or more times inside the light-recycling envelope. These losses will reduce the output brightness. Therefore, in order to achieve brightness enhancement in a typical illumination system, $R_S$ and $R_E$ must be relatively high even if they are not 100%. The preferred values for $R_S$ and $R_E$ were listed previously.

Furthermore, in a typical illumination system, the light source may sometimes not emit light in a wide Lambertian (−90 degrees to +90 degrees) angular distribution but in a narrower angular distribution. When a light source emits light in a narrower angular distribution and when the emitted light then undergoes multiple reflections inside the illumination system, the light exiting the light output aperture will have a wider angular distribution than the initial angular distribution. The output distribution will approach a Lambertian distribution. Expanding the initial narrow angular distribution to a wider output distribution inside the illumination system will also reduce the brightness of the light exiting the light output aperture. Therefore, in order to achieve brightness enhancement in a typical illumination system, the angular distribution of the light emitted by the light source preferably should be as close to a Lambertian distribution as possible.

The maximum theoretical radiance enhancement of illumination system 200 is given by the ratio of the areas $A_S/A_O$ as shown above. For example, if $A_S$ equals 20 mm² and $A_O$ equals 1 mm², then the maximum theoretical radiance enhancement is $A_S/A_O$ or 20. The maximum value is achieved only if the LED is a Lambertian emitter and only if $R_S$ and $R_E$ each equal 100%. If the LED is not a perfect Lambertian emitter or if $R_S$ and $R_E$ are each less than 100%, as is normally the case, radiance enhancement can still be achieved but the enhancement will be less than the maximum theoretical value. In such cases, the area $A_O$ may need to be significantly less than $A_S$ in order to achieve a combined exiting radiance that is greater than the maximum intrinsic source radiance. Accordingly, the area $A_O$ of the light output aperture 204 is preferably less than or equal to 50% of the total light-emitting area $A_S$ of the light source. More preferably, the area $A_O$ is less than or equal to 30% of the total light-emitting area $A_S$ of the light source. Most preferably, the area $A_O$ is less than or equal to 10% of the total light-emitting area $A_S$ of the light source. In addition, for some applications it is desirable that the area $A_O$ of the light output aperture 204 be small and comparable in size to the area of an arc lamp source. For those applications, preferably the area $A_O$ of the light output aperture 204 is less than 25 mm² in area. More preferably, the area $A_O$ of the light output aperture 204 is less than 10 mm².

Any output radiance enhancement from illumination system 200 is a result of light recycling and is independent of the wavelength sensitivity of the human eye. Using the same light-recycling techniques, it is also possible to get an output luminance enhancement from illumination system 200. However, there are special situations using the first embodiment such that luminance enhancement may sometimes occur in the absence of recycling if the human eye is less sensitive to the light of a first wavelength range emitted by the light source than to the light of a second wavelength range emitted by the wavelength conversion layer upon wavelength conversion. Such a situation may occur, for example, if the light of a first wavelength range is 430-nanometer light and light of a second wavelength range is 580-nanometer light. The human eye is more sensitive to 580-nanometer light than 430-nanometer light. In such a case, when the wavelength conversion layer converts light of a first wavelength range into light of a second wavelength range, the human eye may see a luminance enhancement even in cases where there is no light recycling. One must be careful to determine which of the two effects causes luminance enhancement for the first embodiment. The problem of trying to separate the differing luminance enhancement effects is alleviated in later examples by considering the second embodiment of this invention illustrated by FIGS. 11-19. In the second embodiment, the reference illumination system is changed from being just the light source by itself to being the light source and the wavelength conversion layer operating in combination. The reference illumination system then includes both wavelength ranges and any resulting luminance enhancement in the illumination system is due to improvements resulting from light recycling.

Figure 6:
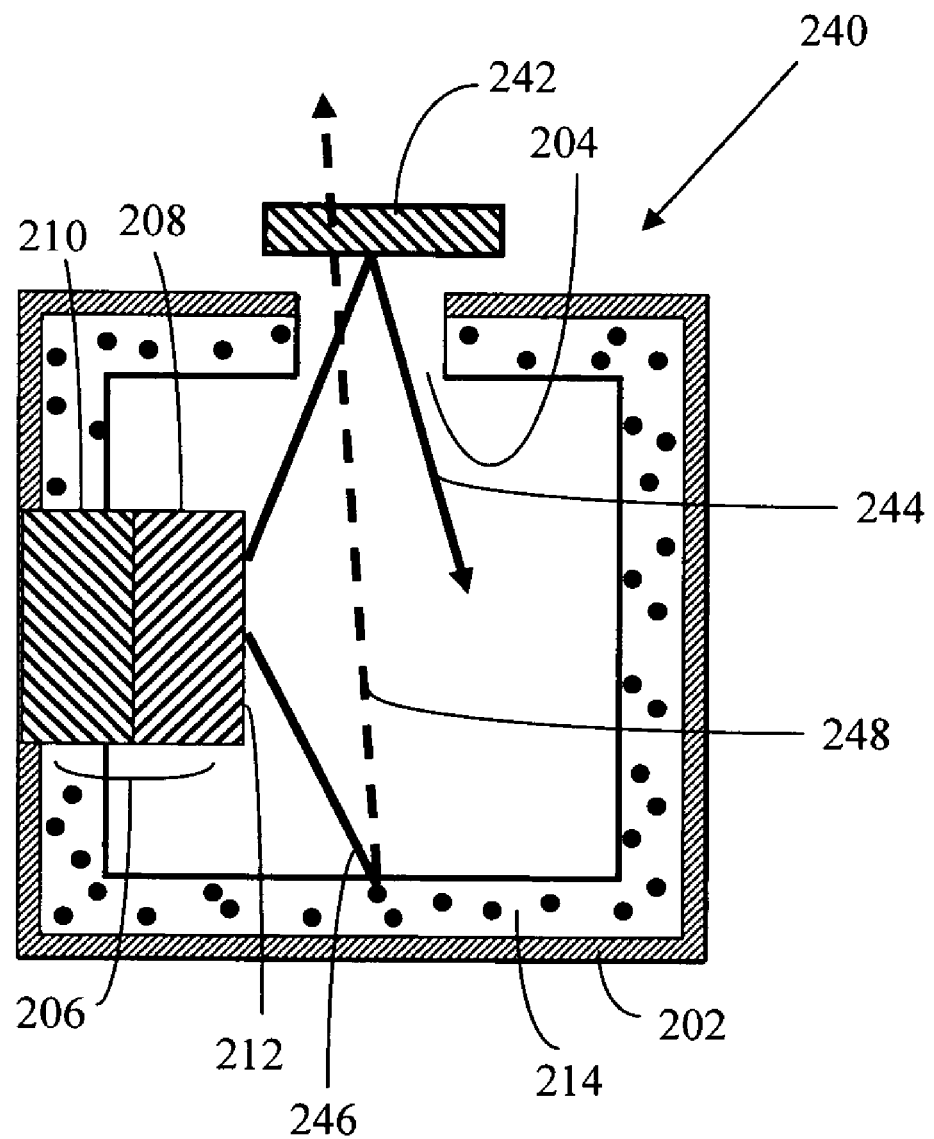
FIG. 6 is a cross-sectional side view of another embodiment of this invention that further comprises a dichroic mirror.

Another embodiment of this invention is illumination system 240 illustrated in cross-section in FIG. 6. Illumination system 240 is comprised of a light-recycling envelope 202, an LED 206, a wavelength conversion layer 214 that coats the inside surfaces of the light-recycling envelope and a partially reflecting optical element 242. Illumination system 240 is identical to illumination system 200 except for the addition of the partially reflecting optical element 242. Partially reflecting optical element 242 is preferably either a reflective polarizer or a dichroic mirror.

A reflective polarizer is a polarizer that reflects light of a first polarization state and transmits light of a second polarization state. Polarization states can be states of linear polarization or states of circular polarization. Examples of suitable reflective polarizers are Vikuiti™ Dual Brightness Enhancement Film (DBEF) made by 3M Corporation and polarizers made by NanoOpto Corporation and Moxtek Incorporated that utilize subwavelength optical elements.

When the partially transparent optical element 242 is a reflective polarizer, the reflective polarizer is placed adjacent to the light output aperture 204 and placed in the optical path of light exiting from the light output aperture 204. The adjacent position of the reflective polarizer can be either just outside the light-recycling envelope or just inside the light-recycling envelope. The reflective polarizer reflects both light of a first wavelength range and light of a second wavelength range that have a first polarization state. Also, the reflective polarizer transmits both light of a first wavelength range and light of a second wavelength range that have a second polarization state. The light of a first polarization state, either light of a first wavelength range or light of a second wavelength range, is recycled back into the light-recycling envelope. The light of a first polarization state recycled back into the light-recycling envelope will, after multiple reflections inside the light-recycling envelope, be converted into a mixture of light of a first polarization state and light of a second polarization state. The converted light of a second polarization state will then be able to pass through the reflecting polarizer. If only the second polarization state is desired for the output of illumination system 240, recycling the first polarization state back into the light-reflecting envelope to be converted into light of a second polarization state will improve the overall efficiency and output brightness of illumination system 240.

Some illumination system applications require polarized light. For example, illumination systems utilized for flat-panel display or projection display applications that incorporate liquid crystal display (LCD) panels or liquid-crystal-on-silicon (LCOS) display panels require illumination systems that emit polarized light.

A dichroic mirror is, for example, a mirror that can reflect light of a first wavelength range and transmit light of a second wavelength range. Dichroic mirrors may be utilized if light of a first wavelength range emitted by LED 206 is not desired in the light output from the light-recycling envelope. Dichroic mirrors are commonly constructed by alternately depositing layers of two transparent dielectrics having different indexes of refraction onto a transparent substrate. Examples of materials used for dielectric layers include silicon dioxide, titanium dioxide or magnesium fluoride.

When the partially transparent optical element 242 is a dichroic mirror, the dichroic mirror is placed adjacent to the light output aperture 204 and placed in the optical path of light exiting from the light output aperture 204. The adjacent position of the dichroic mirror can be either just outside the light-recycling envelope or just inside the light-recycling envelope. In FIG. 6, the partially reflecting optical element is a dichroic mirror and is positioned just outside the light output aperture 204.

Light rays 244, 246 and 248 in FIG. 6 illustrate the function of the dichroic mirror. Light ray 244 of a first wavelength range is emitted from surface 212 of emitting layer 208 on the fourth side of the illumination system 240, passes through the interior of the light-recycling envelope 202 and passes through the light output aperture 204 a first time to reach the partially reflecting optical element 242, which in this example is a dichroic mirror. Light ray 244 of a first wavelength range reflects off the dichroic mirror, passes through the light output aperture 204 a second time and is recycled back into the interior of the light-recycling envelope 202.

Light ray 246 of a first wavelength range is emitted from surface 212 of emitting layer 208 on the fourth side of the illumination system 240, passes through the interior of the light-recycling envelope 202 to the wavelength conversion layer 214 on the third side. The wavelength conversion layer converts light ray 246 of a first wavelength range into light ray 248 of a second wavelength range. Light ray 248 may be emitted in any direction. In this example, light ray 248 is emitted from the wavelength conversion layer on the third side, passes through the interior of the light-recycling envelope 202, passes through the light output aperture 204 on the first side and passes through the partially reflecting optical element 242, which is the dichroic mirror.

Overall, the dichroic mirror transmits light of a second wavelength range and reflects light of a first wavelength range back into the light-recycling envelope. The wavelength conversion layer can convert a portion of the light of a first wavelength range that is recycled back into the light-recycling envelope into light of a second wavelength range. The converted light of a second wavelength range can then pass through the dichroic mirror. If only light of a second wavelength range is desired for the output of illumination system 240, recycling the light of a first wavelength range back into the light-reflecting envelope to be converted into light of a second wavelength range will improve the overall efficiency and output brightness of illumination system 240.

Illumination system 260 in FIG. 7 is identical to illumination system 200 except that illumination system 260 further comprises a light-collimating element 262. Light-collimating element 262 can be any optical element that at least partially collimates the light exiting from the light output aperture 204. For example, the light-collimating element can be a convex lens, a tapered light guide, or a compound parabolic reflector.

In FIG. 7, light-collimating element 262 is a compound parabolic reflector for illustrative purposes. The compound parabolic reflector may be constructed from a solid transparent material. If the compound parabolic reflector is constructed from such a solid transparent material, light can pass through the material and reflect from the sides of the compound parabolic reflector by total internal reflection. Alternatively, the compound parabolic reflector may be a hollow structure. The sides of the compound parabolic reflector must then be covered with a reflective coating in order to reflect light. Light-collimating element 262 has an input surface 264, which is adjacent to the light output aperture 204, and an output surface 266. The input surface 264 accepts uncollimated light from the light output aperture 204. The light-collimating element 262 partially collimates the previously uncollimated light and transmits the partially collimated light through the output surface 266. In order for the light-collimating element to partially collimate the light exiting the light output aperture 204, the area of input surface 264 must be less than the area of the output surface 266. Equation 5 gives the mathematical relationship between the input and output areas and the input and output solid angle distributions of the light.

Representative light rays 268, 270 and 272 are shown in FIG. 7 to illustrate the function of the light-collimating element 262 when light-collimating element 262 is a compound parabolic reflector. Light ray 268 of a first wavelength range is emitted from surface 212 of emitting layer 208 on the first side, passes through the interior of the light-recycling envelope 202, passes through the light output aperture 204 on the first side and passes through input surface 264 of the compound parabolic reflector as uncollimated light. Light ray 268 is reflected by the sides of the compound parabolic reflector and exits the compound parabolic reflector through output surface 266 as partially collimated light.

Light ray 270 of a first wavelength range is emitted from surface 212 of emitting layer 208 on the fourth side, passes through the interior of light-recycling envelope 202 to the wavelength conversion layer 214 on the second side. Wavelength conversion layer 214 converts light ray 270 of a first wavelength range into light ray 272 of a second wavelength range. Light ray 272 passes through the interior of the light-recycling envelope 202, passes through the light output aperture 204 on the first side and enters the compound parabolic reflector through input surface 264. Light ray 272 is reflected by the sides of the compound parabolic reflector and exits the compound parabolic reflector through output surface 266 as partially collimated light.

The degree of light collimation required from the light-collimating element depends on the application. The light that exits through the light output aperture 204 typically has a Lambertian (angles of −90 degrees to +90 degrees or a solid angle of 2π) or near Lambertian angular distribution. The degree of collimation exiting the light-collimating element 262 can be adjusted as needed by changing the area of the output surface 266 relative to the area of the input surface 264 utilizing the mathematical relationship of Equation 5. If the input refractive index $n_{in}$ of the light-collimating element is equal to the output refractive index $n_{out}$ of the light-collimating element, then Equation 4 can be used instead and the light output solid angle distribution $\Omega_{out}$ from the light-collimating element is given by $$\Omega_{out} = \Omega_{in}(Area_{in})/(Area_{out}),$$ [Equation 7]

where $\Omega_{in}$ is the light input solid angle distribution into the light-collimating element, $Area_{in}$ is the area of the input surface 264 and $Area_{out}$ is the area of the output surface 266.

For applications requiring a high degree of light collimation, the light-collimating element 262 partially collimates the light so that the light output distribution is preferably within the angular range of −30 degrees to +30 degrees. More preferably, light-collimating element 262 partially collimates the light so that the light output distribution is within the angular range of −20 degrees to +20 degrees. Most preferably, light-collimating element 262 partially collimates the light so that the light output distribution is within the angular range of −10 degrees to +10 degrees.

Figure 8A:
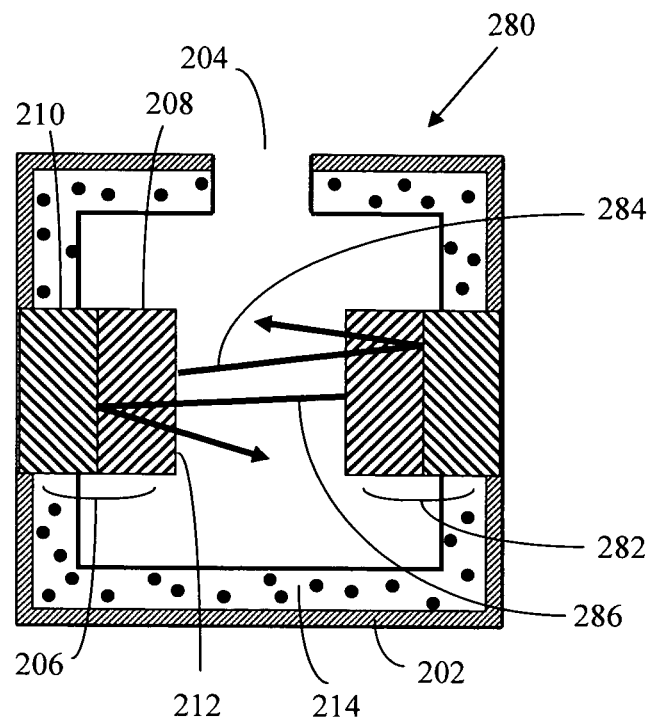
FIG. 8A is a cross-sectional side view of another embodiment of this invention that has two light-emitting diodes and a wavelength conversion layer.

The embodiments of this invention illustrated in FIGS. 5-7 are illustrated with one LED 206 as the light source. However, embodiments of this invention may incorporate more than one LED. FIG. 8A illustrates a cross-sectional view of illumination system 280, which has a light source consisting of two LEDs that both emit and reflect light. Illumination system 280 is identical to illumination system 200 except that illumination system 280 has an additional LED 282 on the second side and the area of the wavelength conversion layer is reduced to accommodate the area of LED 282. LED 282 may emit light of a first wavelength range or LED 282 may emit light of a third wavelength range, different from the light of a first wavelength range and from the light of a second wavelength range. LED 282 also reflects light.

In FIG. 8A, part of the light emitted from LED 206 may be reflected by LED 282 and thereby increase the effective brightness of LED 282. Light ray 284 is an illustrative example. Similarly, part of the light emitted from LED 282, illustrated by light ray 286, may be reflected by LED 206 and thereby increase the effective brightness of LED 206.

If LED 282 emits light of a first wavelength range, then LED 282 adds to the light of a first wavelength range that is emitted by LED 206. The wavelength conversion layer 214 will convert a portion of the light of a first wavelength range from both LEDs into light of a second wavelength range. Adding an additional LED 282 that emits light of a first wavelength range to the illumination system will increase the light flux and light brightness of the light of a first wavelength range and the light of a second wavelength range exiting the light output aperture 204.

If LED 282 emits light of a third wavelength range, the wavelengths of the light of a third wavelength range may be shorter than the wavelengths of the light of a first wavelength range or the wavelengths of the light of a third wavelength range may be longer than the wavelengths of the light of a second wavelength range. If the wavelengths of the light of a third wavelength range are shorter than the wavelengths of the light of a first wavelength range, the wavelength conversion layer may convert a portion of the light of a third wavelength range into light of a second wavelength range. If the wavelengths of the light of a third wavelength range are longer than the wavelengths of the light of a second wavelength range, the wavelength conversion layer will not convert the light of a third wavelength range into other wavelengths.

If LED 282 emits light of a third wavelength range, the light of a third wavelength range can be emitted concurrently with the light of a first wavelength range emitted by LED 206 and the light of a second wavelength range emitted by the wavelength conversion layer. A fraction of the light of a first wavelength range, a fraction of the light of a second wavelength range and a fraction of the light of a third wavelength range will exit the light output aperture 204 as light of a composite color. By adjusting the electrical power for LED 282 relative to the electrical power for LED 206, the flux of light of a third wavelength range emitted from LED 282 can be varied relative to the flux of light of a first wavelength range emitted from LED 206 and the corresponding flux of light of a second wavelength range emitted by the wavelength conversion layer. By varying the flux of the light of a third wavelength range emitted from LED 282, the composite color of the light exiting the light output aperture and the color-rendering index of the light exiting the light output aperture can be adjusted as desired.

Alternatively, LED 282 can emit light of a third wavelength range in a first time period and a fraction of the light of third wavelength range exits the light output aperture 204 in the first time period. In the first time period, LED 206 is not powered and does not emit light. In a second time period, different from the first time period, LED 206 emits light of a first wavelength range and a portion of the light of a first wavelength range is converted to light of second wavelength range. A fraction of the light of a first wavelength range and a fraction of the light of a second wavelength range exit the light output aperture 204 in the second time period. In the second time period, LED 282 is not powered and does not emit light. The first time period and the second time period do not overlap. The respective light emissions in the first time period and the second time period are then repeated in sequence. The resulting light exiting the light output aperture alternates in color. Note that if one LED is not powered and does not emit light, it still functions as a reflector with the reflecting layer reflecting light incident upon the LED.

Figure 8B:
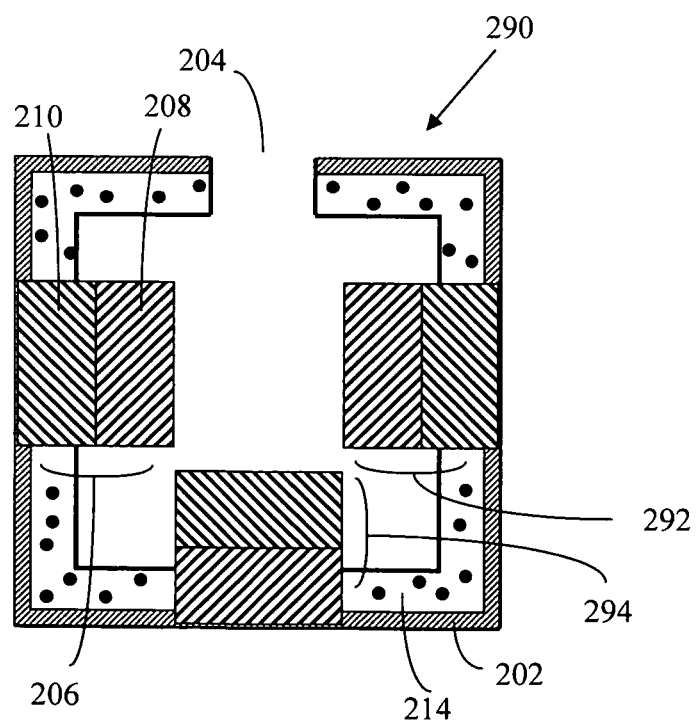
FIG. 8B is a cross-sectional side view of another embodiment of this invention that has three light-emitting diodes and a wavelength conversion layer.

FIG. 8B illustrates illumination system 290, which has a light source comprised of three LEDs. Illumination system 290 is identical to illumination system 200 except that illumination system 290 has additional LED 292 on the second side and additional LED 294 on the third side and the area of the wavelength conversion layer is reduced to accommodate the area of the two additional LEDs. It is also within the scope of this invention that the light source of the illumination system may be comprised of more than three LEDs. The total light-emitting area of all the LEDs in the illumination system is area $A_S$. LED 292 emits either light of a first wavelength range or light of a third wavelength range, different from the light of a first or second wavelength range. LED 294 emits light of a first wavelength range, light of a third wavelength range, or light of a fourth wavelength range. Light of a fourth wavelength range is different than light of a first, second or third wavelength range. LED 292 and LED 294 may emit light concurrently with LED 206 and the wavelength conversion layer 214, or LED 292 and LED 294 may emit light in time periods different than the time period for light emission from LED 206 and wavelength conversion layer 214.

In principle, LEDs may cover the entire inside surface of the light-recycling envelope with the exception of the area of the light output aperture. However, with this configuration of the wavelength conversion layer, increasing the area of the LEDs reduces the area of the wavelength conversion layer.

In the illumination systems illustrated in FIGS. 5-8, the wavelength conversion layer 214 covers only the areas of the light-recycling envelope that are not occupied by the LEDs and the light output aperture 204. It is also within the scope of this invention that the wavelength conversion layer can have different configurations or shapes. Representative examples are shown in FIGS. 9A, 9B and 9C.

Figure 9A:
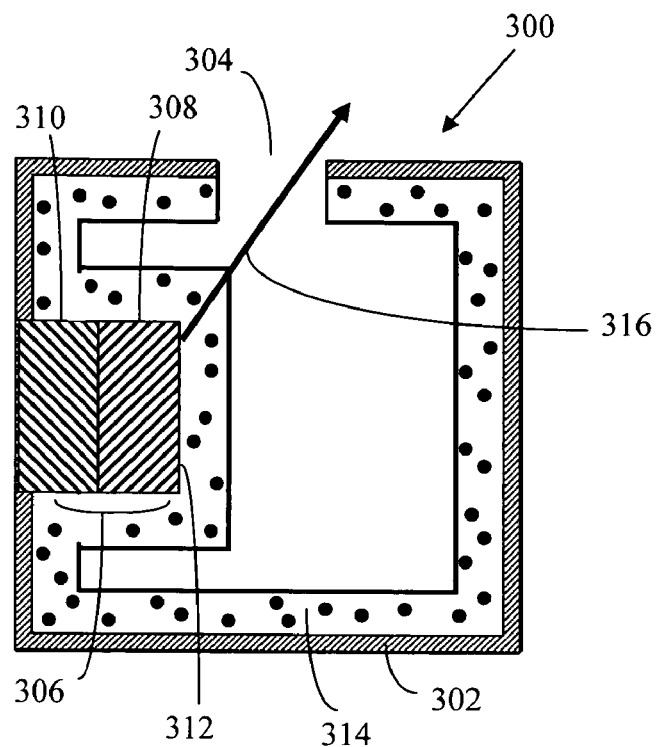
FIGS. 9A and 9B are cross-sectional side views of other embodiments of this invention where the wavelength conversion layer is a coating.
Figure 9B:
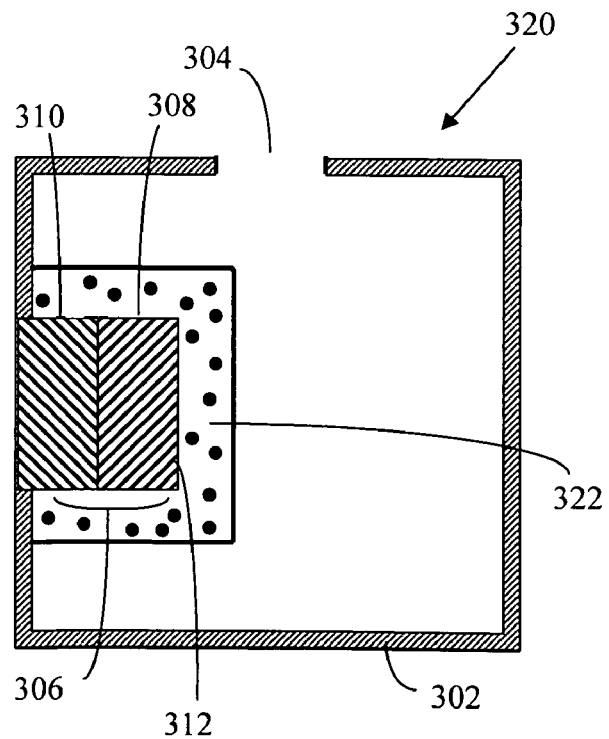
Figure 9C:
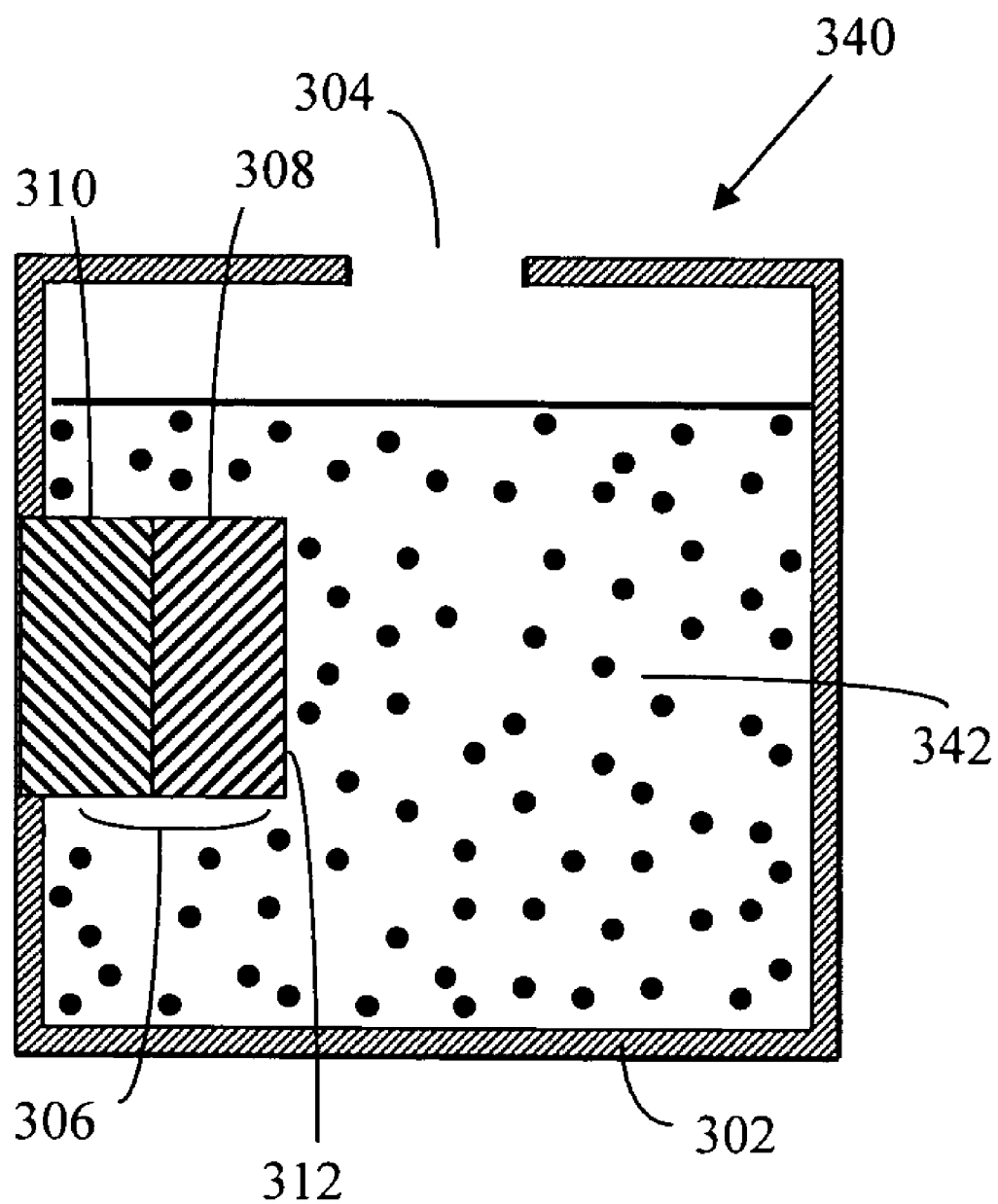
FIG. 9C is a cross-sectional side view of another embodiment of this invention where the wavelength conversion layer substantially fills the light-recycling envelope.

In the cross-sectional view shown in FIG. 9A, wavelength conversion layer 314 of illumination system 300 coats the exposed surface of LED 306 in addition to the inside surfaces of the light-recycling envelope 302 not occupied by the LED 306 and the light output aperture 304. The wavelength conversion layer 314 may coat only a part or substantially all of the exposed surface of LED 306, and the wavelength conversion layer 314 may coat only a part or substantially all of the inside surfaces of the light-recycling envelope 302 not occupied by the LED 306 or the light output aperture 304.

As stated previously, when the wavelength conversion layer coats the emitting layer of an LED, the refractive index difference between the emitting layer and its surroundings is reduced. The reduction in this refractive index difference can increase the light emission from the emitting layer and improve the overall efficiency of the illumination system. If desired, the refractive index of the wavelength conversion layer may be increased further to improve the light emission from the emitting layer by incorporating into the wavelength conversion layer ultrafine powders of materials having a bulk index of refractive greater than 1.60. Previously noted high-index materials include tin oxide, titanium dioxide, zinc oxide, cerium oxide and antimony pentoxide.

If the wavelength conversion layer 314 coats all exposed surfaces of LED 306, light emitted by LED 306 in illumination system 300 must pass through the wavelength conversion layer 314 at least once in order to exit the light output aperture 304. For example, light ray 316 of a first wavelength range emitted from surface 312 of emitting layer 308 must pass through wavelength conversion layer 314 coating the surface of LED 306 in order to reach the interior of the light-recycling envelope 302. In this example, light ray 316 is not converted to light of a second wavelength range. Light ray 316 passes through the interior of light-recycling envelope 302 and exits the illumination system through light output aperture 304.

LED 306 has a maximum intrinsic source radiance and a maximum intrinsic source luminance that are determined by measuring an identically constructed LED that is not coated with a wavelength conversion layer and that is not enclosed in a light-recycling envelope.

Light of a first wavelength range emitted by emitting layer 308 and light of a second wavelength range emitted by the wavelength conversion layer 314 may be recycled back to LED 306 by the light-recycling envelope and reflect off reflecting layer 310. The recycled light will increase the effective brightness of LED 306 and, in turn, increase the combined exiting radiance and combined exiting luminance of light of a first wavelength range and light of a second wavelength range exiting the light output aperture 304.

The characteristics and properties of the LED 306, emitting layer 308, reflecting layer 310, the wavelength conversion layer 314, the light-recycling envelope 302 and the light output aperture 304 in illumination system 300 are identical to the characteristics and properties of the respective elements in illumination system 200. The total light-emitting area of LED 310 is area $A_S$. As noted previously, the reflectivity $R_E$ of the light-recycling envelope 302 is preferably at least 50%. More preferably, the reflectivity $R_E$ is at least 70%. Most preferably, the reflectivity $R_E$ is at least 90%. Also as previously discussed, the reflectivity $R_S$ of the reflecting layer 310 is preferably at least 50%. More preferably, the reflectivity $R_S$ is at least 70%. Most preferably, the reflectivity $R_S$ is at least 90%. The total output aperture area of output aperture 304 is area $A_O$. As in illumination system 200, when $A_O$ is less than $A_S$ and when $R_S$ and $R_E$ are each greater than 50%, it is possible for the combined exiting radiance of illumination system 300 to be greater than the maximum intrinsic source radiance of LED 306 and it is also possible for the combined exiting luminance of illumination system 300 to be greater than the maximum intrinsic source luminance of LED 306.

Another embodiment of this invention is illumination system 320. In the cross-sectional view of illumination system 320 shown in FIG. 9B, wavelength conversion layer 322 coats only the exposed surface of the LED 306 and does not coat most portions of the inside surfaces of the light-recycling envelope 302. It is within the scope of this invention that the wavelength conversion layer 322 may coat the entire exposed surface of LED 306 or may coat only a part of the surface of LED 306.

The characteristics and properties of the LED 306, emitting layer 308, reflecting layer 310, the wavelength conversion layer 322, the light-recycling envelope 302 and the light output aperture 304 in illumination system 320 are identical to the characteristics and properties of the respective elements in illumination system 200. The total light-emitting area of LED 310 is area $A_S$. As noted previously, the reflectivity $R_E$ of the light-recycling envelope 302 is preferably at least 50%. More preferably, the reflectivity $R_E$ is at least 70%. Most preferably, the reflectivity $R_E$ is at least 90%. Also as previously discussed, the reflectivity $R_S$ of the reflecting layer 310 is preferably at least 50%. More preferably, the reflectivity $R_S$ is at least 70%. Most preferably, the reflectivity $R_S$ is at least 90%. The total output aperture area of output aperture 304 is area $A_O$. As in illumination system 200, when $A_O$ is less than $A_S$ and when $R_S$ and $R_E$ are each greater than 50%, it is possible for the combined exiting radiance of illumination system 320 to be greater than the maximum intrinsic source radiance of LED 306 and it is also possible for the combined exiting luminance of illumination system 320 to be greater than the maximum intrinsic source luminance of LED 306.

Another embodiment of this invention is illumination system 340. In the cross-sectional view of illumination system 340 shown in FIG. 9C, wavelength conversion layer 342 fills a substantial portion of the light-recycling envelope and covers the entire exposed surface of LED 306. It is within the scope of this invention that the wavelength conversion layer 342 may fill only a portion of the light-recycling envelope or the wavelength conversion layer 342 may fill a substantial portion of the light-recycling envelope or the wavelength conversion layer may completely fill the light-recycling envelope.

The characteristics and properties of the LED 306, emitting layer 308, reflecting layer 310, the wavelength conversion layer 342, the light-recycling envelope 302 and the light output aperture 304 in illumination system 340 are identical to the characteristics and properties of the respective elements in illumination system 200. The total light-emitting area of LED 306 is area $A_S$. As noted previously, the reflectivity $R_E$ of the light-recycling envelope 302 is preferably at least 50%. More preferably, the reflectivity $R_E$ is at least 70%. Most preferably, the reflectivity $R_E$ is at least 90%. Also as previously discussed, the reflectivity $R_S$ of the reflecting layer 310 is preferably at least 50%. More preferably, the reflectivity $R_S$ is at least 70%. Most preferably, the reflectivity $R_S$ is at least 90%. The total output aperture area of output aperture 304 is area $A_O$. As in illumination system 200, when $A_O$ is less than $A_S$ and when $R_S$ and $R_E$ are each greater than 50%, it is possible for the combined exiting radiance of illumination system 340 to be greater than the maximum intrinsic source radiance of LED 306 and it is also possible for the combined exiting luminance of illumination system 340 to be greater than the maximum intrinsic source luminance of LED 306.

In FIGS. 5-9, the light source is positioned inside the light-recycling envelope. The light-recycling envelope encloses the light source and the wavelength conversion layer. It is also within the scope of this invention that a part of the light source may be located outside the light-recycling envelope. In such cases, the light-recycling envelope partially encloses the light source but does not enclose the entire light source. Examples of illumination systems where a part of the light source is located outside the light-recycling envelope are shown in the cross-sectional views in FIGS. 10A, 10B and 10C.

Figure 10A:
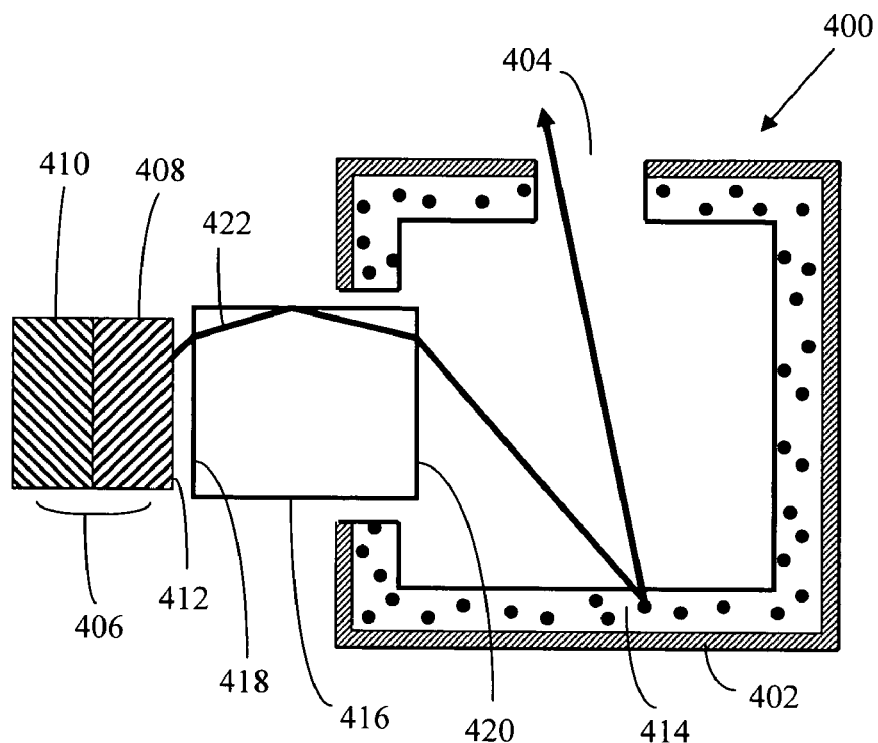
FIGS. 10A and 10B are cross-sectional side views of another embodiment of this invention that further comprises a light guide.
Figure 10B:
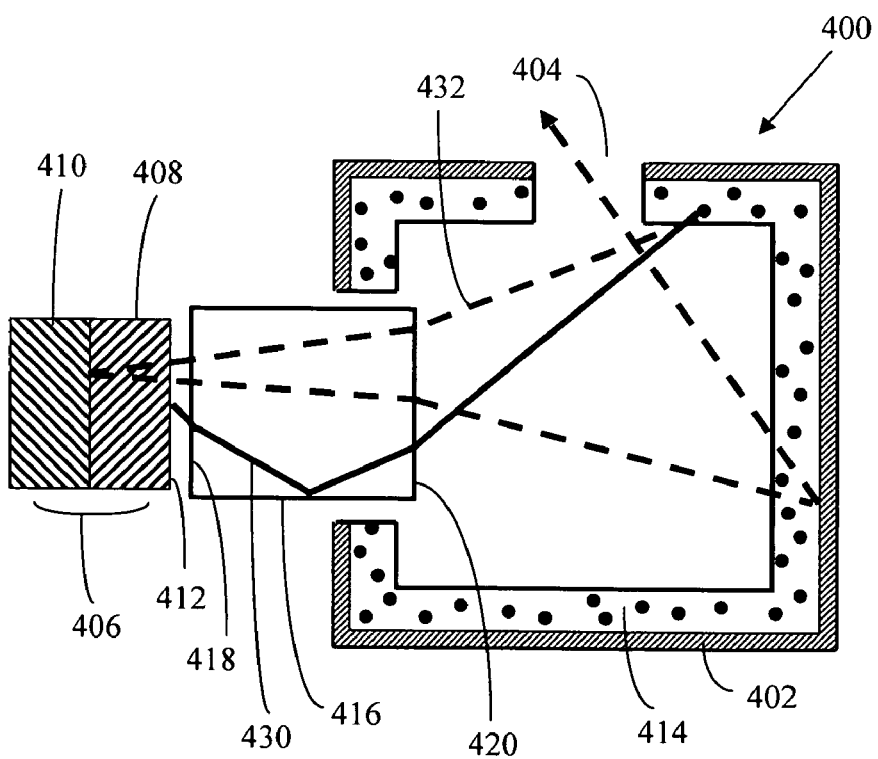

FIGS. 10A and 10B show cross-sectional views of illumination system 400. The cross-section of the illumination system 400 has a first side, a second side, a third side and a fourth side. Illumination system 400 is similar to illumination system 200 except that the light source for illumination system 400 further comprises a light guide 416 in addition to an LED 406. Illumination system 400 also comprises a light-recycling envelope 402, a wavelength conversion layer 414 and a light output aperture 404 located on the first side of the illumination system. The characteristics and properties of LED 406, the light-recycling envelope 402, the wavelength conversion layer 414 and the light output aperture 404 are identical to the characteristics and properties of the respective elements in illumination system 200.

LED 406 has a maximum intrinsic source radiance and a maximum intrinsic source luminance that are determined by measuring an identically constructed LED that is not associated with a light guide and with a light-recycling envelope.

Light guide 416 is located on the fourth side of the illumination system and has an input surface 418 adjacent to the emitting layer 408 of LED 406 and an output surface 420 located inside the light-recycling envelope 402. Preferably the area of the input surface 418 is greater than the area of surface 412 of the LED 406 so that substantially all of the light emitted through the surface 412 of LED 406 will enter light guide 416. Preferably there is gap between surface 412 of LED 406 and input surface 418 of light guide 416 and preferably the refractive index of the gap is less than the refractive index of the light guide. If such a gap exits and the gap has a refractive index sufficiently smaller than the refractive index of the light guide, light emitted from surface 412 at large angles, i.e. angles greater than about 45 degrees from the direction perpendicular to surface 412, will still be accepted into light guide 416, will be guided by the light guide at angles less than about 45 degrees to the direction perpendicular to surface 418 and will be directed into the light-recycling envelope. Conversely, if no gap exits between surface 412 and surface 418, light emitted from surface 412 at angles greater than about 45 degrees from the direction perpendicular to surface 412 probably will not be guided by light guide 416 into the light-recycling envelope 402 and probably will be lost.

Light guide 416 transports light of a first wavelength range emitted by emitting layer 408 of LED 406 from LED 406 into the light-recycling envelope 402. In addition, light guide 416 transports part of the light of a first wavelength range and part of the light of a second wavelength range from the light-recycling envelope 402 to the reflecting layer 410 of LED 406 as recycled light. And finally, light guide 416 transports the recycled light reflected by the reflecting layer 410 back into the light-recycling envelope. Recycled light of a first wavelength range and recycled light of a second wavelength range reflected from reflecting layer 410 will increase the effective brightness of LED 406.

The total light-emitting area of LED 406 is area $A_S$. As noted previously, the reflectivity $R_E$ of the light-recycling envelope 402 is preferably at least 50%. More preferably, the reflectivity $R_E$ is at least 70%. Most preferably, the reflectivity $R_E$ is at least 90%. Also as previously discussed, the reflectivity $R_S$ of the reflecting layer 410 is preferably at least 50%. More preferably, the reflectivity $R_S$ is at least 70%. Most preferably, the reflectivity $R_S$ is at least 90%. The total output aperture area of output aperture 404 is area $A_O$. As in illumination system 200, when $A_O$ is less than $A_S$ and when $R_S$ and $R_E$ are each greater than 50%, it is possible for the combined exiting radiance of illumination system 400 to be greater than the maximum intrinsic source radiance of LED 406 and it is also possible for the combined exiting luminance of illumination system 400 to be greater than the maximum intrinsic source luminance of LED 406.

Example rays 422, 430 and 432 in FIGS. 10A and 10B illustrate the function of light guide 416. Light ray 422 of a first wavelength range is emitted from surface 412 of emitting layer 408 of LED 406. Light ray 422 passes through the gap between surfaces 412 and 418 and enters light guide 416 through surface 418. Light ray 422 passes through light guide 416, reflecting from a side of light guide 416, and exits light guide 416 through surface 420, which is located inside the light-recycling envelope 402. Light ray 422 passes through the interior of light-recycling envelope 402 to wavelength conversion layer 414. In this example, conversion layer 414 is a partial reflector in addition to being a converting layer. Light ray 422 is reflected by wavelength conversion layer 414 and passes through the interior of the light-recycling envelope to exit illumination system 400 through light output aperture 404 as light of a first wavelength range. Note that if wavelength conversion layer 414 did not reflect light ray 422, light ray 422 would have reflected from the light-recycling envelope 402 instead. Light ray 422 was not converted to light of a second wavelength range and was not recycled back to reflecting layer 410 of LED 406.

In FIG. 10B, light ray 430 of a first wavelength range is emitted through surface 412 of emitting layer 408 of LED 406. Light ray 430 passes through the gap between surfaces 412 and 418 and enters light guide 416 through surface 418. Light ray 430 passes through light guide 416, reflecting from the side of light guide 416, and exits light guide 416 through surface 420, which is located inside light-recycling envelope 402. Light ray 430 passes through the interior of light-recycling envelope 402 to the wavelength conversion layer 414 on the first side. Wavelength conversion layer 414 converts light ray 430 of a first wavelength range into light ray 432 of a second wavelength range. Light ray 432 passes through the interior of light-recycling envelope 402 to surface 420 of light guide 416. Light ray 432 passes through light guide 416 without reflection, passes through surface 418 of light guide 416, passes through surface 412 and emitting layer 408 a first time, is reflected by reflecting layer 410 and passes through emitting layer 408 and surface 412 a second time. Light ray 432 re-enters light guide 416 through surface 418, passes through light guide 416 without reflection, and exits light guide 416 through surface 420. Light ray 432 then passes through the interior of the light-recycling envelope to the wavelength conversion layer on the second side. Light ray 432 passes through the wavelength conversion layer 414 a first time, is reflected by the light-recycling envelope 402 on the second side, passes through the wavelength conversion layer 414 a second time, passes through the interior of the light-recycling envelope and exits illumination system 400 through light output aperture 404 as light of a second wavelength range.

Overall, wavelength conversion layer 414 converts light ray 430 of a first wavelength range into light ray 432 of a second wavelength range. Light ray 432 is recycled back to the reflecting layer 410 of LED 406 and increases the effective brightness of LED 406.

The light guide 416 may be constructed from any solid material that is transparent to light of a first wavelength range and to light of a second wavelength range and that transports light by total internal reflection. Possible materials include inorganic glasses such as silicon dioxide and plastics such as polymethymethacrylate and fluoroacrylates. If LED 406 emits light in a Lambertian or near-Lambertian output angular distribution, a light guide 416 that guides light by total internal reflection may need to be a straight light guide in order to prevent light leakage from the sides of the light guide. The light guide 416 may also be a solid or hollow structure where the sides, but not the ends, of the light guide are coated with a light reflecting material. If the sides of the light guide 416 are coated with a reflective material, the light guide 416 may also be a curved light guide and still efficiently transport light emitted by a Lambertian emitter.

In illumination system 400, the LED is removed from the inside of the light-recycling envelope. LEDs generate considerable heat during operation. Removing the LED from the light-recycling envelope lowers the temperature inside the light-recycling envelope. Lowering the temperature is advantageous, especially when multiple LEDs are required for the illumination system. Placing multiple LEDs away from the light-recycling envelope will allow the LEDs to be operated in a potentially cooler environment, which will increase the light output and the operating lifetime of the LEDs.

Figure 10C:
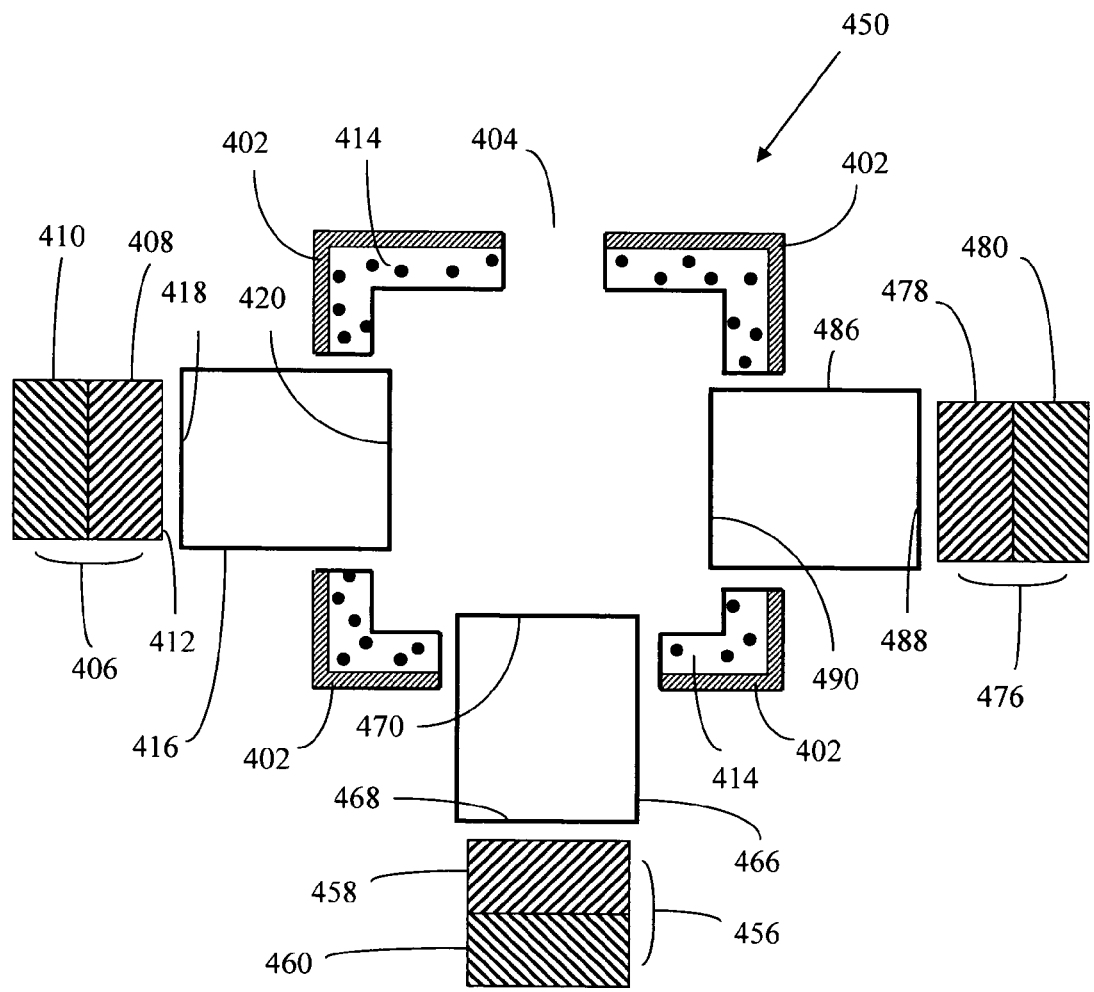
FIG. 10C is a cross-sectional side view of another embodiment of this invention that incorporates three light guides and three light-emitting diodes.

Illumination system 450 shown in cross-section in FIG. 10C is identical to illumination system 400, except that illumination system 450 includes two additional light guides, light guide 466 and light guide 486, and two additional LEDs, LED 456 and LED 476. The additional LEDs and light guides may be required if higher light output flux is needed exiting the light output aperture 404 or if LEDs of different colors are required.

This completes the examples of the first embodiment of this invention that use powdered phosphors. An example of a first embodiment of this invention that uses a solid phosphor layer will be illustrated following the examples of the second and third embodiments of this invention.

In the second embodiment of this invention, the output brightness of the illumination system is measured in an identical manner to the output brightness in the first embodiment and is measured as the combined exiting radiance of light of a first wavelength range and light of a second wavelength range exiting the light output aperture, or as the combined exiting luminance of light of a first wavelength range and light of a second wavelength range exiting the light output aperture. However, the reference brightness is different for the second embodiment than for the first embodiment. The reference brightness for the second embodiment incorporates the fact that both the light source and the wavelength conversion layer emit light. The reference brightness for the second embodiment is the maximum combined intrinsic radiance of light of a first wavelength range and light of a second wavelength range emitted by the light source and the wavelength conversion layer operating in combination when light recycling is not utilized, or the reference brightness is the maximum combined intrinsic luminance of light of a first wavelength range and light of a second wavelength range emitted by the light source and the wavelength conversion layer operating in combination when light recycling is not utilized.

The reference area used to determine if brightness enhancement is taking place is also different for the second embodiment. The reference area for the second embodiment incorporates the fact that since an area larger than the total light-emitting area of the LEDs emits light, an area larger than the LED area can be used as the reference area. The reference area for the second embodiment could be defined as the total light-emitting area of the light source and wavelength conversion layer operating in combination. However, determining the total light-emitting area of the combination may be difficult in some cases since the wavelength conversion layer may have many possible shapes. For example, the wavelength conversion layer may substantially fill the light-recycling envelope or the wavelength conversion layer may be only a coating on the light-recycling envelope and/or the light source. In order to eliminate any ambiguity in determining the reference light-emitting area for the light source and wavelength conversion layer operating in combination, the reference area is chosen to be the maximum cross-sectional area $A_E$ of the light-recycling envelope.

Examples of this invention that are related to the second embodiment are illustrated in FIGS. 11-19 and will now be described in detail.

One example of the second embodiment of the present invention is illumination system 500 shown in FIGS. 11A-11F. Illumination system 500 is comprised of a light source, a wavelength conversion layer 514, a light-recycling envelope 502 and a light output aperture 504. Illumination system 500 is similar to illumination system 200 in FIGS. 5A-5G except that three changes have been made to illumination system 500 when compared to illumination system 200. First, in illumination system 500, the light-recycling envelope 502 has a different shape than light-recycling envelope 202. Second, in illumination system 500, the wavelength conversion layer 514 substantially fills the light-recycling envelope, whereas the wavelength conversion layer in illumination system 200 coated the inside surfaces of the light-recycling envelope. Third, in illumination system 500, the position of the LED 506 is changed to a position opposite the light output aperture.

Figure 11A:
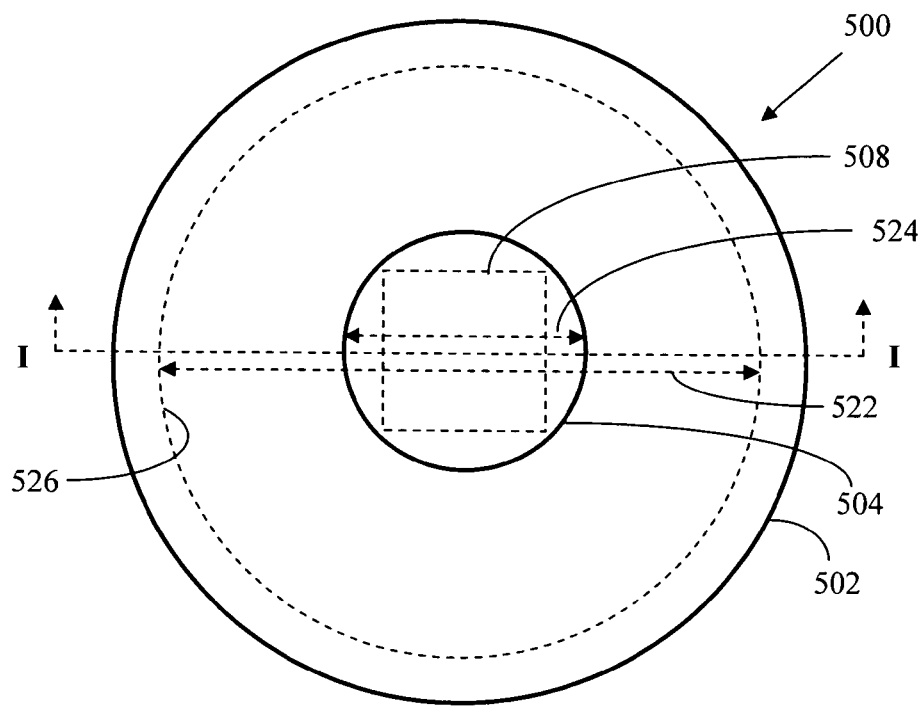
FIG. 11A is a top external view of another embodiment of this invention that has one light-emitting diode and a wavelength conversion layer.
Figure 11B:
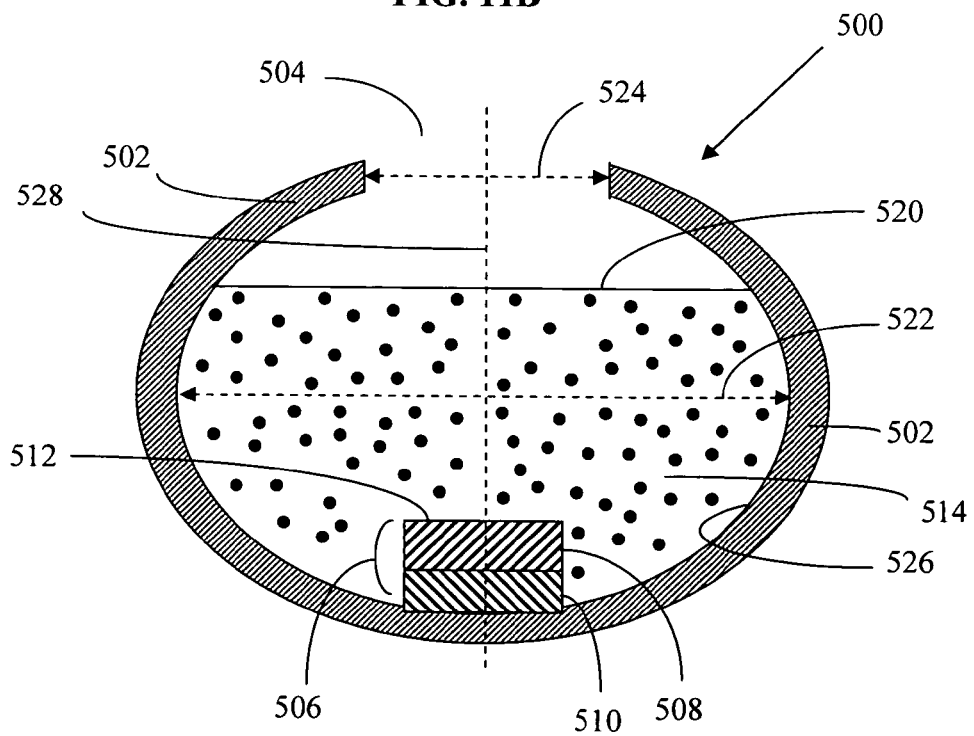
FIG. 11B is a cross-sectional side view in the I-I plane of the illumination system shown in FIG. 11A.

A top external view of illumination system 500 is illustrated in FIG. 11A, showing the outer edge of a light-recycling envelope 502 and a light output aperture 504 as solid lines. FIG. 11B is a cross-sectional view along the I-I plane indicated in FIG. 11A. FIGS. 11C-11F show the paths of some representative light rays emitted from LED 506.

The shape of the light-recycling envelope 502 of illumination system 500 is an oblate spheroid that has an axis of symmetry 528. Both the shape of a cross-section of the light-recycling envelope in a plane perpendicular to the axis of symmetry 528 and the shape of the light output aperture 504 are circular. For illumination system 500, the oblate spheroid shape of the surface of the light-recycling envelope 502, the circular cross-sectional shape of the light-recycling envelope 502 in a plane perpendicular to the axis of symmetry 528 and the circular shape of the light output aperture 504 are illustrative examples used for ease of understanding of the invention and to illustrate alternatives to the shapes illustrated for illumination system 200. It should also be noted that the drawing is merely a representation of the structure; the actual and relative dimensions may be different.

As noted previously, the light-recycling envelope 502 may have any three-dimensional surface, either regular or irregular, that encloses an interior volume. The oblate spheroid shape for light-recycling envelope 502 was chosen as an illustrative alternative shape to be compared to the cubical light-recycling envelope 202 in illumination system 200. Similarly, the cross-section of the light-recycling envelope 502 shown in FIG. 11B may have any shape, either regular or irregular, depending on the shape of the three-dimensional surface of the light-recycling envelope 502.

The interior surfaces of a light-recycling envelope generally have a cross-sectional area that varies depending on the location inside the light-recycling envelope. However, the interior of a light-recycling envelope will have at least one location that has a maximum cross-sectional area, which is denoted as area $A_E$. For the symmetric oblate spheroid shape of the light-recycling envelope illustrated in FIGS. 11A and 11B, the maximum cross-sectional area is the circular area located at the equator of the oblate spheroid. The circular area has a diameter indicated by line 522. In this example, the plane of the maximum cross-sectional area is perpendicular to the axis of symmetry 528 and is parallel to the plane of the light output aperture 504. For light-recycling envelopes that have an axis of symmetry that passes through one light output aperture, generally the maximum cross-sectional area will be in a plane that is perpendicular to the axis of symmetry and parallel to the light output aperture. However, for light-recycling envelopes that have irregular shapes or that do not have an axis of symmetry, the maximum cross-sectional area may have any arbitrary orientation with respect to the light output aperture.

The oblate spheroid cross-sectional shape of illumination system 500 shown in FIG. 11B has a left side, which is to the left of the axis of symmetry 528 and a right side, which is to the right of the axis of symmetry 528. The light output aperture 504 and the LED 506 are located on the axis of symmetry on opposite sides of the light-recycling envelope for illustrative purposes only. It is within the scope of this invention that the light output aperture 504 may be placed at any location in the surface of the light-recycling envelope and the LED 506 may be placed at any location on the inside surface of the light-recycling envelope that does not overlap with the light output aperture 504.

The inside surfaces of the light-recycling envelope 502, except for the area occupied by the LED 506 and the area occupied by the light output aperture 504, are light reflecting surfaces. The light-recycling envelope reflects both light of a first wavelength range and light of a second wavelength range. In order to achieve high light reflectivity, the light-recycling envelope 502 may be fabricated from a bulk material that is intrinsically reflective or the inside surfaces of the light-recycling envelope 502 may be covered with a reflective coating. The bulk material or the reflective coating may be a specular reflector, a diffuse reflector or a diffuse reflector that is backed with a specular reflecting layer. Examples of reflective materials and reflective coatings were described previously. Preferably the reflectivity $R_E$ of the inside surfaces of the light-recycling envelope 502 that are not occupied by the LED 506 and the light output aperture 504 is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the efficiency and output brightness of the illumination system.

As illustrated in FIGS. 11A-11F, the wavelength conversion layer 514 substantially fills the interior of the light-recycling envelope 502. Alternatively, the wavelength conversion layer 514 may fill only a small part of the light-recycling envelope or may entirely fill the parts of the light-recycling envelope that are not occupied by LED 506.

The wavelength conversion layer 514 converts a portion of the light of a first wavelength range emitted by the light source into light of a second wavelength range, different from the light of a first wavelength range. The light of a second wavelength range has longer wavelengths and a lower energy than the light of a first wavelength range, resulting in an energy loss for wavelength conversion. The total energy efficiency $\eta_T$ of wavelength conversion of light of a first wavelength range to light of a second wavelength range is given previously by Equation 6.

The wavelength conversion layer 514 is comprised of a powdered phosphor material, a quantum dot material, a luminescent dopant material or a plurality of such materials. In addition, the wavelength conversion layer may further comprise a transparent host material into which the phosphor material, the quantum dot material or the luminescent dopant material is dispersed. Examples of powdered phosphor materials, quantum dot materials, luminescent dopant materials and transparent host materials were listed previously. For illustrative purposes, the wavelength conversion layer 514 in FIGS. 11A-11F is shown to be comprised of particles dispersed in a transparent layer.

Depending on the materials that comprise the wavelength conversion layer 514, the wavelength conversion layer may also partially reflect the light of a first wavelength range and the light of a second wavelength range incident upon the wavelength conversion layer. Light may reflect inside the light-recycling envelope by reflecting from the light-recycling envelope 502, by partially reflecting from the wavelength conversion layer 514 or by reflecting from the light source. Light that passes through the wavelength conversion layer 514 and that is not reflected or absorbed by the wavelength conversion layer will pass through to the opposite side of the wavelength conversion layer. The wavelength conversion layer is chosen not to interfere with the light-reflecting properties of the light-recycling envelope and the light-recycling envelope is chosen not to interfere with the wavelength conversion properties of the wavelength conversion layer.

Illumination system 500 can have one or more than one light output aperture. The total output aperture area of all the output apertures in the illumination system is area $A_O$. In FIGS. 11A-11F, illumination system 500 is shown to have just one light output aperture 504 and the area $A_O$ for illumination system 500 is the area of the one light output aperture.

The light source for illumination system 500 is at least one LED. It is also within the scope of this invention that the light source may be two or more LEDs. For illustration purposes, the light source for illumination system 500 is shown as one LED, denoted as LED 506, which is located on the axis of symmetry of the light-recycling envelope opposite the light output aperture 504. LED 506 may be an inorganic light-emitting diode or an OLED. Preferably, LED 506 is an inorganic light-emitting diode. Examples of inorganic light-emitting diodes have been listed previously.

The light source and the wavelength conversion layer operating in combination have a maximum combined intrinsic radiance and a maximum combined intrinsic luminance in the absence of light recycling. The maximum combined intrinsic radiance and the maximum combined intrinsic luminance may be measured by either removing the light-recycling envelope from illumination system 500 and measuring the resulting brightness or by replacing the light-recycling envelope in illumination system 500 with a light-transparent envelope and then measuring the resulting brightness.

The total light-emitting area of the light source is area $A_S$, which in this example is the light-emitting area of emitting layer 508 of LED 506. For examples of the first embodiment, the total light output area $A_O$ must be less than the total light-emitting area $A_S$ of the source in order for brightness enhancement to occur. For examples of the second embodiment, however, the critical reference area is the maximum cross-sectional area $A_E$ of the light-recycling envelope and not the area $A_S$ of the light source. Since $A_S$ is not the critical area in the second embodiment, the total light-emitting area $A_S$ of the light source may be less than the area $A_O$ of the light output aperture, may be equal to the area $A_O$ of the light output aperture or may be greater than the area $A_O$ of the light output aperture. In FIGS. 11A-11F, the area of LED 506 is shown for illustrative purposes to be less than the area $A_O$ of the light output aperture.

LED 506 has an emitting layer 508 and a reflecting layer 510. The emitting layer 508 emits light of a first wavelength range. Light may be emitted from emitting layer 508 through one or more surfaces of emitting layer 508 that are not in contact with reflecting layer 510. For example, light may be emitted through surface 512.

The light of a first wavelength range emitted by the emitting layer 508 is preferably greater than 200 nanometers in wavelength and less than 3000 nanometers in wavelength. More preferably, the light of a first wavelength range is greater than 200 nanometers in wavelength and less than 450 nanometers in wavelength.

The reflecting layer 510 of LED 506 is adjacent to and interior to the inside surface of the light-recycling envelope. The reflecting layer 510 reflects both light of a first wavelength range and light of a second wavelength range. The reflecting layer 510 may be a specular reflector or a diffuse reflector. In a typical inorganic light-emitting diode, the reflecting layer is usually a specular reflector. The light reflectivity of reflecting layer 510 of LED 506 is $R_S$. If the reflectivity varies across the area of the reflecting layer, the reflectivity $R_S$ is defined as the average reflectivity of the reflecting layer. As listed previously, the reflectivity $R_S$ of reflecting layer 510 is preferably at least 50%. More preferably, the reflectivity $R_S$ is at least 70%. Most preferably, the reflectivity $R_S$ is at least 90%. Ideally, the reflectivity $R_S$ should be as close to 100% as possible in order to maximize the efficiency and output brightness of the illumination system.

The wavelength conversion layer 514 is in contact with LED 506. When the wavelength conversion layer 514 covers all exposed surfaces of LED 506, light emitted by LED 506 in illumination system 500 must pass through the wavelength conversion layer 514 at least once in order to reach the light output aperture 504. As stated previously, when the wavelength conversion layer covers the emitting layer of an LED, the refractive index difference between the emitting layer and its surroundings is reduced. The reduction in the refractive index difference can increase the light emission from the emitting layer and improve the overall efficiency and output brightness of the illumination system. If desired, the refractive index of the wavelength conversion layer may be increased further to improve the light emission from the emitting layer by incorporating into the wavelength conversion layer ultrafine powders of materials having a bulk index of refractive greater than 1.60. Previously noted ultrafine powder materials include tin oxide, titanium dioxide, zinc oxide, cerium oxide and antimony pentoxide.

In order to explain the operation of illumination system 500, example light rays emitted from LED 506 are illustrated in FIGS. 11C, 11D, 11E and 11F.

Figure 11C:
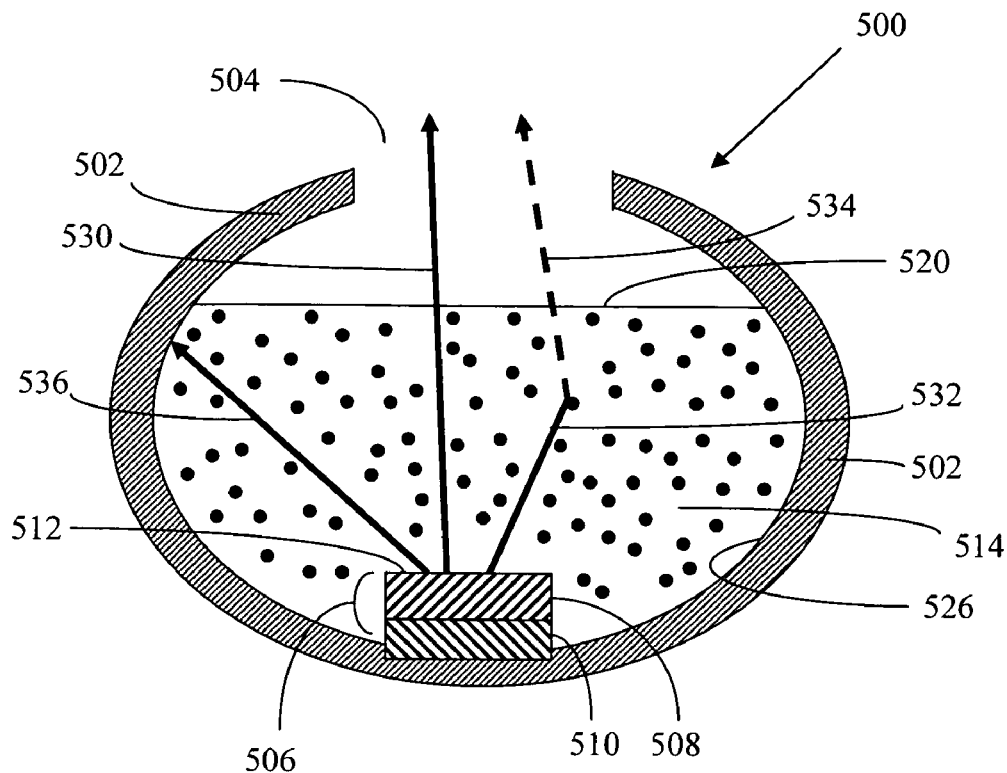
FIGS. 11C, 11D, 11E and 11F are cross-sectional side views in the I-I plane of the illumination system shown in FIGS. 11A and 11B and illustrate representative light rays.

In FIG. 11C, a first light ray 530 of a first wavelength range is emitted from surface 512 of emitting layer 508, passes through the wavelength conversion layer 514 and passes through the remainder of the interior of the light-recycling envelope to exit the light output aperture 504 without reflecting off the light-recycling envelope and without being converted by the wavelength conversion layer 514.

A second light ray 532 of a first wavelength range is emitted from surface 512 of emitting layer 508 and enters the wavelength conversion layer 514. The wavelength conversion layer 514 converts the light ray 532 of a first wavelength range into light ray 534 of a second wavelength range. The light ray 534 may be emitted in any direction by the wavelength conversion layer. Light ray 534 passes through the remainder of the wavelength conversion layer 514 and passes through the remainder of the interior of the light-recycling envelope 502 to exit the illumination system 500 through light output aperture 504 as light of a second wavelength range.

A third light ray 536 of a first wavelength range is emitted from surface 512 of emitting layer 508, passes through the wavelength conversion layer 514 without being converted, and is absorbed by the light-recycling envelope 502.

Each time a light ray of a first wavelength range passes through the wavelength conversion layer, the wavelength conversion layer converts a portion of the light of a first wavelength range into light of a second wavelength range, different from the light of the first wavelength range. Each time a light ray of a second wavelength range passes through the wavelength conversion layer, the light of a second wavelength range will be unaffected. The light of a second wavelength range will not alter its wavelength nor will additional wavelengths be formed.

The probability that a light ray of the first wavelength range will be converted to a light ray of a second wavelength range upon passage through the wavelength conversion layer depends on the type of material in the wavelength conversion layer, depends on the density of the powdered phosphor material, the quantum dot material or the luminescent dopant material within the layer and depends on the thickness of the wavelength conversion layer. The probability of wavelength conversion can be increased either by increasing the density of the powdered phosphor material, the quantum dot material or the luminescent dopant material within the wavelength conversion layer or by increasing the thickness of the layer. However, for some materials such as the quantum dot materials, increasing the density of the material lowers the conversion efficiency of the material due to particle-particle interactions. In such cases, a low quantum dot material density may be desired. Then, in order to achieve a high overall conversion efficiency for the illumination system, either a thicker wavelength conversion layer must be used or light recycling must be increased so that light of a first wavelength range can pass through the wavelength conversion layer many times.

In FIG. 11C, light ray 530 and light ray 536 are not converted to light of a second wavelength range. Light ray 532 of a first wavelength range is converted into light ray 534 of a second wavelength range. Overall, the wavelength conversion layer converts a portion of the light of a first wavelength range into light of a second wavelength range, different than the light of the first wavelength range.

Light ray 536 passes through the wavelength conversion layer and is absorbed by the light-recycling envelope 502. In general, the light-recycling envelope and the reflecting layer 510 are not perfect reflectors and each has a reflectivity less than 100%. Some of the light of a first wavelength range, such as light ray 536, and some of the light of a second wavelength range will be absorbed. Due to the absorption losses, only a fraction of the light of a first wavelength range that is inside the light-recycling envelope will exit the light-recycling envelope through the light output aperture 504. Likewise, only a fraction of the light of a second wavelength range that is inside the light-recycling envelope will exit the light-recycling envelope through the light output aperture 504.

Figure 11D:
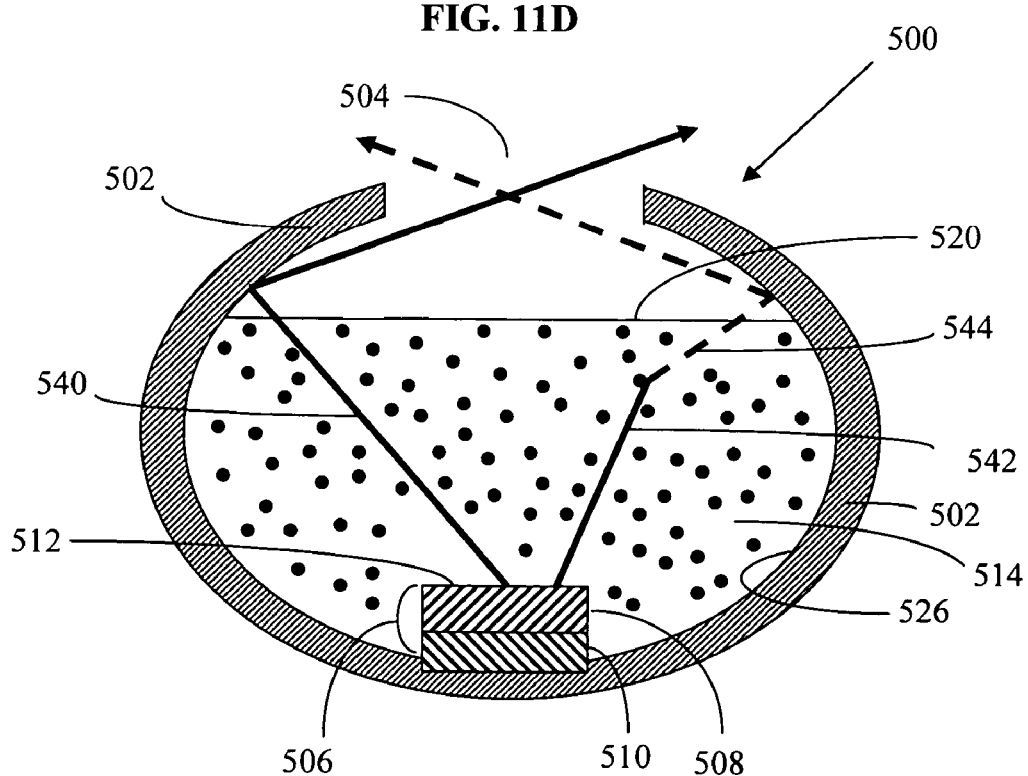

In FIG. 11D, a fourth light ray 540 of a first wavelength range is emitted from surface 512 of emitting layer 508, passes through the wavelength conversion layer 514 to the light-recycling envelope on the left side, is reflected by the light-recycling envelope and exits illumination system 500 through light output aperture 504 as light of a first wavelength range.

A fifth light ray 542 is emitted from surface 512 of emitting layer 508, passes through a part of the wavelength conversion layer 514 and is converted by the wavelength conversion layer 514 to light ray 544 of a second wavelength range. Light ray 544 passes through the remainder of the wavelength conversion layer 514, passes through the remainder of the light-recycling envelope 502, reflects off light-recycling envelope 502 and exits illumination system 500 through light output aperture 504 as light of a second wavelength range.

Light rays 540 and 544 in FIG. 11D illustrate rays that reflect one time inside the light-recycling envelope. In general, light rays may reflect many times inside the light-reflecting envelope before either exiting the illumination system through light output aperture 504 or being absorbed by the light-recycling envelope, the LED or the wavelength conversion material. A multitude of light pathways is possible. Light of a first wavelength range may be converted to light of a second wavelength range on the first pass through the wavelength conversion layer, may be converted only after many passes through the wavelength conversion layer, or may exit the illumination system without being converted. Light that has already been converted to light of a second wavelength range will not be converted again. The light-recycling envelope directs a part of the light of a first wavelength range through the wavelength conversion layer multiple times and increases the likelihood that the light of a first wavelength range will be converted to light of a second wavelength range.

Figure 11E:
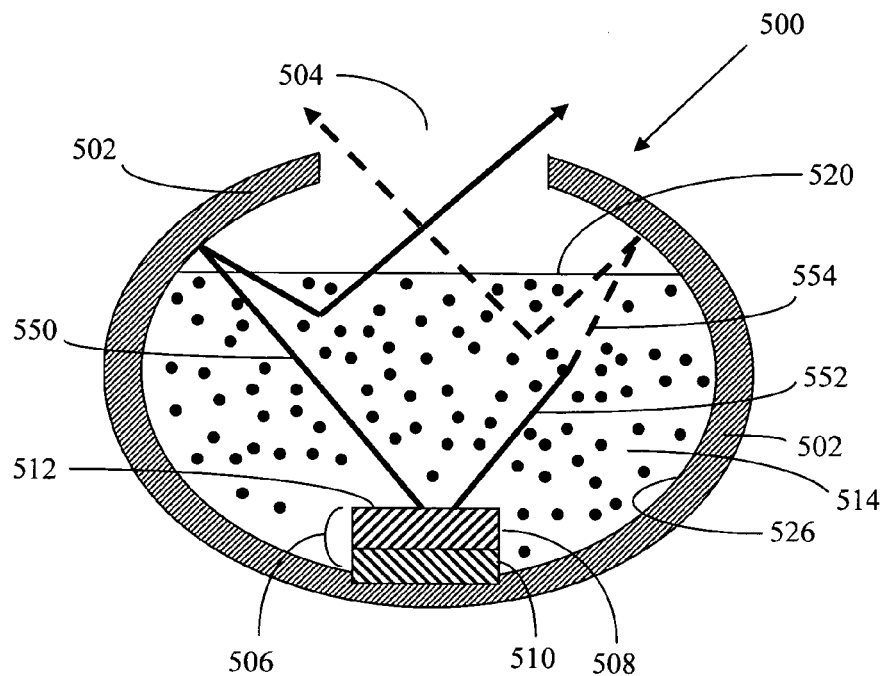
Figure 11F:
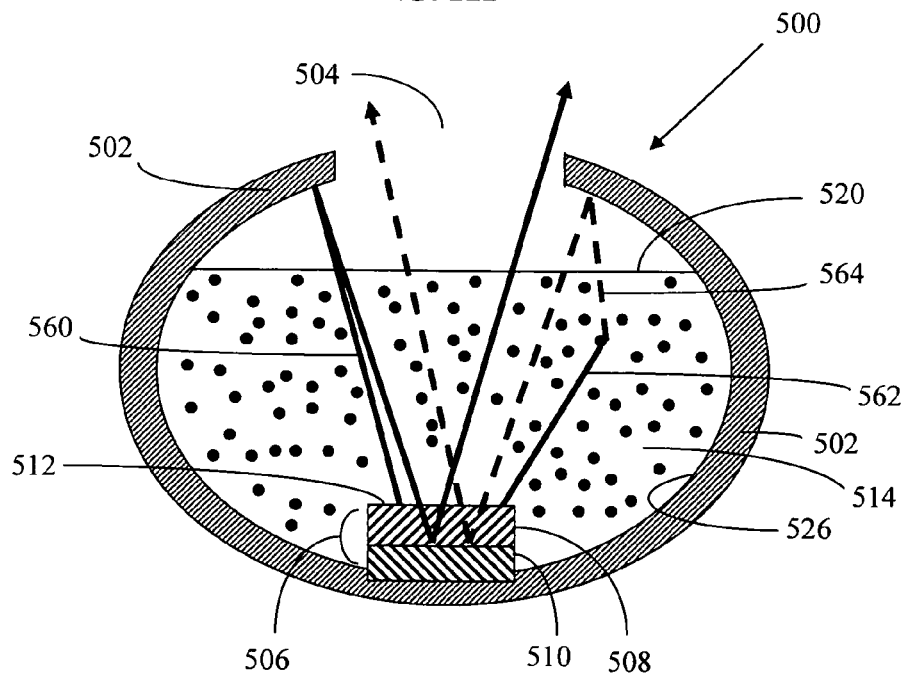

FIGS. 11E and 11F illustrate light rays that are recycled by the light-recycling envelope 502 in illumination system 500. The light-recycling envelope may recycle light rays back to the wavelength conversion layer 514 or to the reflecting layer 510.

A sixth light ray 550 of a first wavelength range is emitted from surface 512 of emitting layer 508 in a first time period, passes through the wavelength conversion layer 514 without being converted, passes through the remainder of the interior of the light-recycling envelope and is reflected and recycled back to the wavelength conversion layer 514 by the light-recycling envelope on the left side. The wavelength conversion layer 514 is a partial reflector in addition to its function of converting light. The wavelength conversion layer 514 may convert light ray 550 to light of a second wavelength range, may transmit ray 550 to the light-recycling envelope or may reflect light ray 550. In FIG. 11E, the wavelength conversion layer reflects light ray 550 in a second time period. The reflected light ray 550 then passes through the remainder of the wavelength conversion layer, passes through the remainder of the interior of the light-recycling envelope and exits the illumination system 500 through light output aperture 504 without being converted. As illustrated by light ray 550, the light-recycling envelope directs a part of the light of a first wavelength through the wavelength conversion layer multiple times and increases the likelihood that the light of a first wavelength range will be converted into light of a second wavelength range.

A seventh light ray 552 of a first wavelength range is emitted from surface 512 of emitting layer 508 in a first time period, passes part way through the wavelength conversion layer 514 and is converted to light ray 554. Light ray 554 may be emitted in any direction. In FIG. 11E, light ray 554 passes through the remainder of wavelength conversion layer 514 and reaches the light-recycling envelope on the right side. The light-recycling envelope reflects and recycles light ray 554 back to the wavelength conversion layer. The wavelength conversion layer 514 may transmit ray 554 to the light-recycling envelope or may reflect light ray 554. The wavelength conversion layer will not convert light ray 554 since light ray 554 has already be converted. In FIG. 11E, the wavelength conversion layer reflects light ray 554 in a second time period. The reflected light ray 554 then passes through the remainder of the wavelength conversion layer, passes through the remainder of the interior of the light-recycling envelope and exits the illumination system 500 through light output aperture 504 as light of a second wavelength range.

When the light rays 550 and 554 reflect off the wavelength conversion layer 514 during a second time period, the reflected rays 550 and 554 add to the light rays concurrently being emitted by emitting layer 508 of LED 506 and emitted by the wavelength conversion layer 514 during the second time period. The reflected light rays increase the combined exiting radiance and the combined exiting luminance of illumination system 500 so that, under some conditions, the combined exiting radiance and the combined exiting luminance can then be higher than the respective maximum combined intrinsic radiance and the maximum combined intrinsic luminance of illumination system 500 measured in the absence of light recycling.

In FIG. 11F, an eighth light ray 560 of a first wavelength range is emitted from surface 512 of emitting layer 508 in a first time period. Light ray 560 passes through the wavelength conversion layer 514 without being converted, passes through the remainder of the interior of the light-recycling envelope 502 and is reflected and recycled by the light-recycling envelope back to the wavelength conversion layer 514. Light ray 560 passes through the wavelength conversion layer 514 a second time without being converted, passes through surface 512 and the emitting layer 508, is reflected by reflecting layer 510 and then passes through the emitting layer 508 and through surface 512 during a second time period. Light ray 560 passes through the wavelength conversion layer a third time without being converted, passes through the remainder of the interior of the light-recycling envelope, and exits illumination system 500 through light output aperture 504 as light of a first wavelength range.

A ninth light ray 562 of a first wavelength range is emitted through surface 512 of emitting layer 508 in a first time period. Light ray 562 passes through a part of the wavelength conversion layer 514 and is converted by the wavelength conversion layer into light ray 564 of a second wavelength range. Light ray 564 passes through the remainder of wavelength conversion layer 514 and travels to the light-recycling envelope 502 on the right side. The light-recycling envelope 502 reflects and recycles light ray 564 back toward the wavelength conversion layer. Light ray 564 passes through the wavelength conversion layer, passes through surface 512 and through emitting layer 508, is reflected by reflecting layer 510 and passes through emitting layer 508 and surface 512 during a second time period. Light ray 564 then passes through the wavelength conversion layer and exits the illumination system 500 through the light output aperture 504 as light of a second wavelength range.

When the light rays 560 and 564 reflect off the light reflecting layer 510 and pass through emitting layer 508 and surface 512 during a second time period, the reflected rays 560 and 564 add to the light rays concurrently being emitted by emitting layer 508 of LED 506 and emitted by the wavelength conversion layer during the second time period. The reflected light rays increase the combined exiting radiance and the combined exiting luminance of illumination system 500 so that, under some conditions, the combined exiting radiance and the combined exiting luminance can then be higher than the respective maximum combined intrinsic radiance and the maximum combined intrinsic luminance of illumination system 500 measured in the absence of light recycling.

Light rays 530, 532, 534, 536, 540, 542 and 544 are not recycled back to the wavelength conversion layer 514 or to the light source. Light rays 550 and 554 are recycled back to the wavelength conversion layer 514. Light rays 560 and 564 are recycled back to reflecting layer 510 of LED 506. Overall, only part of the light of a first wavelength range and only part of the light of a second wavelength range are recycled back to the wavelength conversion layer or to the light source.

The light exiting the light output aperture 504 in FIGS. 11C-11F is a mixture of light of a first wavelength range and light of a second wavelength range. If both wavelength ranges are in the visible wavelength region of the optical spectrum, the mixture of light exiting the light output aperture will have a composite color. By changing the size of the light-recycling envelope, changing the thickness of the wavelength conversion layer, changing the composition of the wavelength conversion layer, changing the characteristics of the light source or changing the size of the light output aperture, the ratio of the flux of light of a first wavelength range to the flux of light of a second wavelength range can be varied. By varying this ratio, the color of the light exiting the light output aperture can be varied.

If the composite color exiting the light output aperture 504 is white light, the quality of the white light can be changed by varying the ratio of light of a first wavelength range to light of a second wavelength range exiting from the light output aperture. The quality of the white light can be described by a color-rendering index. A color-rendering index of 100 indicates that the white light shining on a colored surface will reproduce the surface colors as seen by the human eye in an identical manner as if light from the sun were shining on the surface. A color-rendering index less than 100 indicates that the white light shining on a colored surface will give an apparent surface color that appears different to the human eye than the color seen by the human eye using sunlight. By changing the size of the light-recycling envelope, changing the thickness of the wavelength conversion layer, changing the composition of the wavelength conversion layer, changing the characteristics of the light source or changing the size of the light output aperture, one can vary the number of times that light is recycled and thereby also vary the ratio of the flux of light of a first wavelength range to the flux of light of a second wavelength range that exits the light output aperture. By varying this ratio, the color-rendering index of the light exiting the light output aperture can be improved to achieve the maximum color-rendering index value allowed for the particular combination of the two wavelength ranges.

As stated previously, illumination system 500 has one light output aperture 504. The total light output aperture area is area $A_O$. It is also within the scope of this invention that illumination system 500 can have more than one light output aperture. If there is more than one light output aperture, the total light output aperture area is also defined as area $A_O$.

The output radiance of light exiting the light output aperture 504 is denoted as the combined exiting radiance, and includes both light of a first wavelength range and light of a second wavelength range. The output luminance of light exiting the light output aperture 504 is denoted as the combined exiting luminance, and includes both light of a first wavelength range and light of a second wavelength range.

To determine if illumination system 500 has enhanced output brightness, one must compare the combined output radiance or the combined output luminance of illumination system 500 to the respective maximum combined intrinsic radiance or maximum combined intrinsic luminance of a reference illumination system. As stated above, the reference illumination system for the second embodiment of this invention is the light source and the wavelength conversion material operating in combination with no light-recycling envelope present. Equivalently, the reference illumination system for the second embodiment is the light source and the wavelength conversion layer operating in combination but with the light-recycling envelope replaced by a light-transmitting envelope that transmits light. The reference LED in the reference illumination system is substantially identical to LED 506 and is operating at an electrical power that is substantially identical to the electrical power used to power LED 506.

In illumination system 500, part of the light of a first wavelength range emitted by LED 506 and part of the light of a second wavelength range emitted by the wavelength conversion layer 514 are recycled back to LED 506 and to the wavelength conversion layer to increase the combined radiance or the combined luminance of LED 506 and the wavelength conversion layer operating in combination. By this method, the combined exiting radiance of the light exiting the light output aperture 504 can also be increased to values greater than the maximum combined intrinsic radiance of the LED 506 and the wavelength conversion layer operating in combination in the absence of light recycling. Also by this method, the combined exiting luminance of the light exiting the light output aperture 504 can also be increased to values greater than the maximum combined intrinsic luminance of the LED 506 and the wavelength conversion layer operating in combination in the absence of light recycling.

As in illumination system 200, the maximum reflectivity of the inside surfaces of illumination system 500 and the resulting maximum values for the combined exiting radiance and the combined exiting luminance emitted from the light output aperture 504 are achieved by preferably having substantially all of the interior surfaces of illumination system 500 be reflective except for the total area $A_O$ of all the apertures in the light-recycling envelope. Illumination system 500 has one light output aperture 504.

The total inside area of the light-recycling envelope 502 is $A_T$. The LED light source has a reflecting layer having reflectivity $R_S$. The total light-emitting area of the light source is area $A_S$. In the example of FIGS. 11A-11F, area $A_S$ is the light-emitting area of LED 506, but for other examples having more than one LED, $A_S$ is the total light-emitting area of all the LEDs within the light-recycling envelope. The remaining inside area of the light-recycling envelope that is not covered by the total light-emitting area $A_S$ of the LED and the area $A_O$ of the output aperture or apertures is denoted as remaining area $A_R$. It is preferable that substantially all of remaining area $A_R$ of the light-recycling envelope have a reflective surface of reflectivity $R_E$ to maximize the radiance and luminance exiting from the light output aperture or apertures. As noted previously, the reflectivity $R_E$ is preferably at least 50%. More preferably, the reflectivity $R_E$ is at least 70%. Most preferably, the reflectivity $R_E$ is at least 90%.

As previously discussed, the wavelength conversion layer 514 may also reflect light. Light of a first wavelength range and light of a second wavelength range may be reflected by either the wavelength conversion layer or the light-recycling envelope 502. However, the reflectivity of the wavelength conversion layer 514 is generally less than the reflectivity $R_E$ of the light-recycling envelope 502. As long as the wavelength conversion layer has little absorption or no absorption, the total reflectivity of the part of the light-recycling envelope that is covered with the wavelength conversion layer will be substantially the same as the reflectivity $R_E$ of the part of the light-recycling envelope that is not covered by the wavelength conversion material.

For examples of the second embodiment, the critical reference area for determining if brightness enhancement can occur is the maximum cross-sectional area $A_E$ of the light-recycling envelope. In order to achieve radiance enhancement or luminance enhancement, the total output aperture area $A_O$ must be less than the maximum cross-sectional area $A_E$ of the light-recycling envelope.

The maximum theoretical value for brightness enhancement is achieved only if the LED is a Lambertian emitter and only if $R_S$ and $R_E$ each equal 100%. If the LED is not a perfect Lambertian emitter or if $R_S$ and $R_E$ are each less than 100%, as is normally the case, radiance or luminance enhancement can still be achieved but the magnitude of the enhancement will be reduced. The preferred values for $R_S$ and $R_E$ were listed previously. In such cases, the area $A_O$ may need to be significantly less than $A_E$ in order to achieve a combined exiting radiance that is greater than the maximum combined intrinsic radiance or to achieve a combined exiting luminance that is greater than the maximum combined intrinsic luminance. Preferably, the area $A_O$ of the light output aperture 504 is less than or equal to 50% of the maximum cross-sectional area $A_E$ of the light-recycling envelope. More preferably, the area $A_O$ is less than or equal to 30% of the maximum cross-sectional area $A_E$ of the light-recycling envelope. Most preferably, the area $A_O$ is less than or equal to 10% of the maximum cross-sectional area $A_E$ of the light-recycling envelope. In addition, for some applications it is desirable that the area $A_O$ of the light output aperture 504 be small and comparable in size to the area of an arc lamp source. For those applications, preferably the area $A_O$ of the light output aperture 504 is less than 25 mm² in area. More preferably, the area $A_O$ of the light output aperture 504 is less than 10 mm².

Figure 12:
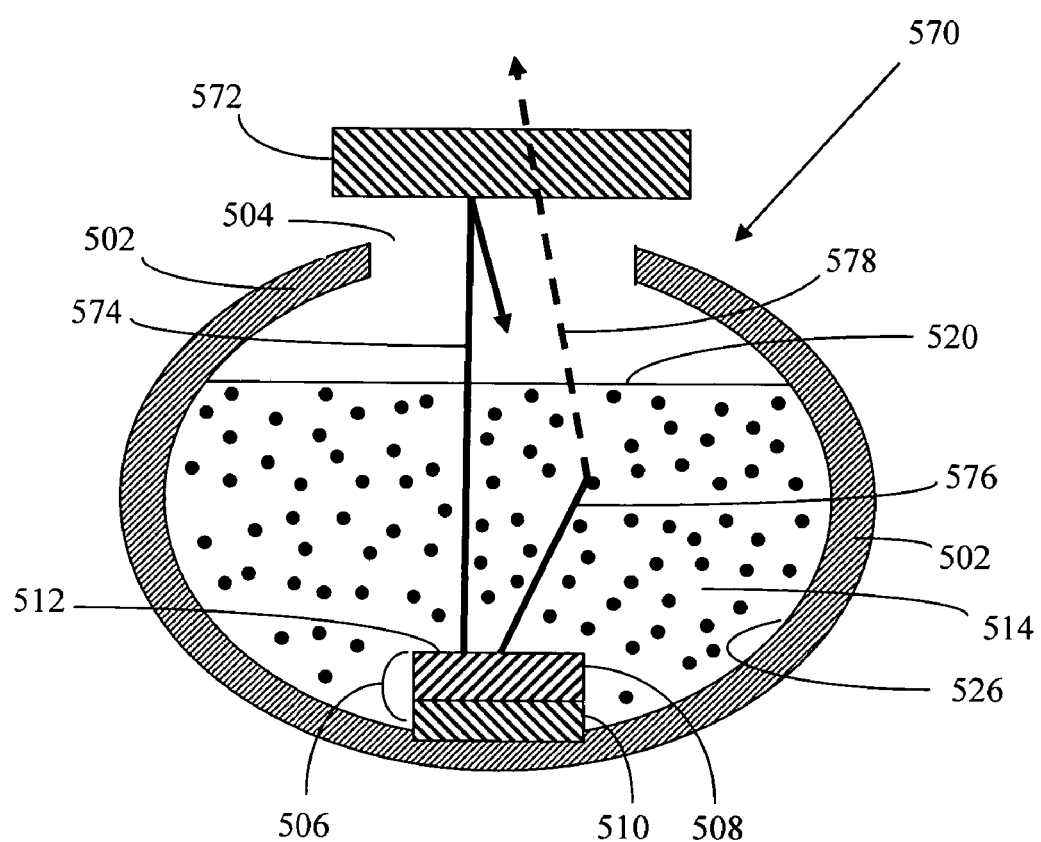
FIG. 12 is a cross-sectional side view of another embodiment of this invention that further comprises a dichroic mirror.

Another embodiment of this invention is illumination system 570 illustrated in cross-section in FIG. 12. Illumination system 570 is comprised of a light-recycling envelope 502, an LED 506, a wavelength conversion layer 514 and a partially reflecting optical element 572. Illumination system 570 is identical to illumination system 500 except for the addition of the partially reflecting optical element 572. Partially reflecting optical element 572 is preferably either a reflective polarizer or a dichroic mirror.

As stated previously, a reflective polarizer is a polarizer that reflects light of a first polarization state and transmits light of a second polarization state. Polarization states can be states of linear polarization or states of circular polarization. Examples of suitable reflective polarizers were previously listed. The reflective polarizer is placed adjacent to the light output aperture 504 and placed in the optical path of light exiting from the light output aperture 504. The adjacent position of the reflective polarizer can be either just outside the light-recycling envelope or just inside the light-recycling envelope. The reflective polarizer reflects both light of a first wavelength range and light of a second wavelength range that have a first polarization state. Also, the reflective polarizer transmits both light of a first wavelength range and light of a second wavelength range that have a second polarization state. The light of a first polarization state, either light of a first wavelength range or light of a second wavelength range, is recycled back into the light-recycling envelope. The light of a first polarization state that is recycled back into the light-recycling envelope will, after multiple reflections, be converted into a mixture of light of a first polarization state and light of a second polarization state. The converted light of a second polarization state will then be able to pass through the reflecting polarizer. If only the second polarization state is desired for the output of illumination system 570, recycling the first polarization state back into the light-reflecting envelope 502 to be converted to light of a second polarization state will improve the overall efficiency and output brightness of illumination system 570.

Some illumination system applications require polarized light. For example, flat-panel display or projection display applications that incorporate liquid crystal display (LCD) panels or liquid-crystal-on-silicon (LCOS) display panels require polarized light.

As stated previously, a dichroic mirror is, for example, a mirror that can reflect light of a first wavelength range and transmit light of a second wavelength range. Dichroic mirrors may be utilized if light of a first wavelength range emitted by LED 506 is not desired in the light output from the light-recycling envelope. Dichroic mirrors are commonly constructed by alternately depositing layers of two transparent dielectrics having different indexes of refraction onto a transparent substrate. Examples of materials used for dielectric coating layers include silicon dioxide, titanium dioxide or magnesium fluoride.

When the partially transparent optical element 572 is a dichroic mirror, the dichroic mirror is placed adjacent to the light output aperture 504 and placed in the optical path of light exiting from the light output aperture 504. The adjacent position of the dichroic mirror can be either just outside the light-recycling envelope or just inside the light-recycling envelope. In FIG. 12, the partially reflecting optical element is a dichroic mirror and is positioned just outside the light output aperture 504.

The function of the dichroic mirror in FIG. 12 is illustrated using light rays 574, 576 and 578. Light ray 574 of a first wavelength range is emitted from surface 512 of emitting layer 508, passes through the wavelength conversion layer 514 and the interior of the light-recycling envelope 502 and passes through the light output aperture 504 a first time to reach the partially reflecting optical element 572, which in this example is a dichroic mirror. Light ray 574 reflects off the dichroic mirror, passes through the light output aperture 504 a second time and is recycled back into the interior of the light-recycling envelope 502.

Light ray 576 of a first wavelength range is emitted from surface 512 of emitting layer 508 and passes through a part of the wavelength conversion layer 514. The wavelength conversion layer 514 converts light ray 576 of a first wavelength range into light ray 578 of a second wavelength range. Light ray 578 may be emitted in any direction. In this example, light ray 578 passes through the remainder of the wavelength conversion layer, passes through the remainder of the interior of the light-recycling envelope 502, passes through the light output aperture 504 and passes through the partially reflecting optical element 572, which is the dichroic mirror.

Overall, the dichroic mirror transmits light of a second wavelength range and reflects light of a first wavelength range back into the light-recycling envelope. The wavelength conversion layer can convert the light of a first wavelength range that is recycled back into the light-recycling envelope into light of a second wavelength range. The converted light of a second wavelength range can then pass through the dichroic mirror. If only light of a second wavelength range is desired for the output of illumination system 570, recycling the light of a first wavelength range back into the light-reflecting envelope to be converted into light of a second wavelength range will improve the overall efficiency and output brightness of illumination system 570.

Figure 13:
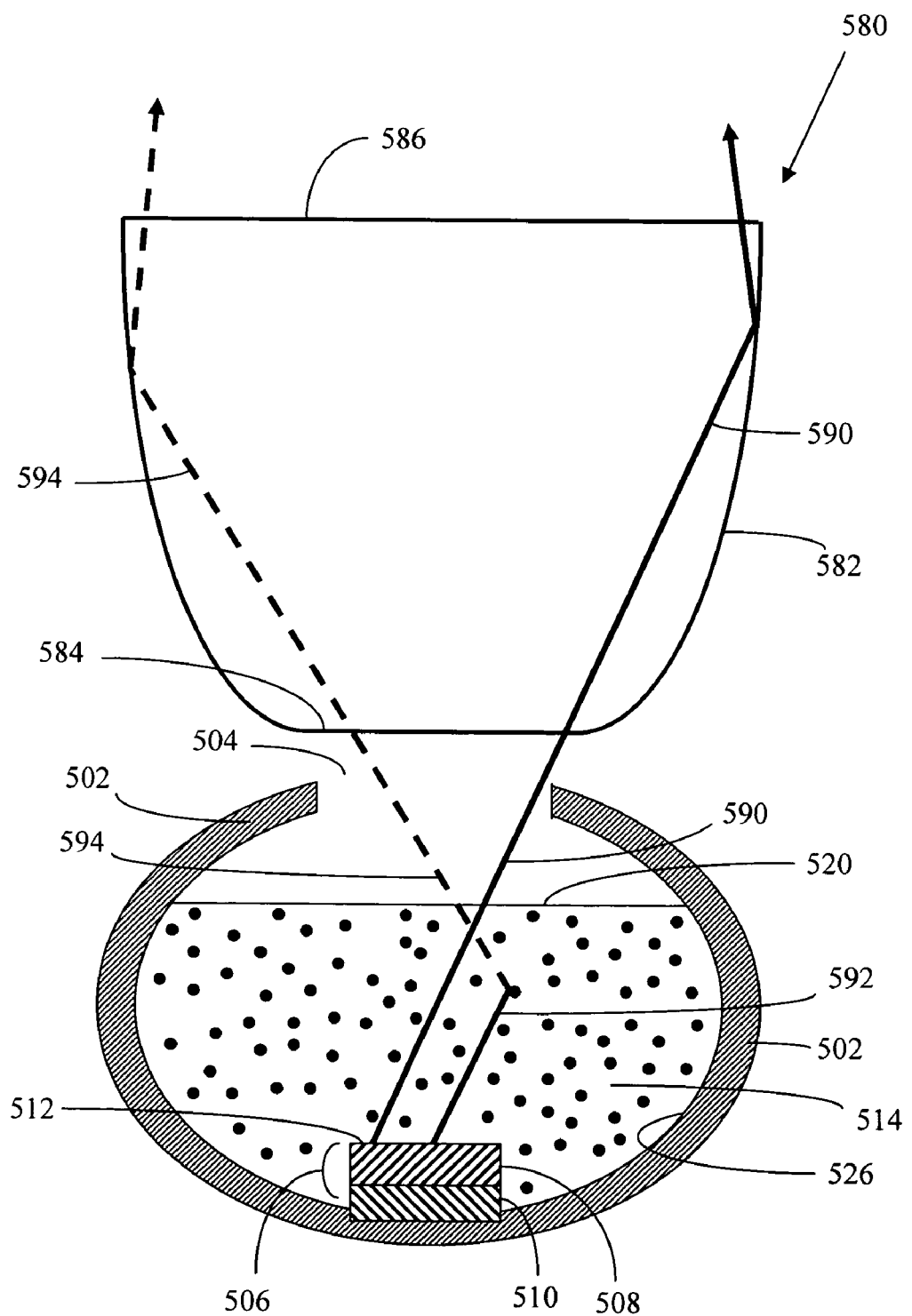
FIG. 13 is a cross-sectional side view of another embodiment of this invention that further comprises a light-collimating element.

Another embodiment of this invention is illumination system 580 shown in cross-section in FIG. 13. Illumination system 580 is identical to illumination system 500 except that illumination system 580 further comprises a light-collimating element 582. Light-collimating element 582 can be any optical element that at least partially collimates the light exiting from the light output aperture 504. For example, the light-collimating element can be a convex lens, a tapered light guide, or a compound parabolic reflector.

In FIG. 13, light-collimating element 582 is a compound parabolic reflector for illustrative purposes. Compound parabolic reflectors have been described previously. Light-collimating element 582 has an input surface 584 and an output surface 586. In order for the light-collimating element to partially collimate the light exiting the light output aperture 504, the area of input surface 584 must be less than the area of the output surface 586. Equation 7 gives the mathematical relationship between the input and output areas and the input and output angular distributions of the light.

Representative light rays 590, 592 and 594 are shown in FIG. 13 to illustrate the function of the light-collimating element 582 when light-collimating element 582 is a compound parabolic reflector. Light ray 590 of a first wavelength range is emitted from surface 512 of emitting layer 508, passes through the wavelength conversion layer 514 and the interior of the light-recycling envelope 502, passes through the light output aperture 504 and passes through input surface 584 of the compound parabolic reflector as uncollimated light. Light ray 590 is reflected by the sides of the compound parabolic reflector and exits the compound parabolic reflector through output surface 586 as partially collimated light.

Light ray 592 of a first wavelength range is emitted from surface 512 of emitting layer 508 and passes through part of the wavelength conversion layer 514. The wavelength conversion layer 514 converts light ray 592 of a first wavelength range into light ray 594 of a second wavelength range. Light ray 594 passes through the remainder of the wavelength conversion layer and the remainder of the interior of the light-recycling envelope 502, passes through the light output aperture 504 and enters the compound parabolic reflector through input surface 584. Light ray 594 is reflected by the sides of the compound parabolic reflector and exits the compound parabolic reflector through output surface 586 as partially collimated light. The preferences for the degree of light collimation have been described previously in the explanation for FIG. 7.

Figure 14:
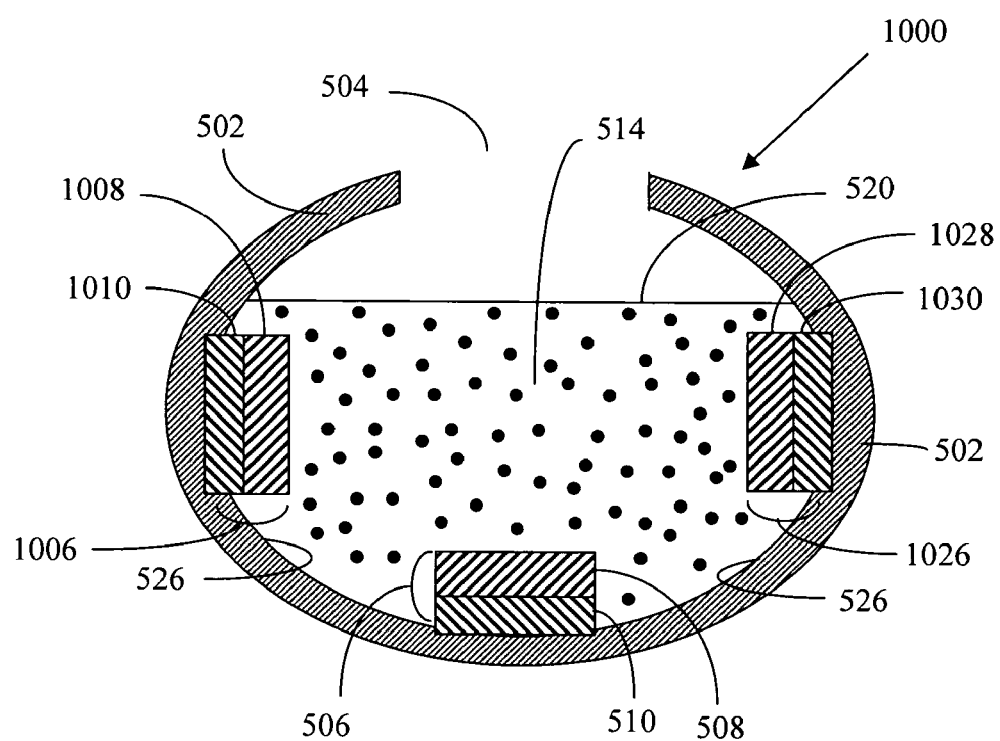
FIG. 14 is a cross-sectional side view of another embodiment of this invention that has three light-emitting diodes and a wavelength conversion layer.

The examples of the second embodiment shown in FIGS. 11-13 are illustrated with one LED 506 as the light source. However, embodiments of this invention may incorporate more than one LED. FIG. 14 illustrates illumination system 1000, which has a light source consisting of three LEDs and where each LED reflects light. The total light-emitting area of the light source is the total light-emitting area of the three LEDs and is area $A_S$. Illumination system 1000 is identical to illumination system 500 except that illumination system 1000 has two additional LEDs, LED 1006 and LED 1026. LED 1006 may emit light of a first wavelength range or LED 1006 may emit light of a third wavelength range, where the light of a third wavelength range is different from the light of the first and second wavelength ranges. LED 1026 may emit light of a first wavelength range, LED 1026 may emit light of a third wavelength range, different from the light of the first and second wavelength ranges, or LED 1026 may emit light of a fourth wavelength range, different from the light of the first, second and third wavelength ranges.

In FIG. 14, some of the light emitted from LED 1006, LED 1026 and the wavelength conversion layer 514 is directed to or recycled back to LED 506 and is reflected by LED 506 to increase the effective brightness of LED 506. Similarly, some of the light emitted from LED 506, LED 1026 and the wavelength conversion layer 514 is directed to or recycled back to LED 1006 and is reflected by LED 1006 to increase the effective brightness of LED 1006. In addition, some of the light emitted by LED 506, LED 1006 and the wavelength conversion layer 514 is directed to or recycled back to LED 1026 and is reflected by LED 1026 to increase the effective brightness of LED 1026.

If LED 1006 or LED 1026 emits light of a first wavelength range, then the additional light of a first wavelength range adds to the light of a first wavelength range that is emitted by LED 506. The wavelength conversion layer 514 will convert a portion the light of a first wavelength range from each LED that emits light of a first wavelength range into light of a second wavelength range. Adding an additional LED that emits light of a first wavelength range to the illumination system will increase the light flux and light brightness of the light of a first wavelength range and the light of a second wavelength range exiting the light output aperture 504.

If LED 1006 or LED 1026 emits light of a third wavelength range, the wavelengths of the light of a third wavelength range may be shorter than the wavelengths of the light of a first wavelength range or the wavelengths of the light of a third wavelength range may be longer than the wavelengths of the light of a second wavelength range. If the wavelengths of the light of a third wavelength range are shorter than the wavelengths of the light of a first wavelength range, the wavelength conversion layer may convert a portion of the light of a third wavelength range into light of a second wavelength range. If the wavelengths of the light of a third wavelength range are longer than the wavelengths of the light of a second wavelength range, the wavelength conversion layer will not convert the light of a third wavelength range into other wavelengths.

If LED 1006 or LED 1026 emits light of a third wavelength range, the light of a third wavelength range can be emitted concurrently with the light of a first wavelength range emitted by LED 506 and the light of a second wavelength range emitted by the wavelength conversion layer. A fraction of the light of a first wavelength range, a fraction of the light of a second wavelength range and a fraction of the light of a third wavelength range will exit the light output aperture 504 as light of a composite color. By adjusting the electrical power for LED 1006 or LED 1026 relative to the electrical power for LED 506, the flux of light of a third wavelength range emitted from LED 1006 or LED 1026 can be varied relative to the flux of light of a first wavelength range emitted from LED 506. By varying the flux of the light of a third wavelength range emitted from LED 1006 or LED 1026, the composite color of the light exiting the light output aperture and the color-rendering index of the light exiting the light output aperture can be adjusted as desired. In particular, the color-rendering index can be adjusted to achieve the maximum value possible for the exiting wavelengths.

Alternatively, LED 1006 or LED 1026 can emit light of a third wavelength range in a first time period and a fraction of the light of third wavelength range exits the light output aperture 504 in the first time period. In the first time period, LED 506 is not powered and does not emit light. In a second time period, different than the first time period, LED 506 emits light of a first wavelength range and a portion of the light of a first wavelength range is converted to light of second wavelength range. A fraction of the light of a first wavelength range and a fraction of the light of a second wavelength range exit the light output aperture 504 in the second time period. In the second time period, the LED that emits light of a third wavelength range is not powered and does not emit light. The first and second time periods do not overlap. The respective light emissions in the first time period and the second time period are then repeated in sequence. The resulting light exiting the light output aperture alternates in color. Note that if one LED is not powered and does not emit light, it still functions as a reflector with the reflecting layer reflecting light incident upon the LED.

If LED 1026 emits light of a fourth wavelength range, different from the light of the first, second and third wavelength ranges, the light of a fourth wavelength range may be emitted concurrently with the light of the other LEDs or the light may be emitted in time periods different than the time periods for light emission from LED 506 and LED 1006.

In FIGS. 11-14, the light source is positioned inside the light-recycling envelope. The light-recycling envelope encloses the light source and the wavelength conversion layer. It is also within the scope of the second embodiment of this invention that a part of the light source may be located outside the light-recycling envelope as previously described in FIGS. 10A, 10B and 10C for examples of the first embodiment. In such cases, the light-recycling envelope partially encloses the light source but does not enclose the entire light source. Examples of illumination systems where a part of the light source is located outside the light-recycling envelope are shown in the cross-sectional views in FIGS. 15 and 16.

Figure 15:
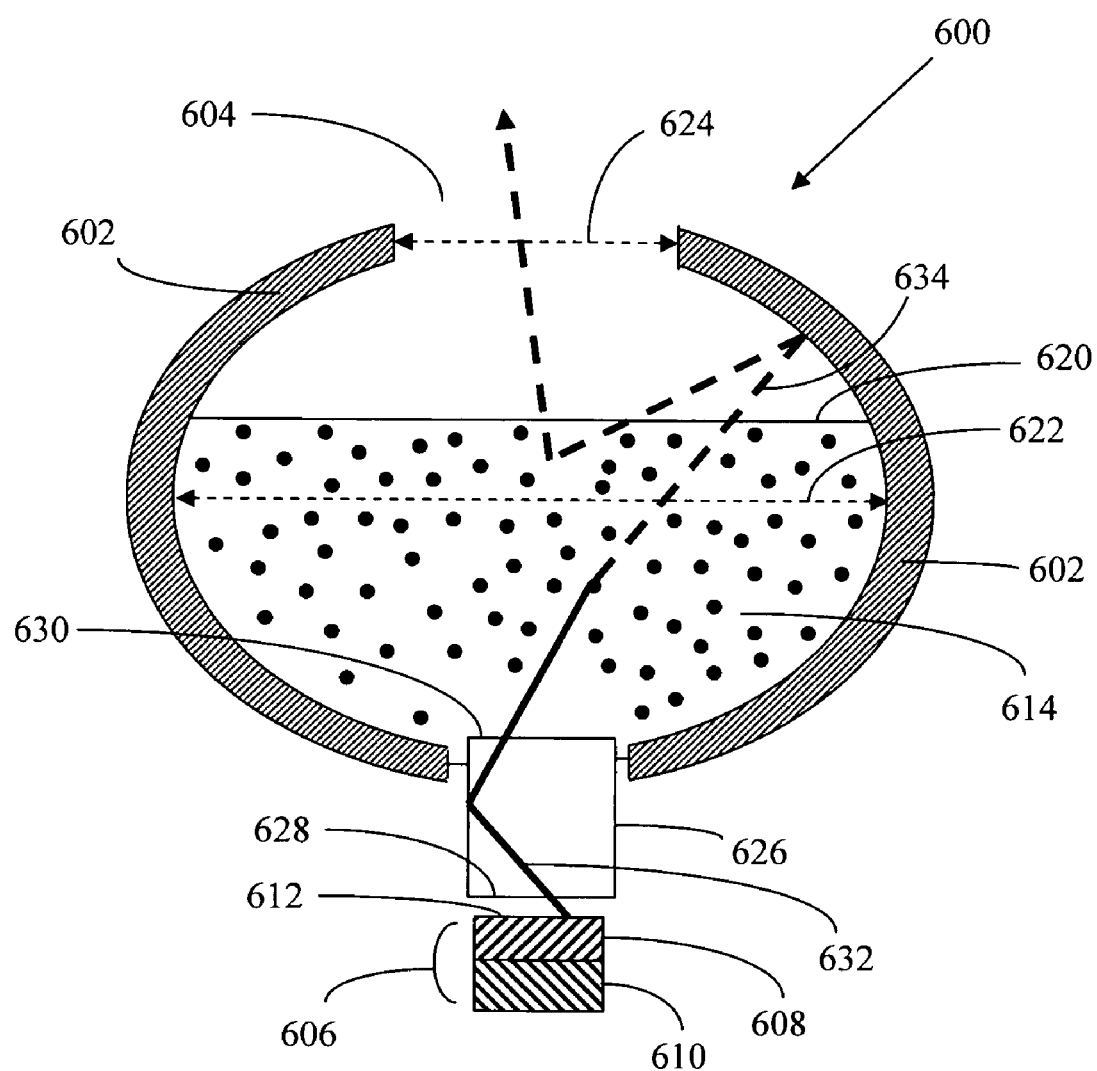
FIG. 15 is cross-sectional side view of another embodiment of this invention that further comprises a light guide.

FIG. 15 shows a cross-sectional view of illumination system 600. Illumination system 600 is similar to illumination system 500 except that the light source for illumination system 600 comprises a light guide 626 in addition to an LED 606. LED 606 has an emitting layer 608 and a reflecting layer 610. Illumination system 600 also comprises a light-recycling envelope 602, a wavelength conversion layer 614 and a light output aperture 604. The characteristics and properties of elements 606, 608, 610, 602, 614 and 604 are identical to the characteristics and properties of the respective elements in illumination system 500. The light-recycling envelope 602 has a maximum cross-sectional area $A_E$. The light source, comprising LED 606 and light guide 626, and the wavelength conversion layer 614 operating in combination have a maximum combined intrinsic radiance and a maximum combined intrinsic luminance in the absence of light recycling.

Light guide 626 is located between the LED 606 and the light-recycling envelope. Light guide 626 has an input surface 628 adjacent to the surface 612 of emitting layer 608 of LED 606 and an output surface 630 located inside the light-recycling envelope 602. The light guide can be a solid light guide that guides light by total internal reflection. Alternatively, the light guide can be a solid or hollow light guide that has reflecting coatings on the sides to guide the light. Preferably the area of the input surface 628 is greater than the area of surface 612 of the LED 606 so that substantially all of the light emitted through the surface 612 of LED 606 will enter light guide 626. If the light guide is a solid light guide that guides light by total internal reflection, preferably there is gap between the surface 612 of LED 606 and the input surface 628 of light guide 626 and preferably the refractive index of the gap is less than the refractive index of the light guide. If such a gap exits and the gap has a refractive index sufficiently smaller than the refractive index of the light guide, light emitted from surface 612 at large angles, i.e. angles greater than about 45 degrees from the direction perpendicular to surface 612, will still be accepted into light guide 626, will be guided through the light guide at angles less than about 45 degrees to the direction perpendicular to surface 628 and then will be directed into the light-recycling envelope. Conversely, if no gap exists between surface 612 and surface 628, light emitted from surface 612 at angles greater than about 45 degrees from the direction perpendicular to surface 612 probably will not be guided by light guide 626 into the light-recycling envelope 602 and will be lost.

Light guide 626 transports light of a first wavelength range emitted by emitting layer 608 of LED 606 from LED 606 into the light-recycling envelope 602. In addition, light guide 626 transports light of a first wavelength range and light of a second wavelength range from the light-recycling envelope 602 to the reflecting layer 610 of LED 606 as recycled light. And finally, light guide 626 transports the recycled light reflected by the reflecting layer 610 back into the light-recycling envelope. Recycled light of a first wavelength range and recycled light of a second wavelength range reflected from reflecting layer 610 will increase the effective brightness of LED 606 and improve the efficiency and output brightness of illumination system 600.

As noted previously, the reflectivity $R_E$ of the light-recycling envelope 602 is preferably at least 50%. More preferably, the reflectivity $R_E$ is at least 70%. Most preferably, the reflectivity $R_E$ is at least 90%. Also as previously discussed, the reflectivity $R_S$ of the reflecting layer 610 is preferably at least 50%. More preferably, the reflectivity $R_S$ is at least 70%. Most preferably, the reflectivity $R_S$ is at least 90%. The total output aperture area of output aperture 604 is area $A_O$. As in illumination system 500, when $A_O$ is less than $A_E$ and when $R_S$ and $R_E$ are each greater than 50%, it is possible for the combined exiting radiance of illumination system 600 to be greater than the maximum combined intrinsic radiance of the light source, comprising LED 606 and light guide 626, and the wavelength conversion layer 614 operating in combination. It is also possible for the combined exiting luminance of illumination system 600 to be greater than the maximum combined intrinsic luminance of the light source, comprising LED 606 and light guide 626, and the wavelength conversion layer 614 operating in combination.

Example rays 632 and 634 illustrate part of the function of light guide 626 and also illustrate an example of light recycling. Light ray 632 is emitted from surface 612 of emitting layer 608 in a first time period, enters light guide 626 through input surface 628, is reflected by the sides of light guide 626 and exits light guide 626 through output surface 630. Light ray 632 passes through part of the wavelength conversion layer 614. Wavelength conversion layer 614 converts light ray 632 of a first wavelength range into light ray 634 of a second wavelength range. Light ray 634 passes through the remainder of wavelength conversion layer 614, passes through part of the interior of the light-recycling envelope 602 and is reflected and recycled back to the wavelength conversion layer 614 by the light-recycling envelope. Light ray 634 reenters the wavelength conversion layer 614. Light ray 634 may now take one of many pathways. For example, the wavelength conversion layer 614 could reflect light ray 634, light ray 634 could pass through the wavelength conversion layer and be reflected by the light-recycling envelope, or light ray 634 could pass through the wavelength conversion layer and the light guide 626, be reflected by reflecting layer 610 of LED 608 and return through light guide 626 to the wavelength conversion layer 614. In FIG. 15, light ray 634 is reflected by wavelength conversion layer 614 in a second time period and exits the light output aperture 604 as light of a second wavelength range.

When light ray 634 is recycled back to the wavelength conversion layer 614 or to the reflecting layer 610 of LED 608 in a second time period, light ray 634 adds to the light concurrently being emitted by LED 608 and the wavelength conversion layer 614 in the second time period. When such recycling occurs, it is possible for the combined exiting radiance of light exiting the light output aperture 604 to be greater than the maximum combined intrinsic radiance of the light source and the wavelength conversion layer operating in combination in the absence of recycling. In addition, it is possible for the combined exiting luminance of light exiting the light output aperture 604 to be greater than the maximum combined intrinsic luminance of the light source and the wavelength conversion layer operating in combination in the absence of recycling.

The light guide 626 may be constructed from any solid material that is transparent to light of a first wavelength range and to light of a second wavelength range and that transports light by total internal reflection. Possible materials include inorganic glasses such as silicon dioxide and plastics such as polymethymethacrylate and fluoroacrylates. If LED 606 emits light in a Lambertian or near-Lambertian output angular distribution, a light guide 626 that guides light by total internal reflection may need to be a straight light guide in order to prevent light leakage from the sides of the light guide. Alternatively, the light guide 626 may also be a solid or hollow structure where the sides, but not the ends, of the structure are coated with a light reflecting material. If the sides of a light guide are coated with a reflective material, the light guide may be a curved light guide and still efficiently transport light emitted by a Lambertian emitter.

In illumination system 600, the LED is removed from the inside of the light-recycling envelope. As discussed previously, LEDs generate considerable heat during operation. Removing the LED from the light-recycling envelope lowers the temperature inside the light-recycling envelope. Lowering the temperature is advantageous, especially when multiple LEDs are required for the illumination system. Placing multiple LEDs away from the light-recycling envelope will allow the LEDs to be operated in a potentially cooler environment, which will increase the light output and the operating lifetime of the LEDs.

Figure 16:
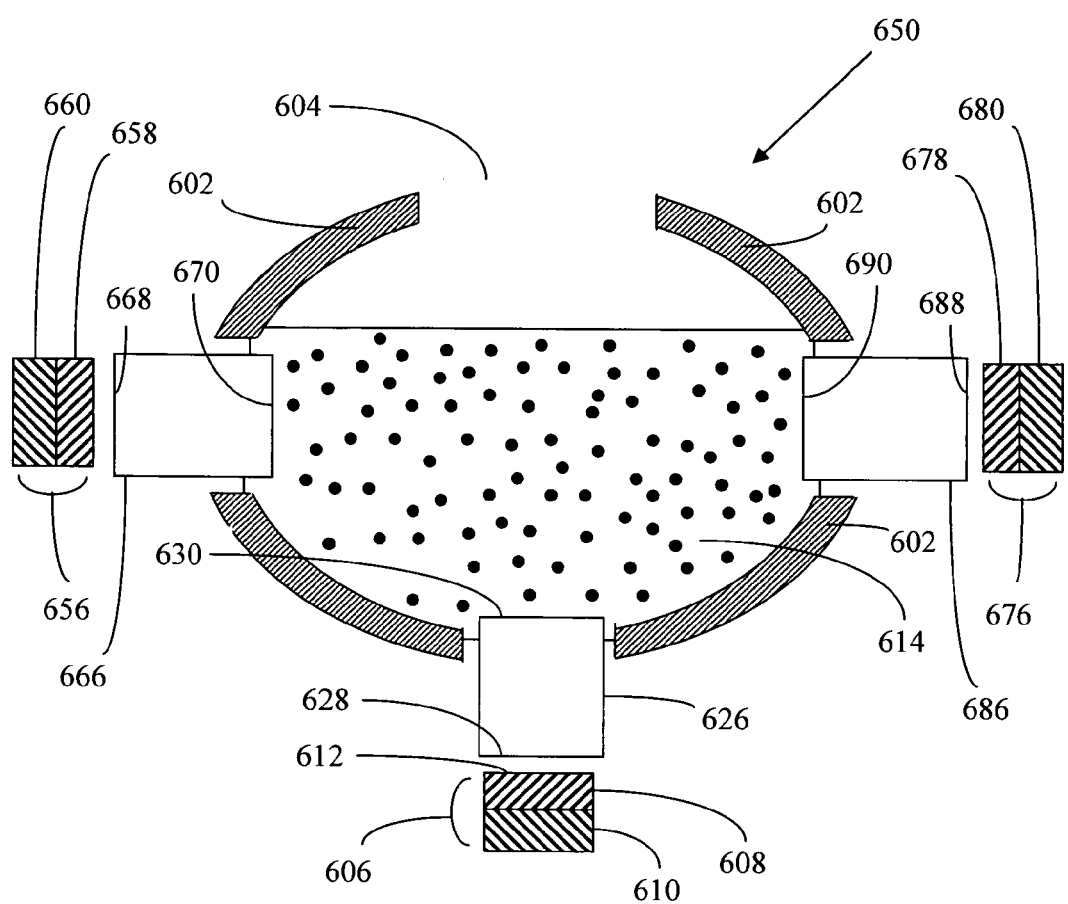
FIG. 16 is a cross-sectional side view of another embodiment of this invention that incorporates three light guides and three light-emitting diodes.

Another embodiment of this invention, illumination system 650 in FIG. 16, is identical to illumination system 600, except that illumination system 650 includes two additional light guides, light guide 666 and light guide 686, and two additional LEDs, LED 656 and LED 676. The additional LEDs and light guides may be required if higher light output flux is needed exiting the light output aperture 604.

Figure 18:
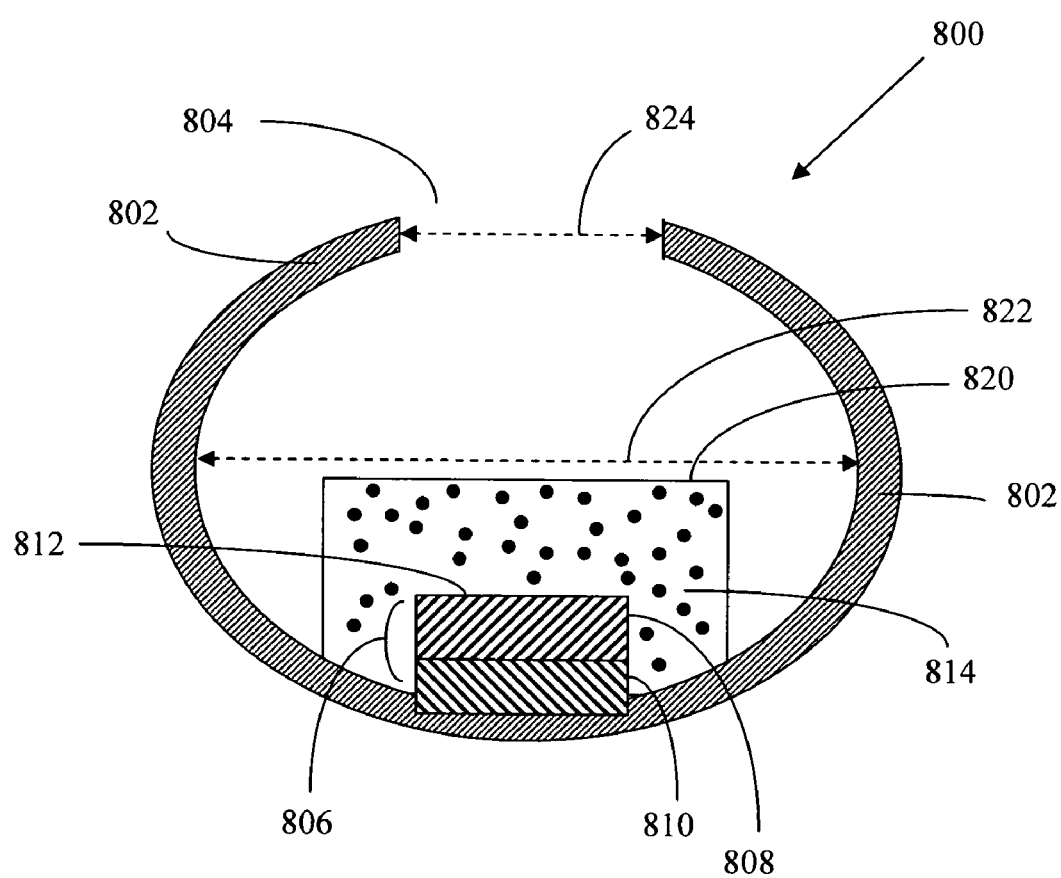
Figure 19:
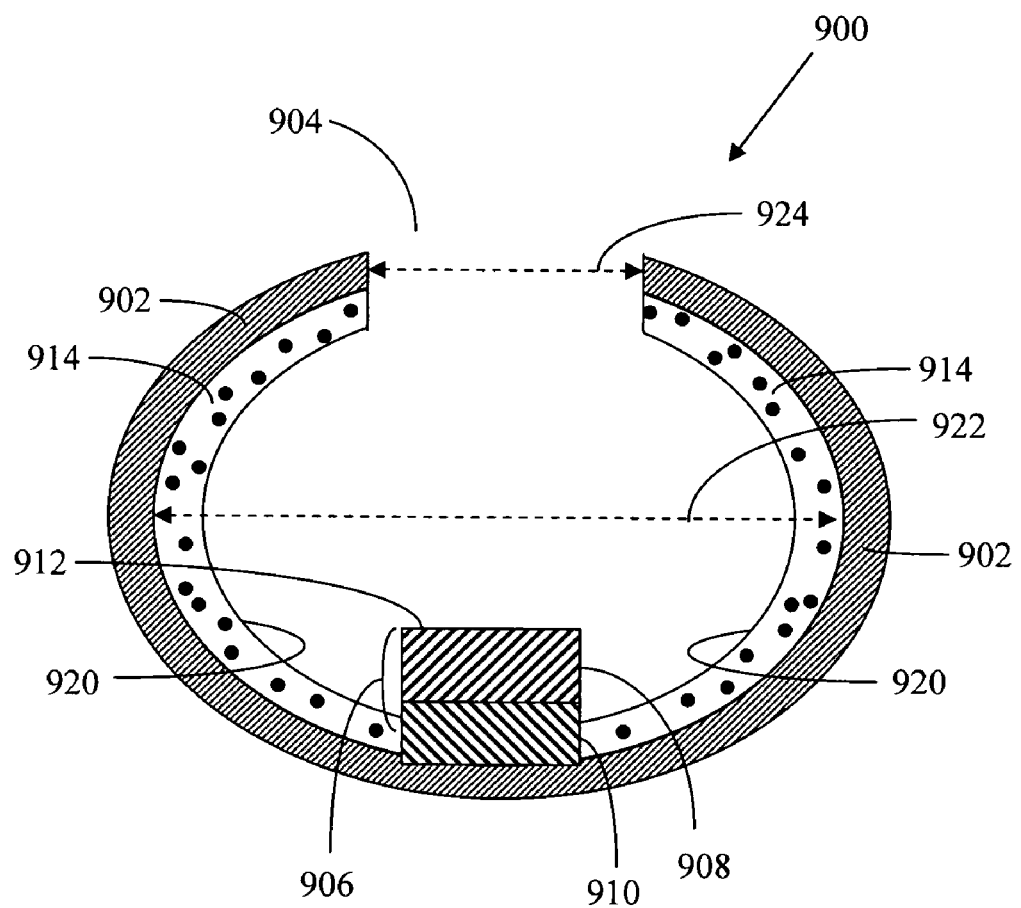

In the illumination systems illustrated in FIGS. 11-16, the wavelength conversion layer 514 or 614 fills a substantial portion of the light-recycling envelope. It is also within the scope of this invention that the wavelength conversion layer can have different configurations or shapes. Representative examples are shown in FIGS. 17, 18 and 19.

Figure 17:
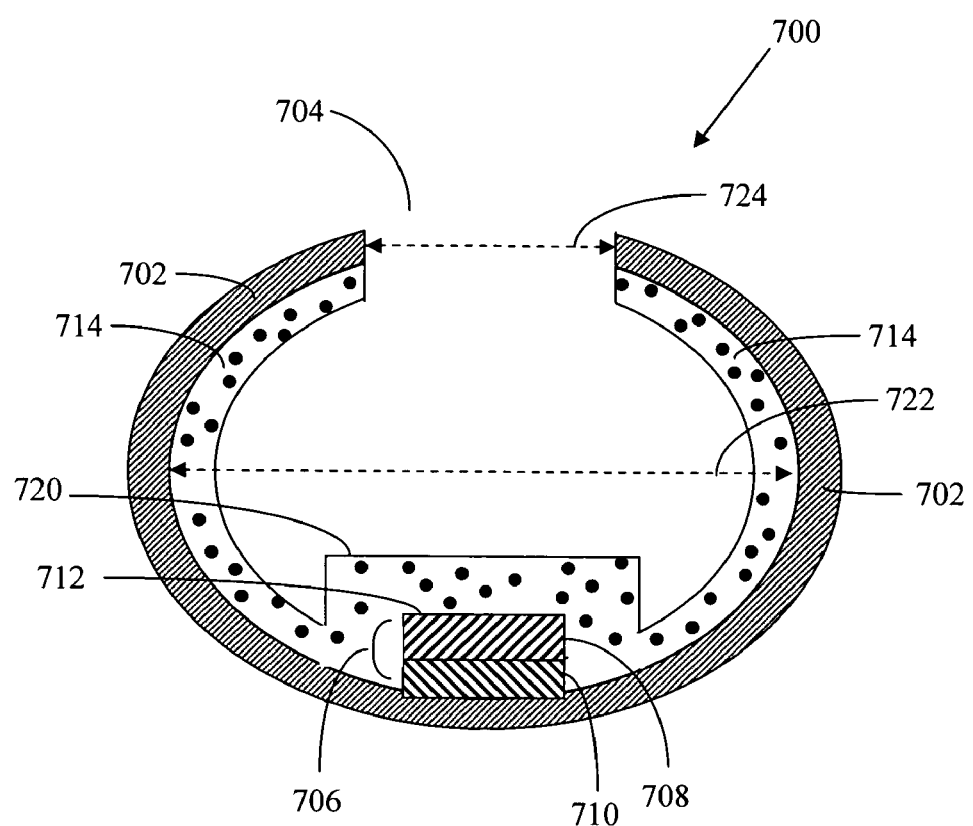
FIGS. 17, 18 and 19 are cross-sectional side views of other embodiments of this invention where the wavelength conversion layer is a coating.

In the cross-sectional view shown in FIG. 17, wavelength conversion layer 714 of illumination system 700 coats the exposed surfaces of LED 706 and the inside surfaces of the light-recycling envelope 702 not occupied by the LED 706 and the light output aperture 704. The wavelength conversion layer 714 may coat only a part or substantially all of the exposed surface of LED 706, and the wavelength conversion layer 714 may coat only a part or substantially all of the inside surfaces of the light-recycling envelope 702 not occupied by the LED 706 or the light output aperture 704.

The LED 706 is comprised of emitting layer 708 and reflecting layer 710. The reflectivity of reflecting layer 710 is $R_S$. Preferred values for $R_S$ were listed previously. The LED 706 and the wavelength conversion layer 714 operating in combination have a maximum combined intrinsic radiance and a maximum combined intrinsic luminance in the absence of recycling. The absence of recycling is achieved if the light-recycling envelope is removed or if the light-recycling envelope is replaced with a light-transmitting envelope that transmits light of a first wavelength range and light of a second wavelength range.

The light-recycling envelope has a maximum cross-sectional area $A_E$. The reflectivity of the inside surfaces of the light-recycling envelope not occupied by the LED 706 and the light output aperture 704 is reflectivity $R_E$. Preferred values for $R_E$ were listed previously. The light-recycling envelope reflects and recycles light emitted by LED 706 and the wavelength conversion layer 714 back to the LED 706 and the wavelength conversion layer 714. The recycled light will add to the light concurrently being emitted by the LED 706 and the wavelength conversion layer and, in turn, increase the combined exiting radiance and combined exiting luminance of light of a first wavelength range and light of a second wavelength range exiting the light output aperture 704.

The characteristics and properties of the LED 706, emitting layer 708, reflecting layer 710, the wavelength conversion layer 714, the light-recycling envelope 702 and the light output aperture 704 in illumination system 700 are identical to the characteristics and properties of the respective elements in illumination system 500. The total output aperture area of output aperture 704 is area $A_O$. When $A_O$ is less than $A_E$ and when $R_S$ and $R_E$ are each greater than 50%, it is possible for the combined exiting radiance of illumination system 700 to be greater than the maximum combined intrinsic radiance of LED 706 and the wavelength conversion layer 714 operating in combination. It is also possible for the combined exiting luminance of illumination system 700 to be greater than the maximum combined intrinsic luminance of LED 706 and the wavelength conversion layer 714 operating in combination.

Another example of the second embodiment of this invention is illumination system 800. In the cross-sectional view of illumination system 800 shown in FIG. 18, wavelength conversion layer 814 coats the exposed surfaces of LED 806 and does not coat most portions of the inside surfaces of the light-recycling envelope 802. It is within the scope of this invention that the wavelength conversion layer 814 may coat the entire exposed surfaces of LED 806 or may coat only a part of the exposed surfaces of LED 806.

The LED 806 is comprised of emitting layer 808 and reflecting layer 810. The reflectivity of reflecting layer 810 is $R_S$. Preferred values for $R_S$ were listed previously. The LED 806 and the wavelength conversion layer 814 operating in combination have a maximum combined intrinsic radiance and a maximum combined intrinsic luminance when the light-recycling envelope is removed or when the light-recycling envelope is replaced with light-transmitting envelope that transmits light of a first wavelength range and light of a second wavelength range.

The light-recycling envelope has a maximum cross-sectional area $A_E$. The reflectivity of the inside surfaces of the light-recycling envelope not occupied by the LED 806 and the light output aperture 804 is reflectivity $R_E$. Preferred values for $R_E$ were listed previously. The light-recycling envelope reflects and recycles light emitted by LED 806 and the wavelength conversion layer 814 back to the LED 806 and the wavelength conversion layer 814. The recycled light will add to the light concurrently being emitted by the LED 806 and the wavelength conversion layer 814 and, in turn, increase the combined exiting radiance and combined exiting luminance of light of a first wavelength range and light of a second wavelength range exiting the light output aperture 804.

The characteristics and properties of the LED 806, emitting layer 808, reflecting layer 810, the wavelength conversion layer 814, the light-recycling envelope 802 and the light output aperture 804 in illumination system 800 are identical to the characteristics and properties of the respective elements in illumination system 500. The total light output aperture area of light output aperture 804 is area $A_O$. When $A_O$ is less than $A_E$ and when $R_S$ and $R_E$ are each greater than 50%, it is possible for the combined exiting radiance of illumination system 800 to be greater than the maximum combined intrinsic radiance of LED 806 and the wavelength conversion layer 814 operating in combination. It is also possible for the combined exiting luminance of illumination system 800 to be greater than the maximum combined intrinsic luminance of LED 806 and the wavelength conversion layer 814 operating in combination.

Another embodiment of this invention is illumination system 900. In the cross-sectional view of illumination system 900 shown in FIG. 19, wavelength conversion layer 914 covers only the inside surfaces of the light-recycling envelope not occupied by the LED 906 or the light output aperture 904. The wavelength conversion layer 914 does not cover emitting layer 908 of LED 906. It is also within the scope of this invention that the wavelength conversion layer 914 may cover only part of the light-recycling envelope 902.

The LED 906 is comprised of emitting layer 908 and reflecting layer 910. The reflectivity of reflecting layer 910 is $R_S$. Preferred values for $R_S$ were listed previously. The LED 906 and the wavelength conversion layer 914 operating in combination have a maximum combined intrinsic radiance and a maximum combined intrinsic luminance when the light-recycling envelope is removed or when the light-recycling envelope is replaced with light-transmitting envelope that transmits light of a first wavelength range and light of a second wavelength range.

The light-recycling envelope has a maximum cross-sectional area $A_E$. The reflectivity of the inside surfaces of the light-recycling envelope not occupied by the LED 906 and the light output aperture 904 is reflectivity $R_E$. Preferred values for $R_E$ were listed previously. The light-recycling envelope reflects and recycles light emitted by LED 906 and the wavelength conversion layer 914 back to the LED 906 and the wavelength conversion layer 914. The recycled light will add to the light concurrently being emitted by the LED 906 and the wavelength conversion layer 914 and, in turn, increase the combined exiting radiance and combined exiting luminance of light of a first wavelength range and light of a second wavelength range exiting the light output aperture 904.

The characteristics and properties of the LED 906, emitting layer 908, reflecting layer 910, the wavelength conversion layer 914, the light-recycling envelope 902 and the light output aperture 904 in illumination system 900 are identical to the characteristics and properties of the respective elements in illumination system 500. The total light output aperture area of light output aperture 904 is area $A_O$. When $A_O$ is less than $A_E$ and when $R_S$ and $R_E$ are each greater than 50%, it is possible for the combined exiting radiance of illumination system 900 to be greater than the maximum combined intrinsic radiance of LED 906 and the wavelength conversion layer 914 operating in combination. It is also possible for the combined exiting luminance of illumination system 900 to be greater than the maximum combined intrinsic luminance of LED 906 and the wavelength conversion layer 914 operating in combination.

This completes the examples of the second embodiment of this invention.

In examples of the third embodiment of this invention, the light source for the illumination system is at least one semiconductor laser that emits light of a first wavelength range. The light emitted by a semiconductor laser is generally very bright and is emitted over a relatively small angular range. Also, the light source emitting area is usually small. When a light-recycling envelope is used to partially enclose a semiconductor laser and a wavelength conversion layer, it is not expected that the light-recycling envelope will significantly enhance the output brightness of light of a first wavelength range exiting the light output aperture of the illumination system. However, examples of the third embodiment are designed so that the light-recycling envelope will enhance the brightness of light of a second wavelength range exiting the light output aperture of the illumination system compared to the brightness of light of a second wavelength range generated in the absence of recycling.

Accordingly, in the third embodiment of this invention, the output brightness of the illumination system is not measured in the same way as for the first and second embodiments. In the third embodiment, the output brightness is measured as the exiting radiance of light of a second wavelength range exiting the light output aperture, or the output brightness is measured as the exiting luminance of light of a second wavelength range exiting the light output aperture. Any light of a first wavelength range exiting the light output aperture is ignored in the output brightness measurement. This measurement can be done by using a dichroic mirror or an optical bandpass filter to block light of a first wavelength range from reaching the measurement detector.

The reference brightness is also measured differently for examples of the third embodiment than for examples of the first and second embodiments. The reference brightness for the third embodiment incorporates the fact that the light source is needed in order for the wavelength conversion layer to emit light. The reference brightness for the third embodiment is measured as the maximum combined intrinsic radiance of light of a second wavelength range emitted by the light source and the wavelength conversion layer operating in combination when light recycling is not utilized, or the reference brightness is measured as the maximum combined intrinsic luminance of light of a second wavelength range emitted by the light source and the wavelength conversion layer operating in combination when light recycling is not utilized. Any light of the first wavelength range that is present is ignored in the reference measurement.

For examples of the third embodiment, the reference area that is used to determine if brightness enhancement is taking place is the same reference area that is used for the second embodiment. The reference area for examples of the third embodiment incorporates the fact that since an area larger than the total light-emitting area of the semiconductor laser emits light, an area larger than the semiconductor laser output area should be used as the reference area. In order to eliminate any ambiguity in determining the reference light-emitting area for the light source and wavelength conversion layer operating in combination, the reference area is chosen to be the maximum cross-sectional area $A_E$ of the light-recycling envelope. This area was chosen because the wavelength conversion layer may have many possible configurations and shapes and the cross-sectional area of the wavelength conversion layer may be difficult to determine.

Examples of this invention illustrated in FIGS. 20-22 that are included in the third embodiment will now be described in detail.

One example of the third embodiment of the present invention is illumination system 1100 shown in FIGS. 20A-20C. Illumination system 1100 is comprised of a light source, a wavelength conversion layer 1114, a light-recycling envelope 1102 and a light output aperture 1104. Illumination system 1100 is similar to illumination system 500 in FIGS. 11A-11F except that two changes have been made to illumination system 1100 in comparison to illumination system 500. First, in illumination system 1100, the light source is changed to a semiconductor laser instead of an LED. Second, the position of the light source, i.e. the semiconductor laser 1106, in illumination system 1100 is changed to a position on the left side of the light-recycling envelope and is no longer on the axis of symmetry 1128.

A top external view of illumination system 1100 is illustrated in FIG. 20A, showing the outer edge of a light-recycling envelope 1102 and a light output aperture 1104 as solid lines. FIG. 20B is a cross-sectional view along the I-I plane indicated in FIG. 20A. FIG. 20C show the paths of some representative light rays emitted from semiconductor laser 1106.

The shape of the light-recycling envelope 1102 of illumination system 1100 is the same as the shape of the light-recycling envelope 502 in illumination system 500. The shape is an oblate spheroid that has an axis of symmetry 1128. Both the shape of a cross-section of the light-recycling envelope in a plane perpendicular to the axis of symmetry 1128 and the shape of the light output aperture 1104 are circular. For illumination system 1100, the oblate spheroid shape of the surface of the light-recycling envelope 1102, the circular cross-sectional shape of the light-recycling envelope 1102 in a plane perpendicular to the axis of symmetry 1128 and the circular shape of the light output aperture 1104 are illustrative examples used for ease of understanding of the invention. It should also be noted that the drawing is merely a representation of the structure; the actual and relative dimensions may be different.

As noted previously in other examples, the light-recycling envelope 1102 may have any three-dimensional surface, either regular or irregular, that encloses an interior volume. Similarly, the cross-section of the light-recycling envelope 1102 shown in FIG. 20B may have any shape, either regular or irregular, depending on the shape of the three-dimensional surface of the light-recycling envelope 1102.

The interior surfaces of a light-recycling envelope generally have a cross-sectional area that varies depending on the location inside the light-recycling envelope. However, the interior of a light-recycling envelope will have at least one location that has a maximum cross-sectional area, which is denoted as area $A_E$. For the symmetric oblate spheroid shape of the light-recycling envelope illustrated in FIGS. 20A-20C, the maximum cross-sectional area is a circular area of diameter 1122 located at the equator of the oblate spheroid. In this example, the plane of the maximum cross-sectional area is perpendicular to the axis of symmetry 1128 and is parallel to the plane of the light output aperture 1104. For light-recycling envelopes that have an axis of symmetry that passes through one light output aperture, the maximum cross-sectional area will usually be in a plane that is perpendicular to the axis of symmetry and parallel to the light output aperture. However, for light-recycling envelopes that have irregular shapes or that do not have an axis of symmetry, the maximum cross-sectional area may have an arbitrary orientation with respect to a light output aperture.

The oblate spheroid cross-sectional shape of illumination system 1100 shown in FIG. 20B has a left side, which is to the left of the axis of symmetry 1128 and a right side, which is to the right of the axis of symmetry 1128. The light output aperture 1104 is located on the axis of symmetry for illustrative purposes only. It is within the scope of this invention that the light output aperture 1104 may be placed at any location in the surface of the light-recycling envelope and the semiconductor laser 1106 may be placed at any location on the inside surfaces of the light-recycling envelope that does not overlap with the light output aperture.

The inside surfaces of the light-recycling envelope 1102, except for the area occupied by the semiconductor laser 1106 and the area occupied by the light output aperture 1104, are light reflecting surfaces. The light-recycling envelope reflects both light of a first wavelength range and light of a second wavelength range. In order to achieve high light reflectivity, the light-recycling envelope 1102 may be fabricated from a bulk material that is intrinsically reflective or the inside surfaces of the light-recycling envelope 1102 may be covered with a reflective coating. The bulk material or the reflective coating may be a specular reflector, a diffuse reflector or a diffuse reflector that is backed with a specular reflecting layer. Examples of reflective materials and reflective coatings were described previously. Preferably the reflectivity $R_E$ of the inside surfaces of the light-recycling envelope 1102 that are not occupied by the semiconductor laser 1106 and the light output aperture 1104 is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the efficiency and output brightness of the illumination system.

As illustrated in FIGS. 20A-20C, the wavelength conversion layer 1114 substantially fills the interior of the light-recycling envelope 1102. Alternatively, the wavelength conversion layer 1114 may fill only a small part of the light-recycling envelope, may entirely fill the parts of the light-recycling envelope that are not occupied by the semiconductor laser 1106, may be a coating covering all or a part of the inside surfaces of only the light-recycling envelope, may be a coating covering all or a part of the inside surfaces of the light-recycling envelope and all or part of the exposed surfaces of the semiconductor laser or may be a coating covering all or a part of the exposed surfaces of only the semiconductor laser.

The wavelength conversion layer 1114 converts light of a first wavelength range emitted by the light source into light of a second wavelength range, different from the light of a first wavelength range. The light of a second wavelength range has longer wavelengths and a lower energy than the light of a first wavelength range, resulting in an energy loss for wavelength conversion. The total energy efficiency $\eta_T$ of wavelength conversion of light of a first wavelength range to light of a second wavelength range is given previously by Equation 6.

As in previous examples, the wavelength conversion layer 1114 is comprised of a powdered phosphor material, a quantum dot material, a luminescent dopant material or a plurality of such materials. In addition, the wavelength conversion layer 1114 may further comprise a transparent host material into which the powdered phosphor material, the quantum dot material or the luminescent dopant material is dispersed. Examples of powdered phosphor materials, quantum dot materials, luminescent dopant materials and transparent host materials are listed previously. For illustrative purposes, the wavelength conversion layer 1114 in the FIGS. 20A-20C is shown to be comprised of particles dispersed in a transparent layer.

Depending on the materials that comprise the wavelength conversion layer 1114, the wavelength conversion layer may also partially reflect the light of a first wavelength range and the light of a second wavelength range incident upon the wavelength conversion layer. Light may reflect inside the light-recycling envelope by reflecting from the light-recycling envelope 1102, by partially reflecting from the wavelength conversion layer 1114 or by reflecting from the light source. However, in this case the surface area of the semiconductor laser light source is typically relatively small and reflects relatively little light. Light that passes through the wavelength conversion layer 1114 and that is not reflected or absorbed by the wavelength conversion layer will pass through to the opposite side of the wavelength conversion layer. The wavelength conversion layer is chosen not to interfere with the light-reflecting properties of the light-recycling envelope and the light-recycling envelope is chosen not to interfere with the wavelength conversion properties of the wavelength conversion layer.

Illumination system 1100 can have one or more than one light output aperture. The total light output aperture area of all the light output apertures in the illumination system is area $A_O$. In FIGS. 20A-20C, illumination system 1100 is shown to have just one light output aperture and the area $A_O$ for illumination system 1100 is the area of the one light output aperture.

The light source for illumination system 1100 is at least one semiconductor laser. It is also within the scope of this invention that the light source may be two or more semiconductor lasers. If a second semiconductor laser is present, the second semiconductor laser may emit light of a first wavelength range or light of a third wavelength range, different than the first or second wavelength ranges. If a third semiconductor laser is present, the third semiconductor laser may emit light of a first, a third or a fourth wavelength range. Light of a fourth wavelength range is different than light of a first, a second or a third wavelength range. For illustration purposes, the light source for illumination system 1100 is shown as one semiconductor laser, denoted as semiconductor laser 1106, which is located on the left side of the light-recycling envelope. Semiconductor laser 1106 may be an edge-emitting diode laser or a vertical cavity surface-emitting laser. Semiconductor lasers are generally fabricated from the same types of materials as inorganic light-emitting diodes. Examples of inorganic light-emitting diode materials have been listed previously.

The light source and the wavelength conversion layer operating in combination have a maximum combined intrinsic radiance of light of a second wavelength range and a maximum combined intrinsic luminance of light of a second wavelength range in the absence of a recycling envelope. The maximum combined intrinsic radiance of light of a second wavelength range and the maximum combined intrinsic luminance of light of a second wavelength range may be measured by either removing the light-recycling envelope from illumination system 1100 and measuring the resulting brightness or by replacing the light-recycling envelope in illumination system 1100 with a light-transparent envelope and then measuring the resulting brightness. The measurements are done in such a way that any light of a first wavelength range is not included in the measurements. This may require the use of a dichroic mirror or a bandpass filter that allows only light of a second wavelength range to reach the measurement detector.

The total light-emitting area of the light source is area $A_S$, but $A_S$ is normally relatively small for a semiconductor laser and usually does not represent a large fraction of the total inside area $A_T$ of the light-recycling envelope. Just as for examples of the second embodiment, the critical reference area for determining if brightness enhancement can occur for examples of the third embodiment is the maximum cross-sectional area $A_E$ of the light-recycling envelope and not the area $A_S$ of the light source.

Semiconductor laser 1106 emits light of a first wavelength range. The light of a first wavelength range emitted by the semiconductor laser 1106 is preferably greater than 200 nanometers in wavelength and less than 3000 nanometers in wavelength. More preferably, the light of a first wavelength range is greater than 200 nanometers in wavelength and less than 450 nanometers in wavelength.

The wavelength conversion layer 1114 of illumination system 1100 is in contact with semiconductor laser 1106. When the wavelength conversion layer 1114 covers the semiconductor laser 1106, all light emitted by semiconductor laser 1106 must pass through the wavelength conversion layer 1114 at least once.

Representative light rays emitted by the semiconductor laser 1106 are illustrated in the cross-sectional view of illumination system 1100 shown in FIG. 20C.

In FIG. 20C, a first light ray 1150 of a first wavelength range is emitted from semiconductor laser 1106, passes through the wavelength conversion layer 1114 and passes through the remainder of the interior of the light-recycling envelope 1102 to exit the light output aperture 1104 without reflecting off the light-recycling envelope 1102 and without being converted by the wavelength conversion layer 1114.

A second light ray 1152 of a first wavelength range is emitted from semiconductor laser 1106 in a first time period and enters the wavelength conversion layer 1114. The wavelength conversion layer 1114 converts the light ray 1152 of a first wavelength range into light ray 1154 of a second wavelength range, different from the light of a first wavelength range. The light ray 1154 may be emitted in any direction by the wavelength conversion layer. In this example, light ray 1154 passes through the remainder of the wavelength conversion layer and passes through the remainder of the interior of the light-recycling envelope 1102 to reach the light-recycling envelope on the right side of illumination system 1100. Light ray 1154 is reflected by the light-recycling envelope and is recycled back to the wavelength conversion layer 1114. Wavelength conversion layer 1114 is a partial reflector in addition to being a wavelength conversion layer. Light ray 1154 is reflected by the wavelength conversion layer in a second time period and exits the illumination system 100 through the light output aperture 1104. When the wavelength conversion layer reflects light ray 1154 in the second time period, light ray 1154 adds to light of a second wavelength range concurrently being emitted by the wavelength conversion layer in the second time period. The reflected light rays increase the exiting radiance of light of a second wavelength range and the exiting luminance of light of a second wavelength range. Furthermore, the exiting radiance of light of a second wavelength range and the exiting luminance of light of a second wavelength range may, under some conditions, be higher than the respective maximum combined intrinsic radiance of light of a second wavelength range and the maximum combined intrinsic luminance of light of a second wavelength range measured for illumination system 1100 in the absence of light recycling.

A third light ray 1156 of a first wavelength range is emitted from semiconductor laser 1106, passes part way through the wavelength conversion layer 1114 and is converted to light ray 1158 of a second wavelength range. Light ray 1158 passes through a part of the wavelength conversion layer to the light-recycling envelope 1102 and is absorbed by the light-recycling envelope.

A fourth light ray 1160 of a first wavelength range is emitted from the semiconductor laser 1106, travels through the wavelength conversion layer 1114 to the light-recycling envelope 1102, is reflected back into the wavelength conversion layer by the light-recycling envelope and travels part way across the wavelength conversion layer. The wavelength conversion layer 1114 converts light ray 1160 of a first wavelength range into light ray 1162 of a second wavelength range, different from the light of a first wavelength range. Light ray 1162 passes through the remainder of the wavelength conversion layer 1114, passes through the remainder of the light-recycling envelope 1102 and exits illumination system 1100 through the light output aperture 1104 as light of a second wavelength range.

Light rays 1154 and 1160 illustrate rays that are reflected one time by the light-recycling envelope. In general, light rays may reflect many times inside the light-reflecting envelope before either exiting the illumination system through light output aperture 1104 or being absorbed by the light-recycling envelope, the wavelength conversion layer, or the light source. A multitude of light pathways is possible. Light of a first wavelength range may be converted to light of a second wavelength range on the first pass through the wavelength conversion layer, may be converted only after many passes through the wavelength conversion layer, or may exit the illumination system without being converted. Light that has already been converted to light of a second wavelength range will not be converted again. The light-recycling envelope directs a part of the light of a first wavelength through the wavelength conversion layer multiple times and increases the likelihood that the light of a first wavelength range will be converted to light of a second wavelength range.

In FIG. 20C, light ray 1150 is not converted to light of a second wavelength range. Light rays 1152, 1156 and 1160 of a first wavelength range are converted into light of a second wavelength range. Overall, the wavelength conversion layer converts a portion of the light of a first wavelength range into light of a second wavelength range, different than the first wavelength range.

Light ray 1150 of a first wavelength range and light ray 1162 of a second wavelength range are not recycled back to the wavelength conversion layer. Light ray 1160 of a first wavelength range and light ray 1154 of a second wavelength range are recycled back the wavelength conversion layer by the light-recycling envelope 1102. Overall, only part of the light of a first wavelength range and part of the light of a second wavelength range are recycled back to the wavelength conversion layer by the light-recycling envelope.

Light ray 1158 passes through the wavelength conversion layer and is absorbed by the light-recycling envelope 1102. In general, the light-recycling envelope 1102 is not a perfect reflector and has a reflectivity less than 100%. Some of the light of a first wavelength range and some of the light of a second wavelength range, such as light ray 1158, will be absorbed. Due to the absorption losses, only a fraction of the light of a second wavelength range that is inside the light-recycling envelope will exit the light-recycling envelope through the light output aperture 1104.

Another example of the third embodiment is illumination system 1200 illustrated in cross-section in FIG. 21. Illumination system 1200 is comprised of a light-recycling envelope 1102, a semiconductor laser 1106, a wavelength conversion layer 1114 and a partially reflecting optical element 1202. Illumination system 1200 is identical to illumination system 1100 except for the addition of the partially reflecting optical element 1202. Partially reflecting optical element 1202 is preferably either a reflective polarizer or a dichroic mirror.

As stated previously, a reflective polarizer is a polarizer that reflects light of a first polarization state and transmits light of a second polarization state. Polarization states can be states of linear polarization or states of circular polarization. Examples of suitable reflective polarizers were previously listed. The reflective polarizer is placed adjacent to the light output aperture 1104 and placed in the optical path of light exiting from the light output aperture 1104. The adjacent position of the reflective polarizer can be either just outside the light-recycling envelope or just inside the light-recycling envelope. The reflective polarizer reflects both light of a first wavelength range and light of a second wavelength range that have a first polarization state. Also, the reflective polarizer transmits both light of a first wavelength range and light of a second wavelength range that have a second polarization state. The light of a first polarization state, either light of a first wavelength range or light of a second wavelength range, is recycled back into the light-recycling envelope. The light of a first polarization state recycled back into the light-recycling envelope will, after multiple reflections, be converted into a mixture of light of a first polarization state and light of a second polarization state. The converted light of a second polarization state will then be able to pass through the reflecting polarizer. If only light of a second polarization state is desired for the output of illumination system 1200, recycling the light of a first polarization state back into the light-reflecting envelope 1102 to be converted into light of a second polarization state will improve the overall efficiency and output brightness of illumination system 1200.

As stated previously, some applications require polarized light. For example, flat-panel display or projection display applications that incorporate liquid crystal display (LCD) panels or liquid-crystal-on-silicon (LCOS) display panels require polarized light.

A dichroic mirror is, for example, a mirror that can reflect light of a first wavelength range and transmit light of a second wavelength range. Dichroic mirrors may be utilized if light of a first wavelength range emitted by semiconductor laser 1106 is not desired in the light output from the light-recycling envelope. Dichroic mirrors are commonly constructed by alternately depositing layers of two transparent dielectrics having different indexes of refraction onto a transparent substrate. Examples of materials used for dielectric coating layers include silicon dioxide, titanium dioxide or magnesium fluoride.

When the partially transparent optical element 1202 is a dichroic mirror, the dichroic mirror is placed adjacent to the light output aperture 1104 and placed in the optical path of light exiting from the light output aperture 1104. The adjacent position of the dichroic mirror can be either just outside the light-recycling envelope or just inside the light-recycling envelope. In FIG. 21, the partially reflecting optical element 1202 is a dichroic mirror and is positioned just outside the light output aperture 1104.

The function of the dichroic mirror in FIG. 21 is illustrated using light rays 1210, 1212 and 1214. Light ray 1210 of a first wavelength range is emitted from the semiconductor laser 1106, passes through the wavelength conversion layer 1114 a first time without being converted and travels to the light-recycling envelope 1102. The light-recycling envelope 1102 reflects and recycles light ray 1210 back through the wavelength conversion layer 1114. Light ray 1210 passes through the wavelength conversion layer a second time without being converted, passes through the remainder of the interior of the light-recycling envelope 1102 and passes through the light output aperture 1104 a first time to reach the partially reflecting optical element 1202, which in this example is a dichroic mirror. Light ray 1210 reflects off the dichroic mirror, passes through the light output aperture 1104 a second time and is recycled back into the interior of the light-recycling envelope 1102.

Light ray 1212 of a first wavelength range is emitted by the semiconductor laser 1106 and passes through a part of the wavelength conversion layer 1114. The wavelength conversion layer 1114 converts light ray 1212 of a first wavelength range into light ray 1214 of a second wavelength range. Light ray 1214 may be emitted in any direction. In this example, light ray 1214 passes through the remainder of the wavelength conversion layer, passes through the remainder of the interior of the light-recycling envelope 1102, passes through the light output aperture 1104 and passes through the partially reflecting optical element 1202, which is the dichroic mirror.

Overall, the dichroic mirror transmits light of a second wavelength range and reflects and recycles light of a first wavelength range back into the light-recycling envelope. The wavelength conversion layer can then convert the light of a first wavelength range that is recycled back into the light-recycling envelope into light of a second wavelength range. The converted light of a second wavelength range can then pass through the dichroic mirror. If only light of a second wavelength range is desired for the output of illumination system 1200, recycling the light of a first wavelength range back into the light-reflecting envelope to be converted into light of a second wavelength range will improve the overall efficiency and output brightness of illumination system 1200.

In FIGS. 20 and 21, the light source is positioned inside the light-recycling envelope. The light-recycling envelope encloses the light source and the wavelength conversion layer. It is also within the scope of the third embodiment of this invention that a part of the light source may be located outside the light-recycling envelope. In such cases, the light-recycling envelope partially encloses the light source but does not enclose the entire light source. An example of an illumination system where a part of the light source is located outside the light-recycling envelope is shown in the cross-sectional view in FIG. 22.

FIG. 22 shows a cross-sectional view of illumination system 1300. Illumination system 1300 is similar to illumination system 1100 except that the light source for illumination system 1300 comprises light guide 1320 in addition to a semiconductor laser 1306. Illumination system 1300 also comprises a light-recycling envelope 1302, a wavelength conversion layer 1314 and a light output aperture 1304. The characteristics and properties of elements 1306, 1302, 1314 and 1304 are identical to the characteristics and properties of the respective elements in illumination system 1100. It is also within the scope of this invention that illumination system 1300 may include a plurality of semiconductor lasers associated with a plurality of light guides.

The light-recycling envelope 1302 has a maximum cross-sectional area $A_E$. The light source, comprising semiconductor laser 1306 and light guide 1320, and the wavelength conversion layer 1314 operating in combination have a maximum combined intrinsic radiance of light of a second wavelength range and a maximum combined intrinsic luminance of light of second wavelength range in the absence of light recycling. Light of a first wavelength range is not included in the brightness measurements.

Light guide 1320 is located between the semiconductor laser 1306 and the light-recycling envelope 1302. Light guide 1320 has an input surface 1321 adjacent to the semiconductor laser 1306 and an output surface 1322 located inside the light-recycling envelope 1302. Light guide 1320 transports light of a first wavelength range emitted by the semiconductor laser 1306 from the semiconductor laser 1306 into the light-recycling envelope 1302.

The light guide 1320 is any structure that transports light of a first wavelength range. For example, light guide 1320 may be constructed from any solid material that transports light by total internal reflection. Possible materials include inorganic glasses such as silicon dioxide and plastics such as polymethymethacrylate and fluoroacrylates. The light guide 1320 may also be a solid or hollow structure where the sides, but not the ends, of the structure are coated with a light reflecting material. Furthermore, light guide 1320 may be a single-mode or multi-mode optical fiber that contains a core material and a cladding material having a lower index of refraction than the core material. The optical fiber may be constructed from inorganic glasses or transparent polymers. Such materials are well known to persons skilled in the art of optical fibers.

As noted previously, the light-recycling envelope 1302 has reflectivity $R_E$ and $R_E$ is preferably at least 50%. More preferably, the reflectivity $R_E$ is at least 70%. Most preferably, the reflectivity $R_E$ is at least 90%. The total output aperture area of output aperture 1304 is area $A_O$. As in illumination system 1100, when $A_O$ is less than $A_E$ and when $R_E$ is greater than 50%, it is possible for the exiting radiance of light of a second wavelength range exiting from illumination system 1300 to be greater than the maximum combined intrinsic radiance of light of a second wavelength range emitted by the light source, comprising semiconductor laser 1306 and light guide 1320, and the wavelength conversion layer 1314 operating in combination. It is also possible for the exiting luminance of light of a second wavelength range exiting from illumination system 1300 to be greater than the maximum combined intrinsic luminance of light of a second wavelength range emitted by the light source, comprising semiconductor laser 1306 and light guide 1320, and the wavelength conversion layer 1314 operating in combination.

Example rays 1330, 1332, 1334 and 1336 illustrate the functioning of light-recycling envelope to recycle light. Light ray paths inside the light guide 1320 originating at the semiconductor laser 1306 are not shown. Light ray 1330 of a first wavelength range coming from semiconductor laser 1306 is emitted from surface 1322 of light guide 1320 in a first time period, passes through the wavelength conversion layer 1314 and a part of the interior of the light-recycling envelope 1302 and is reflected and recycled back into the wavelength conversion layer by the light-recycling envelope 1302 in a second time period. Light ray 1330 passes part way through the wavelength conversion layer and is converted into light ray 1332 of a second wavelength range. Light ray 1332 passes through a part of the wavelength conversion layer, passes through part of the interior of the light-recycling envelope and exits illumination system 1300 through light output aperture 1304 as light of a second wavelength range.

Light ray 1334 of a first wavelength range coming from semiconductor laser 1306 is emitted from output surface 1322 of light guide 1320 in a first time period, passes through a part of the wavelength conversion layer 1314 and is converted to light ray 1336 of a second wavelength range by the wavelength conversion layer. Light ray 1336 passes through a part of the wavelength conversion layer 1314 to the light-recycling envelope 1302 and is reflected and recycled by the light-recycling envelope back into the wavelength conversion layer 1314 in a second time period. Light ray 1336 passes through the wavelength conversion layer, passes through the remainder of the interior of the light-recycling envelope and exits illumination system 1300 through the light output aperture 1304 as light of a second wavelength range.

When light rays 1330 of a first wavelength range and 1336 of a second wavelength range are recycled back into the wavelength conversion layer 1314 in a second time period, light ray 1330 adds to the light of a first wavelength range concurrently being emitted by the semiconductor laser 1306 through the light guide 1320 in the second time period, and light ray 1336 adds to the light of a second wavelength range concurrently being emitted by the wavelength conversion layer 1314 in the second time period. By utilizing light recycling, it is then possible for the exiting radiance of light of a second wavelength range exiting the light output aperture 1304 to be greater than the maximum combined intrinsic radiance of light of a second wavelength range emitted by the light source and the wavelength conversion layer operating in combination in the absence of recycling. In addition, it is possible for the exiting luminance of light of a second wavelength range exiting the light output aperture 1304 to be greater than the maximum combined intrinsic luminance of light of a second wavelength range emitted by the light source and the wavelength conversion layer operating in combination in the absence of recycling.

In illumination system 1300, the semiconductor laser is removed from the inside of the light-recycling envelope. Semiconductor lasers generate considerable heat during operation. Removing the semiconductor laser from the light-recycling envelope lowers the temperature generated inside the light-recycling envelope. This is advantageous, especially when multiple semiconductor lasers are required for the illumination system. Placing multiple semiconductor lasers away from the light-recycling envelope will allow the semiconductor lasers to be operated in a potentially cooler environment, which will increase the light output and the operating lifetime of the semiconductor lasers.

This completes the examples of the third embodiment of this invention using powdered phosphors. An example of a first embodiment of this invention using a solid phosphor layer will now be illustrated in FIGS. 23A-23D. Note that a solid phosphor layer may also be utilized for the second and third embodiments of this invention.

Another embodiment of the present invention is illumination system 1400 shown in FIGS. 23A-23D. Illumination system 1400 is similar to illumination system 200 in FIGS. 5A-5G except that in illumination system 1400 the wavelength conversion layer 1414 is a solid phosphor layer. Illumination system 1400 is comprised of a light source, a wavelength conversion layer 1414, an optional reflecting layer 1440, a heat sink 1442, a light-recycling envelope 1402 and a light output aperture 1404. The light source in this illustrative example is four LEDs, which are denoted as LED 206a, LED 206b, LED 206c and LED 206d. Using four LEDs is an illustrative example. The light source could have any number of LEDs as long as the LEDs fit inside the light-recycling envelope.

Figure 23A:
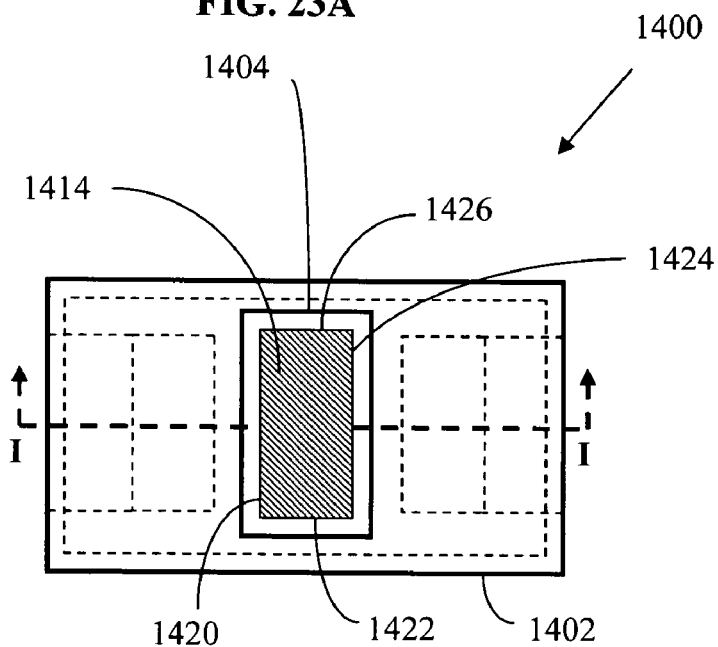
FIG. 23A is a top external view of the embodiment.
Figure 23B:
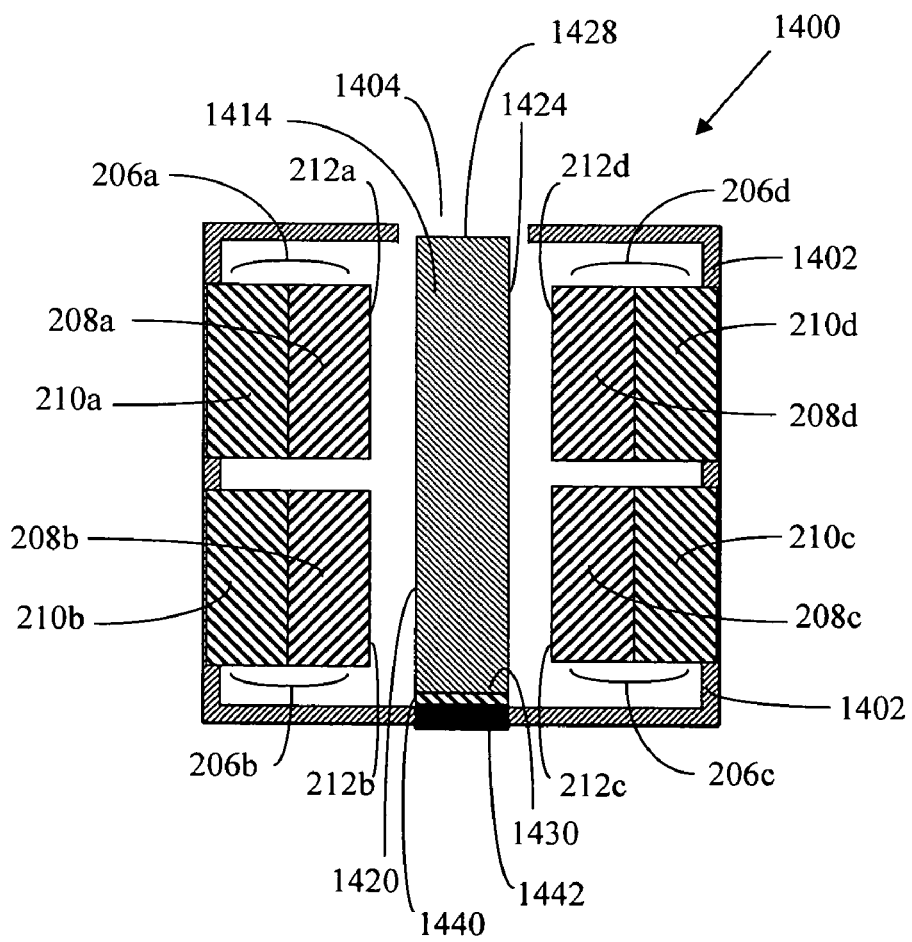
FIG. 23B is a side cross-sectional view along the I-I plane of the illumination system shown in FIG. 23A.
Figure 23C:
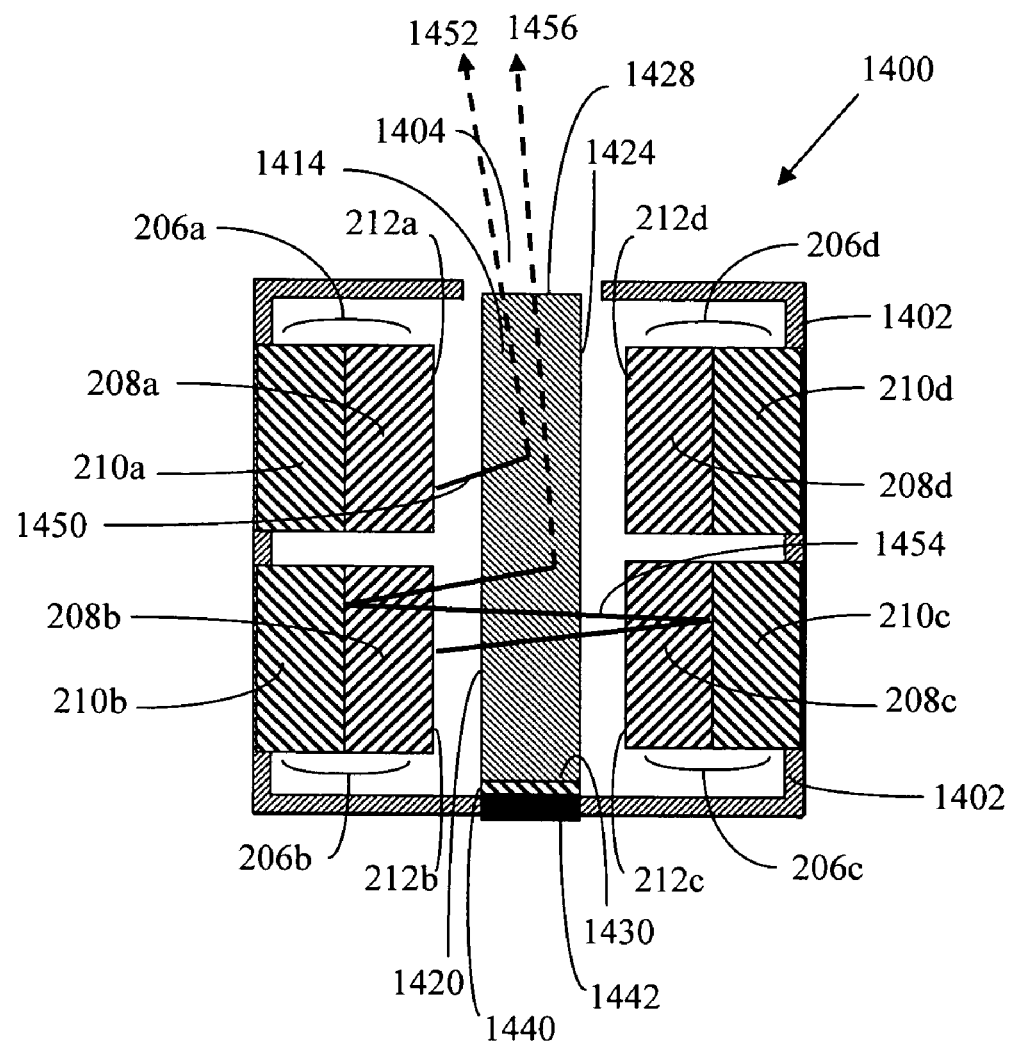
FIGS. 23C and 23D show representative light rays.
Figure 23D:
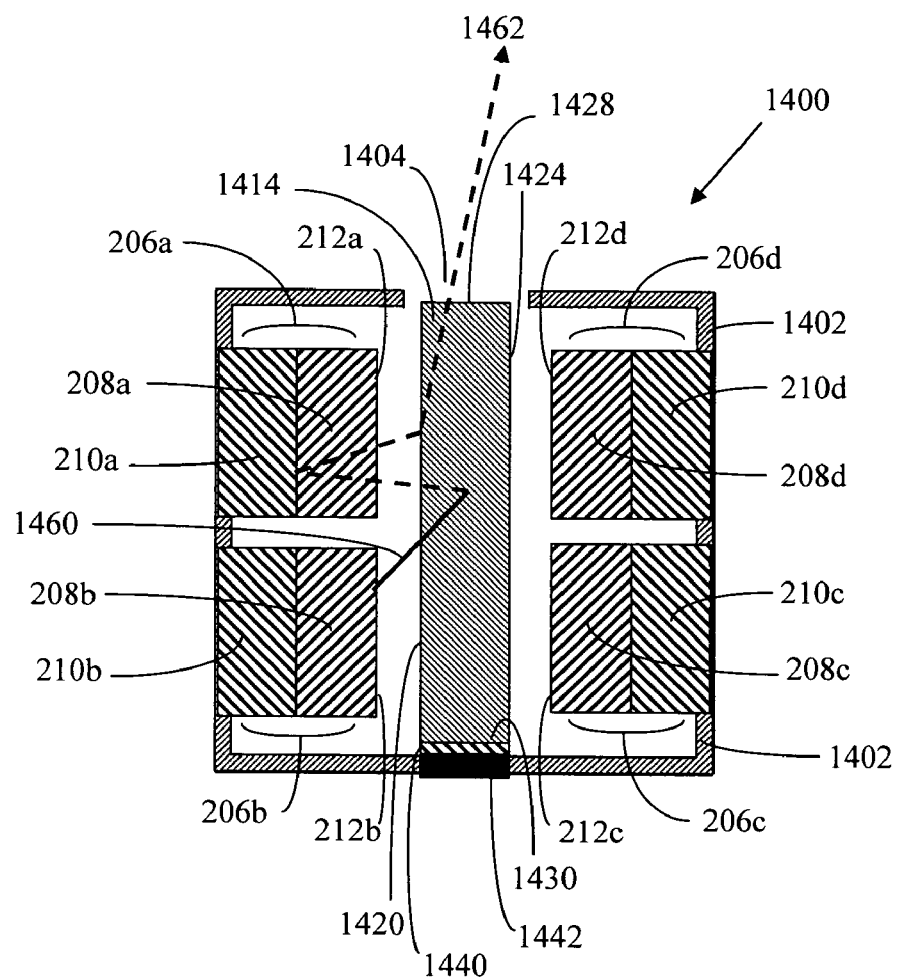

A top external view of illumination system 1400 is illustrated in FIG. 23A, showing the outer edge of the light-recycling envelope 1402 and the light output aperture 1404 as solid lines. The top end 1428 of the wavelength conversion layer 1414 is visible through the light output aperture 1404. FIG. 23B is a cross-sectional view along the I-I plane indicated in FIG. 23A. FIGS. 23C-23D show the paths of some representative light rays emitted from the LEDs.

For illumination system 1400, the rectangular three-dimensional shape of the surface of the light-recycling envelope 1402 and the rectangular shape of the light output aperture 1404 are illustrative examples used for ease of understanding of the invention.

The light-recycling envelope 1402 may be any three-dimensional surface that encloses an interior volume. Similarly, the cross-section of the light-recycling envelope 1402 shown in FIG. 23B may have any shape, either regular or irregular, depending on the shape of the three-dimensional surface of the light-recycling envelope 1402.

The square cross-sectional shape of illumination system 1400 shown in FIG. 23B has a first side containing the light output aperture 1404, a second side, a third side and a fourth side. The first side is opposite and parallel to the third side. The second side is opposite and parallel to the fourth side. The first side and third sides are perpendicular to the second side and fourth side. The four sides of the illumination system shown in cross-section in FIG. 23B plus the two remaining sides of the six-sided rectangular shape (not shown in the cross-sectional view) form the interior of the light-recycling envelope.

The inside surfaces of the light-recycling envelope 1402, except for the areas occupied by the LEDs 206a, 206b, 206c and 206d, the area occupied by the light output aperture 204 and the area occupied by side 1430 of the wavelength conversion layer 1414, are light reflecting surfaces. The light-recycling envelope reflects both light of a first wavelength range and light of a second wavelength range. In order to achieve high light reflectivity, the light-recycling envelope 1402 may be fabricated from a bulk material that is intrinsically reflective or the inside surfaces of the light-recycling envelope 1402 may be covered with a reflective coating. The bulk material or the reflective coating may be a specular reflector, a diffuse reflector or a diffuse reflector that is backed with a specular reflecting layer. Examples of reflective materials and coatings were described previously. Preferably the reflectivity $R_E$ of the inside surfaces of the light-recycling envelope 1402 that are not occupied by the LEDs, the light output aperture 1404 and side 1430 of the wavelength conversion layer 1414 is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the output efficiency of the illumination system.

As illustrated in FIGS. 23A-23D, the wavelength conversion layer 1414 is a solid phosphor layer. The wavelength conversion layer has side surfaces 1420, 1422, 1424 and 1426, a top and output surface 1428 and a bottom surface 1430. Surface 1420 is adjacent to the output surface 212a of LED 206a and the output surface 212b of LED 206b. Surface 1424 is adjacent to the output surface 212c of LED 206c and the output surface 212d of LED 206d. Alternatively the side surfaces may be in contact with the output surfaces of the LEDs. The top surface 1428 is shown in FIGS. 23A and 23B to partially fill the output aperture 1404. Alternatively the top surface 1428 of the wavelength conversion layer could be inside the light-recycling envelope 1402, outside the light-recycling envelope or can completely fill the output aperture 1404. The surfaces of the wavelength conversion layer may be rough surfaces or polished surfaces. Preferably the top surface 1428 is either a roughened surface or has light extraction elements such as holes or bumps in order to improve light extraction from the surface. The bottom surface 1430 is optionally coated with reflector 1440 and attached to a heat sink 1442. The reflector 1440 can be a specular reflector or a diffuse reflector. Reflector 1440 reflects light that is directed to the bottom surface 1430 and redirects the light toward the top surface 1428 where it can exit the illumination system.

Heat sink 1442 removes heat that can build up in the wavelength conversion layer 1414 when light from the LEDs is absorbed by the wavelength conversion layer 1414.

The wavelength conversion layer 1414 converts a portion of the light of a first wavelength range emitted by the light source into light of a second wavelength range, different from the light of a first wavelength range. The light of the second wavelength range has longer wavelengths and lower energies than the light of the first wavelength range, resulting in an energy loss for wavelength conversion.

The wavelength conversion layer 1414 is a solid phosphor layer. The solid phosphor layer can have any shape. In FIGS. 23A-23D, the solid phosphor layer is a rectangular solid. If the solid phosphor layer is a rectangular solid, preferably the layer has a thickness (from surface 1420 to surface 1424) that can range from about 10 microns to about 20 millimeters. The other two dimensions should preferably be large enough to extend across the output surfaces of the LEDs. The solid phosphor layer may be a doped single-crystal solid, a doped polycrystalline solid or a doped amorphous solid. As an illustrative example, the solid phosphor layer may be a layer of single-crystal yttrium aluminum garnet (YAG) doped with cerium. A cerium-doped YAG crystal can absorb light of a first wavelength range at about 450 nanometers and emit light of a second wavelength range at about 500-700 nanometers.

The light source for illumination system 1400 is four LEDs, which are denoted as LED 206a, LED 206b, LED 206c and LED 206d. LED 206a and LED 206b are located on the second side of the light-recycling envelope. LED 206c and LED 206d are located on the fourth side of the light-recycling envelope. The LEDs may be an inorganic light-emitting diode or an OLED. Preferably, the LEDs are inorganic light-emitting diodes. As an illustrative example, the LEDs can be aluminum indium gallium nitride LEDs that emit light of a first wavelength range at approximately 450 nanometers. Other examples of inorganic light-emitting diodes have been listed previously.

LED 206a has an emitting layer 208a and a reflecting layer 210a. LED 206b has an emitting layer 208b and a reflecting layer 210b. LED 206c has an emitting layer 208c and a reflecting layer 210c. LED 206d has an emitting layer 208d and a reflecting layer 210d. The total light-emitting area of the light source is area $A_S$, which in this example is the total light-emitting area of emitting layers 208a, 208b, 208c and 208d. The emitting layers emit light of a first wavelength range. Light may be emitted from the emitting layers through one or more surfaces of the emitting layers that are not in contact with the adjacent reflecting layers. For example, light may be emitted through surface 212a of LED 206a, surface 212b of LED 206b, surface 212c of LED 206c and surface 212d of LED 206d.

The light of a first wavelength range emitted by the emitting layers is preferably greater than 200 nanometers in wavelength and less than 3000 nanometers in wavelength. More preferably, the light of a first wavelength range is greater than 200 nanometers in wavelength and less than 500 nanometers in wavelength.

The light of a first wavelength range emitted by the four LEDs of the light source has a maximum intrinsic source radiance and a maximum intrinsic source luminance that depend on the LED design and the driving electrical power applied to the LEDs. The maximum intrinsic source radiance and the maximum intrinsic source luminance are measured for the light source alone with no light-recycling envelope and no wavelength conversion layer present.

The reflecting layer 210a is adjacent to and interior to the second side of the light-recycling envelope while the emitting layer 208a extends into the interior of the light-recycling envelope. The reflecting layer 210b is adjacent to and interior to the second side of the light-recycling envelope while the emitting layer 208b extends into the interior of the light-recycling envelope. The reflecting layer 210c is adjacent to and interior to the fourth side of the light-recycling envelope while the emitting layer 208c extends into the interior of the light-recycling envelope. The reflecting layer 210d is adjacent to and interior to the fourth side of the light-recycling envelope while the emitting layer 208a extends into the interior of the light-recycling envelope. The reflecting layers 210a, 210b, 210c and 210d reflect both light of a first wavelength range and light of a second wavelength range. The reflecting layers may be specular reflectors or diffuse reflectors. In typical inorganic light-emitting diodes, the reflecting layers are usually specular reflectors. The light reflectivity of the reflecting layers of the LEDs is $R_S$. If the reflectivity varies across the area of the reflecting layers, the reflectivity $R_S$ is defined as the average reflectivity of the reflecting layers. The reflectivity $R_S$ of the reflecting layers is preferably at least 50%. More preferably, the reflectivity $R_S$ is at least 70%. Most preferably, the reflectivity $R_S$ is at least 90%. Ideally, the reflectivity $R_S$ should be as close to 100% as possible in order to maximize the efficiency and the light output brightness of the illumination system.

The light aperture 1404 has area $A_O$. The total light-emitting area of the light source is $A_S$. Preferably the area $A_O$ is less than the area $A_S$.

In order to explain the operation of illumination system 1400, example light rays emitted from the LEDs are illustrated in FIGS. 23C and 23D.

In FIG. 23C, a first light ray 1450 of a first wavelength range is emitted from surface 212a of emitting layer 208a of LED 206a on the second side of the light-recycling envelope 1402. First light ray 1450 passes through the interior of the light-recycling envelope and enters the wavelength conversion layer 1414 through surface 1420. The wavelength conversion layer 1414 converts the first light ray 1450 into light ray 1452 of a second wavelength range. Light ray 1452 exits the wavelength conversion layer through surface 1428 and exits the light-recycling envelope through the output aperture 1404.

A second light ray 1454 of a first wavelength range is emitted from surface 212b of emitting layer 208b of LED 206b on the second side and passes through the interior of the light-recycling envelope 1402 and enters the wavelength conversion layer 1414 by passing through surface 1420 a first time. Second light ray 1454 passes through the wavelength conversion layer 1414 a first time without conversion, passes through surface 1424 a first time, passes through the light-recycling envelope and enters LED 206c on the fourth side by passing through surface 212c a first time. Second light ray passes through the emitting layer 208c of LED 206c a first time, is reflected by reflecting layer 210c, passes through emitting layer 208c a second time and exits LED 206c by passing through surface 212c a second time. Second light ray 1454 passes through the light-recycling envelope, passes through surface 1424 a second time, passes through the wavelength conversion layer a second time without conversion and passes through surface 1420 a second time. Second light ray 1454 is recycled back to LED 206b on the second side, thereby increasing the effective brightness of LED 206b. Second light ray 1454 passes through surface 212b a second time, passes through emitting layer 208b, is reflected by reflecting layer 210b, passes through emitting layer 208b and exits LED 206b by passing through surface 212b a third time. Second light ray passes through the light-recycling envelope and passes through surface 1420 a third time. Wavelength conversion layer 1414 converts second light ray 1454 of a first wavelength range into light ray 1456 of a second wavelength range. Light ray 1456 of a second wavelength range exits the wavelength conversion layer through surface 1428 and exits the light-recycling envelope through output aperture 1404.

In FIG. 23D, a third light ray 1460 of a first wavelength range is emitted from surface 212b of emitting layer 208b of LED 206b on the second side and passes through the interior of the light-recycling envelope 1402 and enters the wavelength conversion layer 1414 by passing through surface 1420. Third light ray 1460 of a first wavelength range is converted to light ray 1462 of a second wavelength range. Light ray 1462 passes through surface 1420 a first time and passes through the light-recycling envelope. Light ray 1462 is recycled back to the light source, in this case LED 206a, and thereby increases the effective brightness of LED 206a. Light ray 1462 of a second wavelength range enters LED 206a by passing through surface 212a a first time. Light ray 1462 passes through the emitting layer 208a of LED 206a a first time, is reflected by reflecting layer 210a, passes through emitting layer 208a a second time and exits LED 206a by passing through surface 212a a second time. Light ray 1462 of a second wavelength range passes through the light-recycling envelope and passes through surface 1420 a second time. If surface 1420 is a roughened surface, light ray 1462 can be redirected by the roughened surface and pass through the wavelength conversion layer without conversion. Light ray 1462 exits the wavelength conversion layer through surface 1428 and exits the light-recycling envelope through output aperture 1404.

Each time a light ray of a first wavelength range passes through the wavelength conversion layer, the wavelength conversion layer converts a portion of the light of a first wavelength range into light of a second wavelength range, different from the light of a first wavelength range. Each time a light ray of a second wavelength range passes through the wavelength conversion layer, the light of a second wavelength range will be unaffected. The light of a second wavelength range will not alter its wavelength nor will additional wavelengths be formed.

The following EXAMPLES will further explain the embodiments of this invention.

EXAMPLE 1

A computer simulation program is used to model the relative output radiance, the relative output luminance and the overall output efficiency of an illumination system that has twelve identical LED sources inside a light-recycling envelope. In this example, there is no wavelength conversion layer in the light-recycling envelope. Each LED source has dimensions of 2 mm×2 mm, a total light-emitting area of 4 mm² and emits 0.2 watts or 11 lumens of light at 450 nm. The value of 11 lumens is calculated from the value in watts assuming a conversion factor of 55 lumens per watt at 450 nm. Each LED has a maximum intrinsic radiance, Radiance$_I$, and a maximum intrinsic luminance, $L_I$. The maximum intrinsic radiance or luminance of an LED is determined by measuring an identically constructed LED that is not enclosed in a light-recycling envelope. Each LED source is assumed to have a Lambertian output light distribution. The total light-emitting area $A_S$ of the twelve LED sources is 48 mm² and the total emitted 450-nm light flux from the twelve LED sources is 2.4 watts or 132 lumens. The light-recycling envelope has a square cross-section with inside dimensions of 2.8 mm×2.8 mm, inside length of 9 mm and a total inside area of 116.48 mm². The total inside area includes the total light-emitting area of the twelve LED sources and the area of the output aperture. The light output aperture of the light-recycling envelope has an area $A_O$ of 4.8 mm² so that $A_O/A_S$ equals 0.10, i.e. the area of the light output aperture is 10% of the total light-emitting area of the LED sources. If the light-recycling envelope has no losses (i.e. if the light reflectivity of the LED sources and the inside reflecting surfaces of the light-recycling envelope are 100%), the output radiance (or luminance) will be 10 times the radiance (or luminance) of the LED sources and the output efficiency will be 100%. However, the actual light-recycling envelope will have a light reflectivity less than 100% and will have losses. For simplicity, the specular reflectivity $R_S$ of the LED sources is assumed to be identical in magnitude to the diffuse reflectivity $R_E$ of the inside light-reflecting surfaces of the light-recycling envelope that are not covered by the LED sources. In the calculations, the reflectivity $R_S$ and the reflectivity $R_E$ are varied, having values of 40%, 50%, 60%, 70%, 80%, 90%, or 98%. The results are shown below in TABLE 1. The ratio, Radiance$_O$/Radiance$_I$, of the output radiance, Radiance$_O$, to the intrinsic radiance, Radiance$_I$, of the LED sources indicates the radiance (brightness) enhancement resulting from light recycling. The ratio, $L_O/L_I$, of the output luminance $L_O$ to the intrinsic luminance $L_I$ is the luminance enhancement resulting from light recycling and is also calculated. Since there is no wavelength conversion inside the light-recycling envelope, the radiance enhancement and the luminance enhancement are equal. The calculated efficiency is the percentage of light flux generated by the sources that passes through the output aperture. The remainder of the light flux is lost due to absorption by the sources and the light-recycling envelope. The computer modeling results indicate that when $R_S$ and $R_E$ equal 50% or less, there is no radiance enhancement (Radiance$_O$/Radiance$_I$ is less than 1) or luminance enhancement ($L_O/L_I$ is less than 1) and the efficiency is low (less than 10%). As the reflectivity of the LED sources and the light-recycling envelope increases, the radiance enhancement, the luminance enhancement and the efficiency increase. When $R_S$ equals 98% and $R_E$ equals 98%, the radiance or luminance enhancement factor of 6.87 indicates that the output radiance or output luminance from the light output aperture of the illumination system is 6.87 times larger than the intrinsic radiance or luminance of the LED sources.

EXAMPLE 2

The illumination system in EXAMPLE 2 is similar to EXAMPLE 1 except that the diffuse reflectivity $R_E$ of the inside surfaces of the light-recycling envelope is held constant at 98% and the specular reflectivity $R_S$ of the LED sources is varied from 5% to 98%. There is no wavelength conversion layer in the light-recycling envelope. In this example, a computer simulation program is used to calculate the relative output radiance, output luminance and the overall output efficiency of a light-recycling envelope containing twelve identical LED sources. Each LED has a maximum intrinsic radiance, Radiance$_I$, and a maximum intrinsic luminance, $L_I$. The maximum intrinsic radiance or luminance of an LED is determined by measuring an identically constructed LED that is not enclosed in a light-recycling envelope. The light output aperture of the light-recycling envelope has an area $A_O$ of 4.8 mm² so that $A_O/A_S$ equals 0.10, i.e. the area of the light output aperture is 10% of the total area of the LED sources. The ratio, Radiance$_O$/Radiance$_I$, of the output radiance, Radiance$_O$, to the intrinsic radiance, Radiance$_I$, of the LED sources indicates the radiance (brightness) enhancement resulting from light recycling. The ratio, $L_O/L_I$, of the output luminance $L_O$ to the intrinsic luminance $L_I$ is the luminance enhancement resulting from light recycling and is also calculated. The results are shown in TABLE 2. Since there is no wavelength conversion inside the light-recycling envelope, the radiance enhancement and the luminance enhancement are equal. The calculated efficiency is the percentage of light flux generated by the sources that passes through the output aperture. The remainder of the light flux is lost due to absorption by the sources and the light-recycling envelope. The computer modeling results indicate that for $R_S$ equal to 10% or less and $R_E$ equal to 98%, there is no radiance enhancement (Radiance$_O$/Radiance$_I$ is less than 1) or luminance enhancement ($L_O/L_I$ is less than 1) and the efficiency is relatively low (less than 10%). Note that typical blackbody or gray body light sources have low reflectivity (less than 10%), and the results in this EXAMPLE indicate that such sources are not suitable for use in this invention. As the reflectivity of the sources increases, the radiance enhancement, the luminance enhancement and the efficiency increase. When $R_S$ equals 98% and $R_E$ equals 98%, the radiance or luminance enhancement factor of 6.87 indicates that the output radiance or output luminance from the light output aperture of the illumination system is 6.87 times larger than the intrinsic radiance or luminance of the LED sources.

TABLE 1

| Area ratio $A_O/A_S$ | Source $R_S$ (%) | Light-recycling envelope $R_E$ (%) | Efficiency (%) | Total light flux out (watts) | Radiance enhancement (Radiance$_O$/Radiance$_I$) | Total light flux out (lumens) | Luminance enhancement ($L_O/L_I$) |
|---|---|---|---|---|---|---|---|
| 0.10 | 40 | 40 | 7.9 | 0.19 | 0.79 | 10.4 | 0.79 |
| 0.10 | 50 | 50 | 9.2 | 0.22 | 0.91 | 12.1 | 0.91 |
| 0.10 | 60 | 60 | 10.8 | 0.26 | 1.08 | 14.3 | 1.08 |
| 0.10 | 70 | 70 | 13.8 | 0.33 | 1.38 | 18.2 | 1.38 |
| 0.10 | 80 | 80 | 19.2 | 0.46 | 1.89 | 25.3 | 1.89 |
| 0.10 | 90 | 90 | 31.1 | 0.75 | 3.11 | 41.1 | 3.11 |
| 0.10 | 98 | 98 | 68.7 | 1.65 | 6.87 | 91.7 | 6.87 |

TABLE 2

| Area ratio $A_O/A_S$ | Source $R_S$ (%) | Light-recycling envelope $R_E$ (%) | Efficiency (%) | Total light flux out (watts) | Radiance enhancement (Radiance$_O$/ Radiance$_I$) | Total light flux out (lumens) | Luminance enhancement ($L_O/L_I$) |
|---|---|---|---|---|---|---|---|
| 0.10 | 5 | 98 | 9.3 | 0.22 | 0.93 | 12.3 | 0.93 |
| 0.10 | 10 | 98 | 9.7 | 0.23 | 0.97 | 12.8 | 0.97 |
| 0.10 | 20 | 98 | 10.8 | 0.26 | 1.08 | 14.3 | 1.08 |
| 0.10 | 30 | 98 | 12.4 | 0.30 | 1.24 | 16.4 | 1.24 |
| 0.10 | 40 | 98 | 13.9 | 0.33 | 1.39 | 18.3 | 1.39 |
| 0.10 | 50 | 98 | 16.2 | 0.39 | 1.62 | 21.4 | 1.62 |
| 0.10 | 60 | 98 | 19.2 | 0.46 | 1.92 | 25.3 | 1.92 |
| 0.10 | 70 | 98 | 23.7 | 0.57 | 2.37 | 31.3 | 2.37 |
| 0.10 | 80 | 98 | 31.1 | 0.75 | 3.11 | 41.1 | 3.11 |
| 0.10 | 90 | 98 | 44.2 | 1.06 | 4.42 | 58.3 | 4.42 |
| 0.10 | 98 | 98 | 68.7 | 1.65 | 6.87 | 90.7 | 6.87 |

EXAMPLE 3

The illumination system in EXAMPLE 3 is similar in configuration to EXAMPLE 1 and EXAMPLE 2 except that a wavelength conversion layer is present inside the light-recycling envelope. The wavelength conversion layer is a powdered phosphor dispersed in a host material. The powdered phosphor is cerium doped yttrium aluminum garnet (YAG:$Ce^{3+}$ or $Y_3Al_5O_{12}$:$Ce^{3+}$), which converts 450-nm blue light to 580-nm yellow light. The wavelength conversion layer is coated over the portion of the inside surfaces of the light-recycling envelope that are not covered by the LED sources. A computer simulation program is used to model the output radiance, the radiance enhancement, the output luminance, the luminance enhancement and the overall output efficiency of an illumination system that has a light-recycling envelope containing twelve identical LED sources. Each LED source has dimensions of 2 mm×2 mm, a total light-emitting area of 4 $mm^2$ and emits 0.2 watts or 11 lumens of light at 450 nm. The value of 11 lumens is calculated from the value in watts assuming a conversion factor of 55 lumens per watt at 450 nm. Each LED has a maximum intrinsic radiance, Radiance$_I$, and a maximum intrinsic luminance, $L_I$. The maximum intrinsic radiance or luminance of an LED is determined by measuring an identically constructed LED that is not enclosed in a light-recycling envelope. Each LED source is assumed to have a Lambertian output light distribution. The total light-emitting area $A_S$ of the twelve LED sources is 48 $mm^2$ and the total emitted 450-nm light flux from the twelve LED sources is 2.4 watts or 132 lumens. The light-recycling envelope has a square cross-section with inside dimensions of 2.8 mm×2.8 mm, inside length of 9 mm and a total inside area of 116.48 $mm^2$. The total inside area includes the total light-emitting area of the twelve LED sources, the area covered by the wavelength conversion layer and the area of the output aperture. The area covered by the wavelength conversion layer is 63.68 $mm^2$. The light output aperture of the light-recycling envelope has an area $A_O$ of 4.8 $mm^2$ so that $A_O/A_S$ equals 0.10, i.e. the area of the light output aperture is 10% of the total light-emitting area of the LED sources. If the light-recycling envelope has no losses (i.e. if the light reflectivity of the LED and the inside reflecting surfaces are 100%), the output radiance from the light output aperture will be 10 times the radiance of the LED sources (due to the area ratio $A_S/A_O$ equaling 10) and the output efficiency will be 100%. However, the actual light-recycling envelope has light reflectivity less than 100% and has losses. In this example, the specular reflectivity $R_S$ of the LED sources is 90% and the total diffuse reflectivity $R_E$ of the inside light-reflecting surfaces of the light-recycling envelope that are not covered by the LED sources is 98%. The total diffuse reflectivity $R_E$ is the total reflectivity of the inside surfaces of the light-recycling envelope, including the reflectivity of the wavelength conversion layer. The effects of the wavelength conversion layer will depend on the thickness of the material and the degree of phosphor loading. If the wavelength conversion layer is relatively thick or the phosphor loading is high, each time blue light strikes the wavelength conversion layer, the fraction F of the blue light that is converted to yellow light is large. Conversely, if the wavelength conversion layer is relatively thin or the phosphor loading is low, each time the blue light strikes the wavelength conversion layer, the fraction F of the blue light that is converted to yellow light is small. In this calculation, the conversion fraction F is varied from 0.0 (no blue light converted) to 1.0 (all blue light converted). Each time a blue light photon is absorbed by the phosphor, energy losses will take place. The first energy loss occurs if the quantum efficiency of converting blue light to yellow light is not equal to unity. It is assumed for this calculation that the quantum efficiency is 95%. The second energy loss, the Stokes shift energy loss, occurs because the energy of a 580-nm yellow photon generated by the wavelength conversion layer is less than the energy of the original 450-nm blue photon. The remainder of the blue photon energy is lost to heat. In this example, the 580-nm yellow photon has 78% of the energy of a 450-nm blue photon. The results for the radiance simulations are shown below in TABLE 3. The ratio, Radiance$_O$/Radiance$_I$, of the output radiance, Radiance$_O$, from the light output aperture to the intrinsic radiance, Radiance$_I$, of the LED sources indicates the radiance (brightness) enhancement resulting from light recycling. The calculated efficiency is the percentage of light flux generated by the sources that passes through the light output aperture. The remainder of the light flux is lost due to absorption by the sources and the light-recycling envelope. The maximum radiance enhancement value of 4.42 occurs when no wavelength conversion takes place (F equals 0). The total efficiency and the radiance enhancement are reduced as F increases from 0 to 1, but the radiance enhancement still remains greater than 3.00. In TABLE 4, the light output flux values in watts are converted to lumens to illustrate the brightness enhancement as observed by the human eye. The conversion factors used for TABLE 4 are 55 lumens per watt for 450-nm light and 590 lumens per watt for 580-nm light.

TABLE 3

| F | Blue light out (watts) | Yellow light out (watts) | Total light flux out (watts) | Total efficiency (%) | Radiance enhancement (Radiance$_O$/Radiance$_I$) |
|---|---|---|---|---|---|
| 0.0 | 1.06 | 0.00 | 1.06 | 44.2 | 4.42 |
| 0.2 | 0.49 | 0.42 | 0.91 | 38.2 | 3.82 |
| 0.4 | 0.32 | 0.55 | 0.87 | 36.3 | 3.63 |
| 0.6 | 0.24 | 0.61 | 0.85 | 35.5 | 3.55 |
| 0.8 | 0.19 | 0.65 | 0.84 | 35.0 | 3.50 |
| 1.0 | 0.16 | 0.67 | 0.83 | 34.6 | 3.46 |

TABLE 4

| F | Blue light out (watts) | Yellow light out (watts) | Total light flux out (watts) | Total (eff.) (%) | Blue light out (lumens) | Yellow light out (lumens) | Total light flux out (lumens) | Luminance enhancement ($L_O/L_I$) |
|---|---|---|---|---|---|---|---|---|
| 0.0 | 1.06 | 0.00 | 1.06 | 44.2 | 58.3 | 0 | 58.3 | 4.4 |
| 0.2 | 0.49 | 0.42 | 0.91 | 38.2 | 27.0 | 247.8 | 274.8 | 20.8 |
| 0.4 | 0.32 | 0.55 | 0.87 | 36.3 | 17.6 | 324.5 | 342.1 | 25.9 |
| 0.6 | 0.24 | 0.61 | 0.85 | 35.5 | 13.2 | 359.9 | 373.1 | 28.3 |
| 0.8 | 0.19 | 0.65 | 0.84 | 35.0 | 10.5 | 383.5 | 394.0 | 29.9 |
| 1.0 | 0.16 | 0.67 | 0.83 | 34.6 | 8.8 | 395.3 | 404.1 | 30.6 |

The ratio, $L_O/L_I$, of the output luminance $L_O$ from the light output aperture to the intrinsic luminance $L_I$ is the luminance enhancement. The luminance enhancement is a result both of light recycling and wavelength conversion. If there is no wavelength conversion (F equals 0), the luminance enhancement of 4.4 is equal to the radiance enhancement. As F increases from 0 to 1, the luminance enhancement increases as a result of wavelength conversion. Although the efficiency is lowest (34.6%) at F equal to 1, the luminance enhancement is a maximum at F equal to 1 since more blue light is converted to yellow light and the human eye is more sensitive to yellow light. At F equal to 1, the luminance at the light output aperture is over 30 times higher than the intrinsic luminance $L_I$ of the LED sources.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An illumination system, comprising:
a light source, wherein said light source further comprises an emitting layer and a reflecting layer, wherein said emitting layer emits light of a first wavelength range and wherein the total light-emitting area of said light source is area $A_S$;
a wavelength conversion layer, wherein said wavelength conversion layer converts a portion of said light of a first wavelength range into light of a second wavelength range, different from said light of a first wavelength range, and wherein said wavelength conversion layer is a solid phosphor layer;
a light-recycling envelope, wherein said light-recycling envelope is separate from said wavelength conversion layer, wherein said light-recycling envelope at least partially encloses said light source and said wavelength conversion layer, wherein the maximum cross-sectional area of said light-recycling envelope is area $A_E$, wherein said light-recycling envelope has reflectivity $R_E$ and wherein said light-recycling envelope reflects and recycles part of said light of a first wavelength range and part of said light of a second wavelength range back to said reflecting layer or to said wavelength conversion layer as recycled light; and
at least one light output aperture, wherein said at least one light output aperture is located in a surface of said light-recycling envelope, wherein the total light output aperture area is area $A_O$, wherein said light source and said wavelength conversion layer and said light-recycling envelope direct at least a fraction of said light of a first wavelength range and at least a fraction of said light of a second wavelength range out of said light-recycling envelope through said at least one light output aperture as incoherent light and wherein said recycled light reflected from said light-recycling envelope produces increased light output brightness through said at least one light output aperture.

2. The illumination system as in claim 1, wherein said light of a first wavelength range emitted by said light source has a maximum intrinsic source radiance and a maximum intrinsic source luminance, wherein said fraction of said light of a first wavelength range and said fraction of said light of a second wavelength range exiting said at least one light output aperture have a combined exiting radiance and a combined exiting luminance and wherein said area $A_O$ is less than said area $A_S$.

3. The illumination system as in claim 2, wherein said combined exiting radiance is greater than said maximum intrinsic source radiance.

4. The illumination system as in claim 2, wherein said combined exiting luminance is greater than said maximum intrinsic source luminance.

5. The illumination system as in claim 1, wherein said light source and said wavelength conversion layer operating in combination have a maximum combined intrinsic radiance and a maximum combined intrinsic luminance, wherein said fraction of said light of a first wavelength range and said fraction of said light of a second wavelength range exiting said at least one light output aperture have a combined exiting radiance and a combined exiting luminance and wherein said area $A_O$ is less than said area $A_E$.

6. The illumination system as in claim 5, wherein said combined exiting radiance is greater than said maximum combined intrinsic radiance.

7. The illumination system as in claim 5, wherein said combined exiting luminance is greater than said maximum combined intrinsic luminance.

8. The illumination system as in claim 1, wherein said light source and said wavelength conversion layer operating in combination have a maximum combined intrinsic radiance of light of a second wavelength range and a maximum combined intrinsic luminance of light of a second wavelength range, wherein said fraction of said light of a second wavelength range exiting said at least one light output aperture has an exiting radiance of light of a second wavelength range and an exiting luminance of light of a second wavelength range and wherein said area $A_O$ is less than said area $A_E$.

9. The illumination system as in claim 8, wherein said exiting radiance of light of a second wavelength range is greater than said maximum combined intrinsic radiance of light of a second wavelength range.

10. The illumination system as in claim 8, wherein said exiting luminance of light of a second wavelength range is greater than said maximum combined intrinsic luminance of light of a second wavelength range.

11. The illumination system as in claim 1, wherein said reflecting layer of said light source at is located on an inside surface of said light-recycling envelope.

12. The illumination system as in claim 1, wherein said light of a first wavelength range is greater than 200 nanometers in wavelength and less than 3000 nanometers in wavelength.

13. The illumination system as in claim 12, wherein said light of a first wavelength range is greater than 200 nanometers in wavelength and less than 450 nanometers in wavelength.

14. The illumination system as in claim 1, wherein said light source further emits light of a third wavelength range, different than said light of a first wavelength range and said light of a second wavelength range.

15. The illumination system as in claim 14, wherein said light source emits said light of a third wavelength range concurrently with the emission of said light of a first wavelength range and said light of a second wavelength range and wherein said fraction of said light of a first wavelength range and said fraction of said light of a second wavelength range and a fraction of said light of a third wavelength range exit said at least one light-output aperture as light of a composite color.

16. The illumination system as in claim 14, wherein the amount of said light of a third wavelength range emitted by said light source is changed in order to vary the color and the color-rendering index of said light of a composite color.

17. The illumination system as in claim 14, wherein said light source emits said light of a third wavelength range in a first time period, wherein said light of a first wavelength range and said light of a second wavelength range are emitted in a second time period, different than the first time period, wherein a fraction of said light of a third wavelength range exits said at least one light output aperture in said first time period, wherein said fraction of said light of a first wavelength range and said fraction of said light of a second wavelength range exit said at least one light-output aperture in said second time period and wherein said first time period and said second time period are repeated in sequence.

18. The illumination system as in claim 1, wherein said light source further comprises at least one light guide, wherein said light guide has an input surface adjacent to said emitting layer of said light source, wherein said light guide has an output surface located inside said light-recycling envelope, wherein said light guide transports said light of a first wavelength range from said light source to said light-recycling envelope.

19. The illumination system as in claim 1, wherein said wavelength conversion layer fills a substantial portion of said light-recycling envelope and wherein said wavelength conversion layer covers said emitting layer of said light source.

20. The illumination system as in claim 1, wherein said wavelength conversion layer coats at least a portion of the inside surfaces of said light-recycling envelope.

21. The illumination system as in claim 1, wherein said wavelength conversion layer coats at least a portion of said emitting layer of said light source that emits said light of a first wavelength range.

22. The illumination system as in claim 1, wherein said light-recycling envelope is constructed from a bulk material that is intrinsically reflective.

23. The illumination system as in claim 1, wherein the inside surfaces of said light-recycling envelope are covered with a reflective coating.

24. The illumination system as in claim 23, wherein said reflective coating is a diffuse reflector.

25. The illumination system as in claim 23, wherein said reflective coating is a specular reflector.

26. The illumination system as in claim 23, wherein said reflective coating is a diffuse reflector that is backed by a specular reflector.

27. The illumination system as in claim 1, further comprising a reflective polarizer, wherein said reflective polarizer is located in the light output optical path, wherein said reflective polarizer is located adjacent to said at least one light output aperture of said light-recycling envelope, wherein said reflective polarizer reflects said light of a first polarization state back into said light-recycling envelope and wherein said reflective polarizer transmits said light of a second polarization state.

28. The illumination system as in claim 1, further comprising a dichroic mirror, wherein said dichroic mirror is located in the light output optical path, wherein said dichroic mirror is located adjacent to said at least one light output aperture of said light-recycling envelope, wherein said dichroic mirror reflects said light of a first wavelength range back into said light-recycling envelope and wherein said dichroic mirror transmits said light of a second wavelength range.

29. The illumination system as in claim 1, further comprising a light collimating element, wherein said light collimating element partially collimates the light exiting said at least one light output aperture.

* * * * *